US012757503B2

(12) United States Patent
Chen et al.

(10) Patent No.: US 12,757,503 B2
(45) Date of Patent: Oct. 6, 2026

(54) MULTI-SUBSTRATE IMAGE SENSOR DEVICE AND METHOD WITH METALENS

(71) Applicant: Taiwan Semiconductor Manufacturing Company LTD, Hsinchu (TW)

(72) Inventors: Hsiang-Lin Chen, Hsinchu (TW); Yi-Shin Chu, Hsinchu (TW); Cheng-Yu Huang, Hsinchu (TW); Wei-Chieh Chiang, Yuanlin (TW); Dun-Nian Yaung, Wunshan (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 412 days.

(21) Appl. No.: 18/238,092

(22) Filed: Aug. 25, 2023

(65) Prior Publication Data

US 2025/0072135 A1 Feb. 27, 2025

(51) Int. Cl.

| | |
|---|---|
| ***H10F 39/18*** | (2025.01) |
| ***G02B 1/00*** | (2006.01) |
| ***H10F 39/00*** | (2025.01) |

(52) U.S. Cl.

CPC ........... *H10F 39/184* (2025.01); *G02B 1/002* (2013.01); *H10F 39/024* (2025.01); *H10F 39/8053* (2025.01); *H10F 39/8063* (2025.01); *H10F 39/811* (2025.01)

(58) Field of Classification Search

CPC .. H10F 39/184; H10F 39/024; H10F 39/8053; H10F 39/8063; H10F 39/811; H10F 39/182; H10F 39/8067; H10F 39/809; G02B 1/002

See application file for complete search history.

(56) References Cited

U.S. PATENT DOCUMENTS

| | | | | |
|---|---|---|---|---|
| 2015/0054962 | A1* | 2/2015 | Borthakur | H10F 39/8067 348/164 |
| 2017/0033139 | A1* | 2/2017 | Lu | H10F 39/809 |
| 2021/0366956 | A1 | 11/2021 | Wu et al. | |
| 2022/0399395 | A1 | 12/2022 | Lai et al. | |
| 2023/0073145 | A1 | 3/2023 | Kang | |

(Continued)

FOREIGN PATENT DOCUMENTS

| | | | |
|---|---|---|---|
| TW | 201926584 | A | 7/2019 |
| TW | 202129944 | A | 8/2021 |

(Continued)

OTHER PUBLICATIONS

Taiwan Patent Office Action Application No. 11320918070, Dated: Sep. 6, 2024,.

*Primary Examiner* — Jennifer D Bennett
(74) *Attorney, Agent, or Firm* — Lippes Mathias LLP

(57) ABSTRACT

A semiconductor device, and method of fabricating the same, includes a first substrate, the first substrate including at least one visible light photosensor disposed between a first side and a second side of the first substrate, a second substrate including an infrared light photosensor disposed between a second side of the second substrate and a first side of the second substrate, and a metalens disposed between the visible light photosensor and the infrared light photosensor, the metalens configured to focus infrared light impinging on a surface of the first substrate onto the infrared light photosensor.

20 Claims, 54 Drawing Sheets

(56) References Cited

U.S. PATENT DOCUMENTS

| | | | |
|---|---|---|---|
| 2023/0104190 A1 | 4/2023 | Tung et al. | |
| 2024/0006436 A1* | 1/2024 | Rahman ................ | H10F 39/182 |

FOREIGN PATENT DOCUMENTS

| | | |
|---|---|---|
| TW | 202230767 A | 8/2022 |
| TW | 202232742 A | 8/2022 |
| TW | 202316646 A | 4/2023 |
| TW | 202327061 A | 7/2023 |

* cited by examiner

MULTI-SUBSTRATE IMAGE SENSOR DEVICE AND METHOD WITH METALENS

BACKGROUND

The following relates to the image sensor arts, infrared image sensor arts, combined visible/infrared image sensor arts, to applications of same such as range finding imagers and imagers with integrated night vision capabilities, and related arts.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1A is a cross-sectional view of a face to face multi-CIS (CMOS Image Sensor) to single-SWIR (Short Wavelength Infrared) without a metalens; FIG. 1B is a cross-sectional view of a face to face multi-CIS to single-SWIR, including a metalens structure in an IMD (Intermetal Dielectric) of a top semiconductor in accordance with some embodiments. FIG. 1C is a cross-sectional view of a face to face multi-CIS to single-SWIR, including a metalens structure in an IMD (Intermetal Dielectric) of a bottom semiconductor in accordance with some embodiments.

FIG. 2A is a cross-sectional view of a face to face single-CIS to single-SWIR, including a metalens structure in an IMD (Intermetal Dielectric) of a top semiconductor in accordance with some embodiments. FIG. 2B is a cross-sectional view of a face to face single-CIS to single-SWIR, including a metalens structure in an IMD (Intermetal Dielectric) of a bottom semiconductor in accordance with some embodiments.

FIG. 3A is a cross-sectional view of a face to back multi-CIS to Single-SWIR and ASIC (Application Specific Integrated Circuit) not including a metalens structure. FIG. 3B is a cross-sectional view of a face to back multi-CIS to single-SWIR, including a metalens structure in an IMD of a top semiconductor, and ASIC, in accordance with some embodiments. FIG. 3C is a cross-sectional view of a face to back multi-CIS to Single-SWIR, including a metalens structure in an IMD of a bottom semiconductor, and ASIC, in accordance with some embodiments. FIG. 3D is a cross-sectional view of a face to back multi-CIS to single-SWIR, including a metalens structure in a face of a bottom semiconductor, and ASIC, in accordance with some embodiments.

FIG. 4A is a cross-sectional view of a face to back multi-CIS to Multi-SWIR, including a metalens structure in an IMD of a top semiconductor, and ASIC, in accordance with some embodiments. FIG. 4B is a cross-sectional view of a face to back multi-CIS to multi-SWIR, including a metalens structure in an IMD of a bottom semiconductor, and ASIC, in accordance with some embodiments. FIG. 4C is a cross-sectional view of a face to back multi-CIS to multi-SWIR, including a metalens structure in a face of a bottom semiconductor, and ASIC, in accordance with some embodiments.

FIGS. 8A-8D illustrate the top semiconductor portion including a metalens structure in an IMD of the top semiconductor.

FIGS. 9A-9C illustrate the bottom semiconductor portion.

FIG. 10 illustrates the top semiconductor portion, including a metalens structure in an IMD of the top semiconductor, bonded with the bottom semiconductor portion.

FIGS. 11A-11D illustrate the top semiconductor portion.

FIGS. 12A-12C illustrate the bottom semiconductor portion including a metalens structure in an IMD of the bottom semiconductor.

FIG. 13 illustrates the top semiconductor portion bonded with the bottom semiconductor portion, including a metalens structure in an IMD of the bottom semiconductor.

FIGS. 14A-14D illustrate the top semiconductor portion, including a metalens structure in an IMD of the top semiconductor.

FIGS. 15A-15C illustrate the bottom semiconductor portion.

FIG. 16 illustrates the top semiconductor portion, including a metalens structure in an IMD of the top semiconductor, bonded with the bottom semiconductor portion.

FIGS. 17A-17D illustrate the top semiconductor portion.

FIGS. 18A-18C illustrate the bottom semiconductor portion, including a metalens structure in an IMD of the bottom semiconductor.

FIG. 19 illustrates the top semiconductor portion bonded with the bottom semiconductor portion, including a metalens structure in an IMD of the bottom semiconductor.

FIGS. 20A-20D illustrate the top semiconductor portion, including a metalens structure in an IMD of the top semiconductor.

FIGS. 21A-21C illustrate the bottom semiconductor portion.

FIG. 22 illustrates the top semiconductor portion, including a metalens structure in an IMD of the top semiconductor, bonded with the bottom semiconductor portion, FIGS. 23A-23D illustrate the top semiconductor portion.

FIGS. 24A-24C illustrate the bottom semiconductor portion, including a metalens structure in an IMD of the bottom semiconductor.

FIG. 25 illustrates the top semiconductor portion bonded with the bottom semiconductor portion, including a metalens structure in an IMD of the bottom semiconductor.

FIGS. 26A-26D illustrate the top semiconductor portion.

FIGS. 27A-27D illustrate the bottom semiconductor portion, including a metalens structure in a surface of the bottom semiconductor.

FIG. 28 illustrates the top semiconductor portion bonded with the bottom semiconductor portion, including a metalens structure in a surface of the bottom semiconductor.

DETAILED DESCRIPTION

Figure 1A:
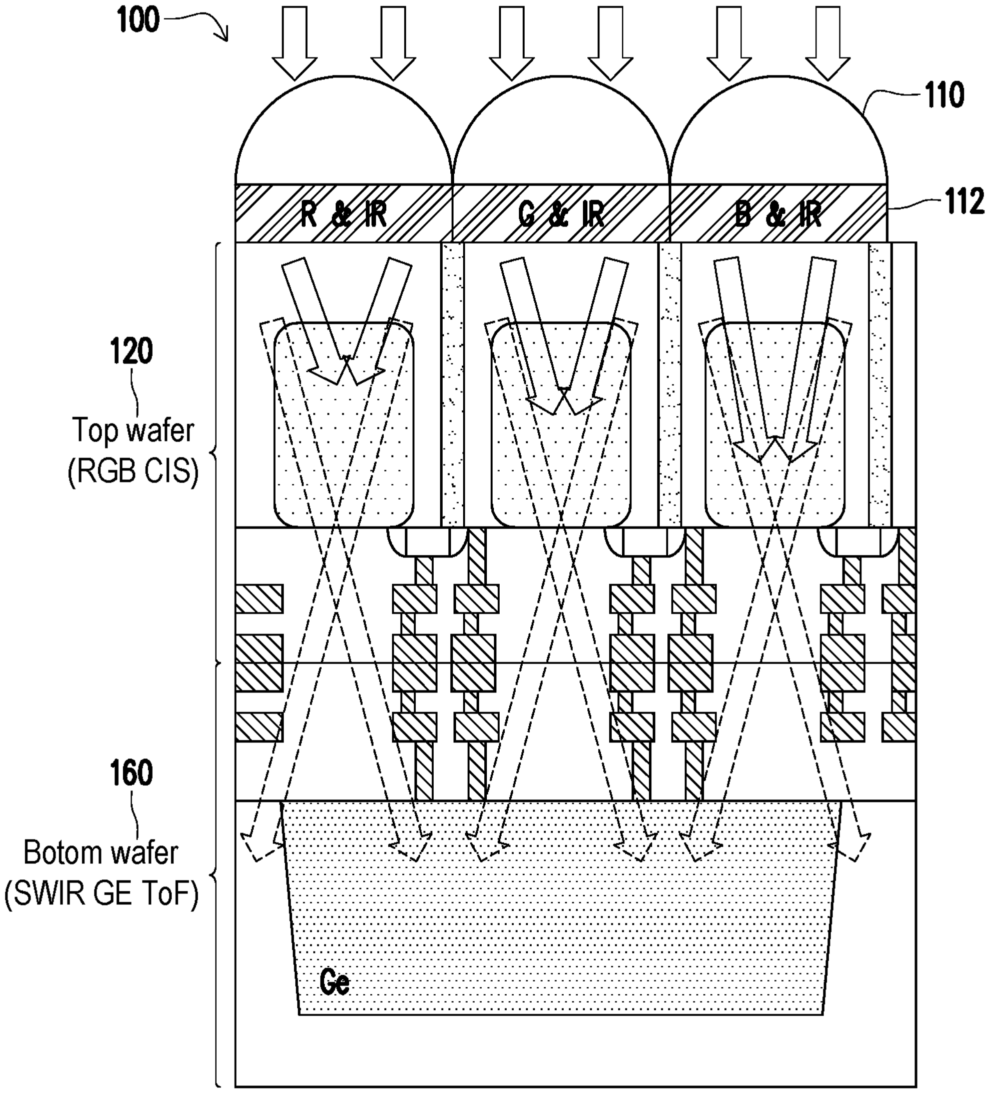
FIGS. 1A-1C illustrate various cross-sectional views of an image sensor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments of the present disclosure are directed to an image sensor device with improved detection ability for infrared radiation such as near infrared radiation or SWIR (Short Wavelength Infrared. Some image sensor devices disclosed herein include both visible and infrared radiation detection implemented as a two chip, substrate, wafer design including a separate image sensor, such as a RGB (Red-Green-Blue) sensor and an infrared radiation sensor. In such disclosed designs, the light first impinges on the RGB sensor, and the infrared light must pass through the RGB sensor to reach the infrared sensor. This approach leverages the relatively high transmissivity of silicon for infrared light, which can thus pass through the RGB sensor to reach the second, infrared sensor. This enables integration of the RGB and infrared light sensors, providing benefits such as a more compact design and potentially higher pixel resolution. However, it is recognized herein that the infrared detection performance can be limited due to defocusing of the infrared light passing through the RGB image sensor, prior to being received at the infrared sensing region. This defocusing issue can be a result of the extended length of the light path from the RGB image sensor to the infrared sensing region. While the front side may include front-side microlenses to focus the light, these microlenses are designed to focus visible light onto the RGB sensor. The infrared sensor is further away from the microlenses, and furthermore the microlenses are designed for visible light rather than for the infrared light (which has a longer wavelength). Hence, it is typically not feasible to optimize the microlenses for both the RGB image sensor and the infrared image sensor, due to the difference in target focal plane and wavelength.

Embodiments of the present disclosure are directed to an image sensor device which combines or integrates a metalens into a photosensor, such as an RGB sensor, or an infrared light sensor, such as a SWIR sensor, to focus infrared light onto the semiconductor infrared detection region. The metalens is extremely thin and accordingly can be integrated into the interface between the RGB sensor and the infrared sensor. The additional metalens advantageously decouples the optical design for visible and infrared light, as the microlenses can be designed for focusing visible light on the RGB sensors while the metalens can be designed for focusing infrared light (of longer wavelength than the visible light) on the infrared detector. Moreover, as the metalens is located after the RGB sensor along the optical path, it has no impact on the focusing of visible light onto the RGB sensor.

Nonlimiting examples of the application of the embodiments of the present disclosure include image sensor devices, integrated with the appropriate ASIC (Application Specific Integrated Circuits), to provide RGB sensing, ToF (Time of Flight) detection, SWIR detection, PDAF (Phase Detection Focus), Wavelength Filtering, Wavelength Splitting (Multi-wavelength sensing), and Wavelength Spectrum Analysis. For example, a combined RGB/infrared sensor can utilize the RGB sensor in daylight conditions, and use the infrared sensor at night or under other low-light condition to provide integrated daylight and night-vision capability.

In another application, the infrared sensor in combination with a pulsed infrared laser can provide a ToF range detector, where the distance (range) of an object is determined based on the time from the emission of the infrared pulse to the detection of the reflected infrared light by the infrared sensor.

The metalens typically comprises a pattern formed on or in a surface or interface disposed between at least one visible light photosensor and at least one infrared light photosensor. The metalens is configured to focus light impinging on a semiconductor device to a light photosensor.

Figure 1B:
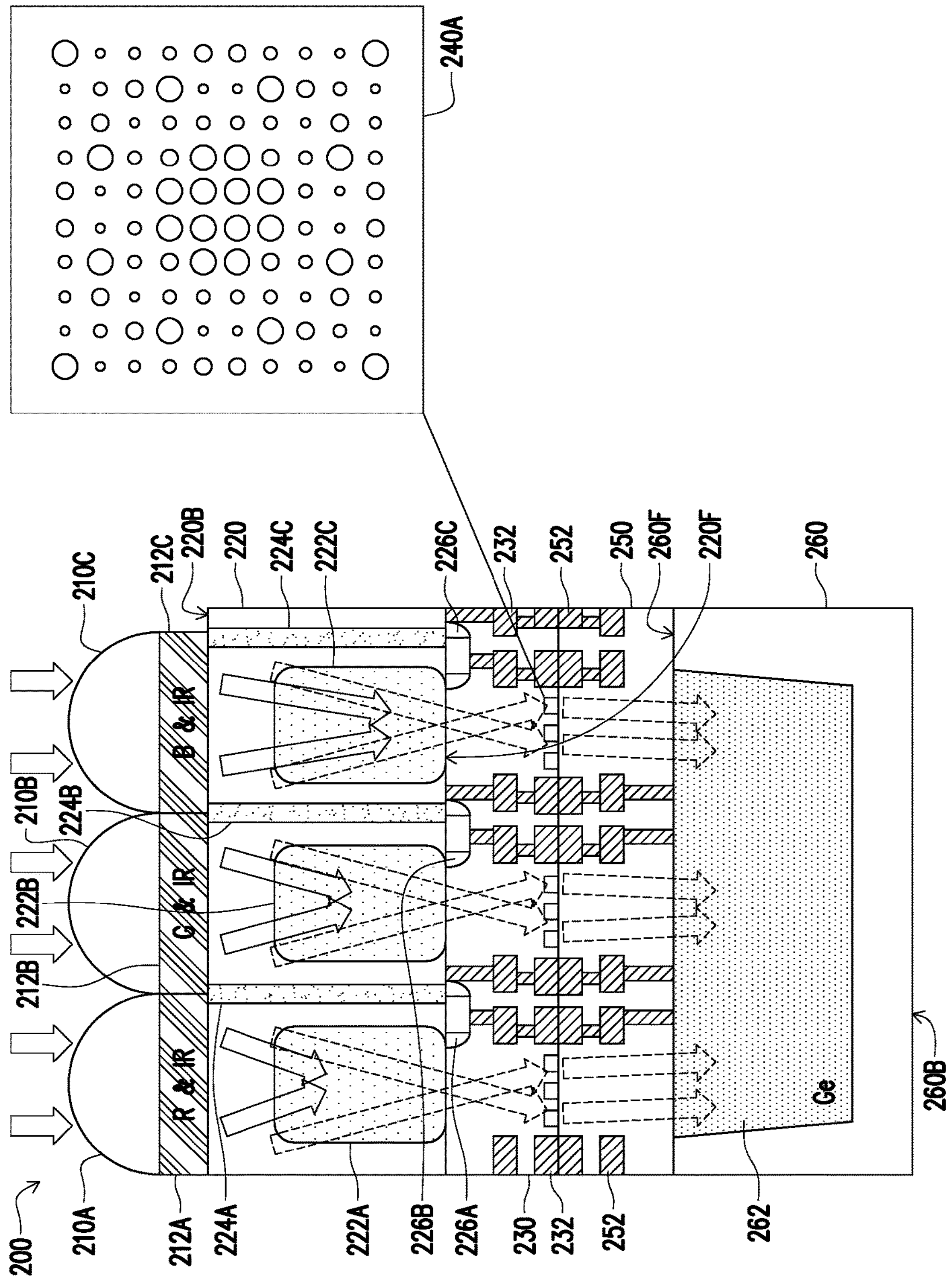
Figure 1C:
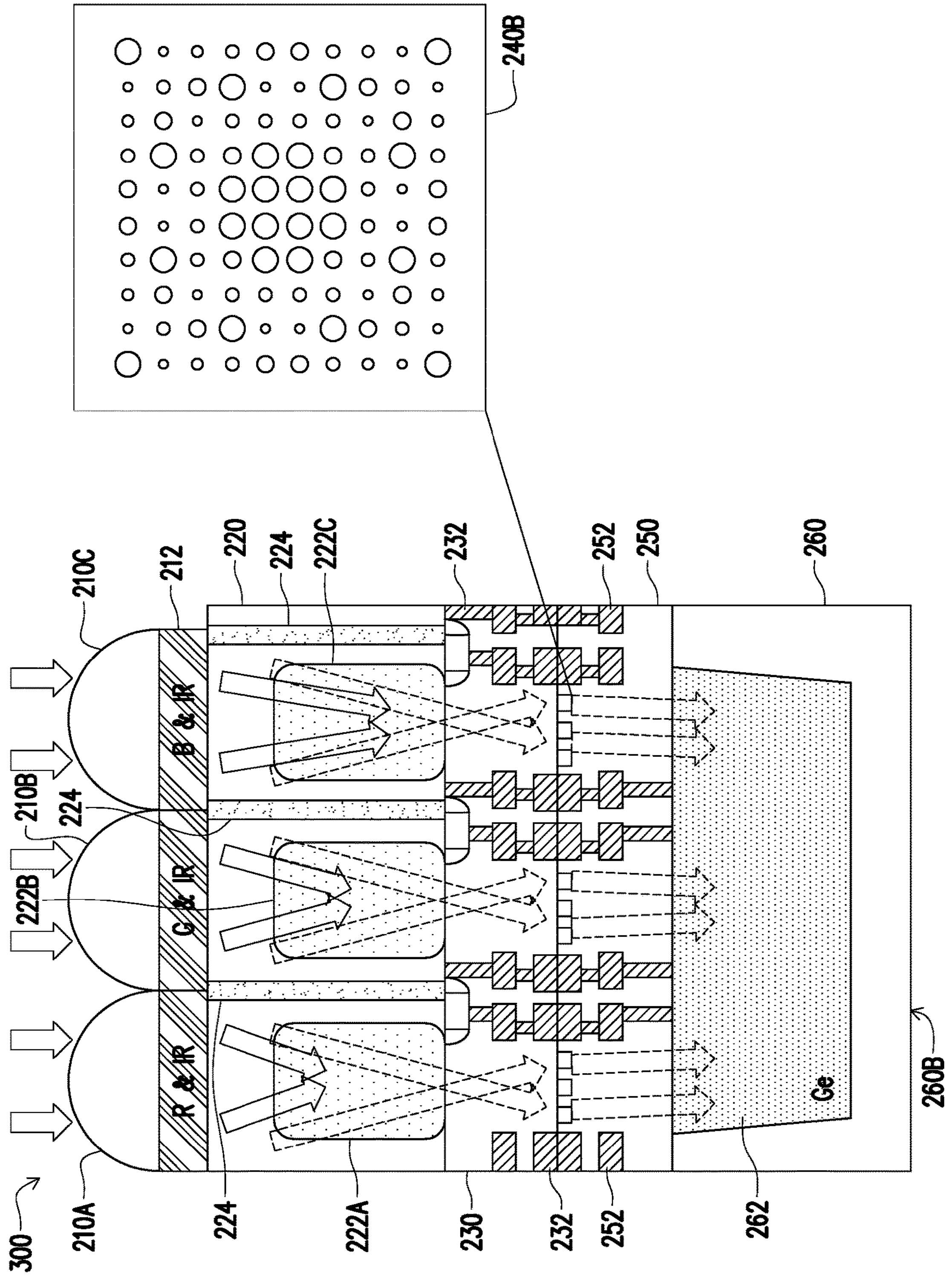
Figure 1D:
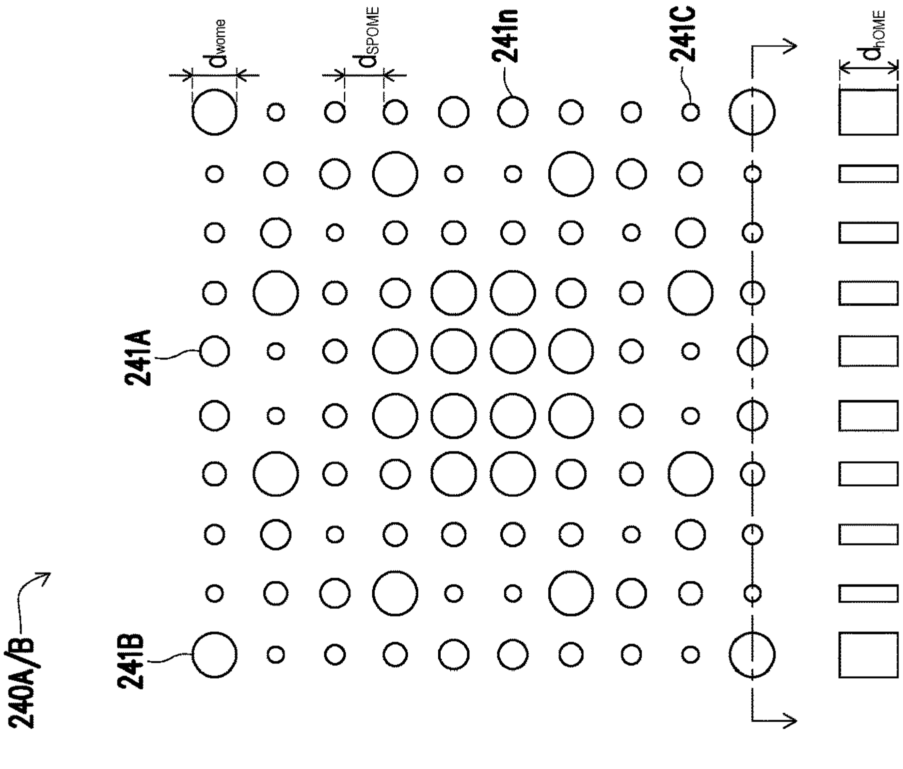
FIG. 1D illustrates a top and end view of a metalens in accordance with some embodiments.
Figure 1E:
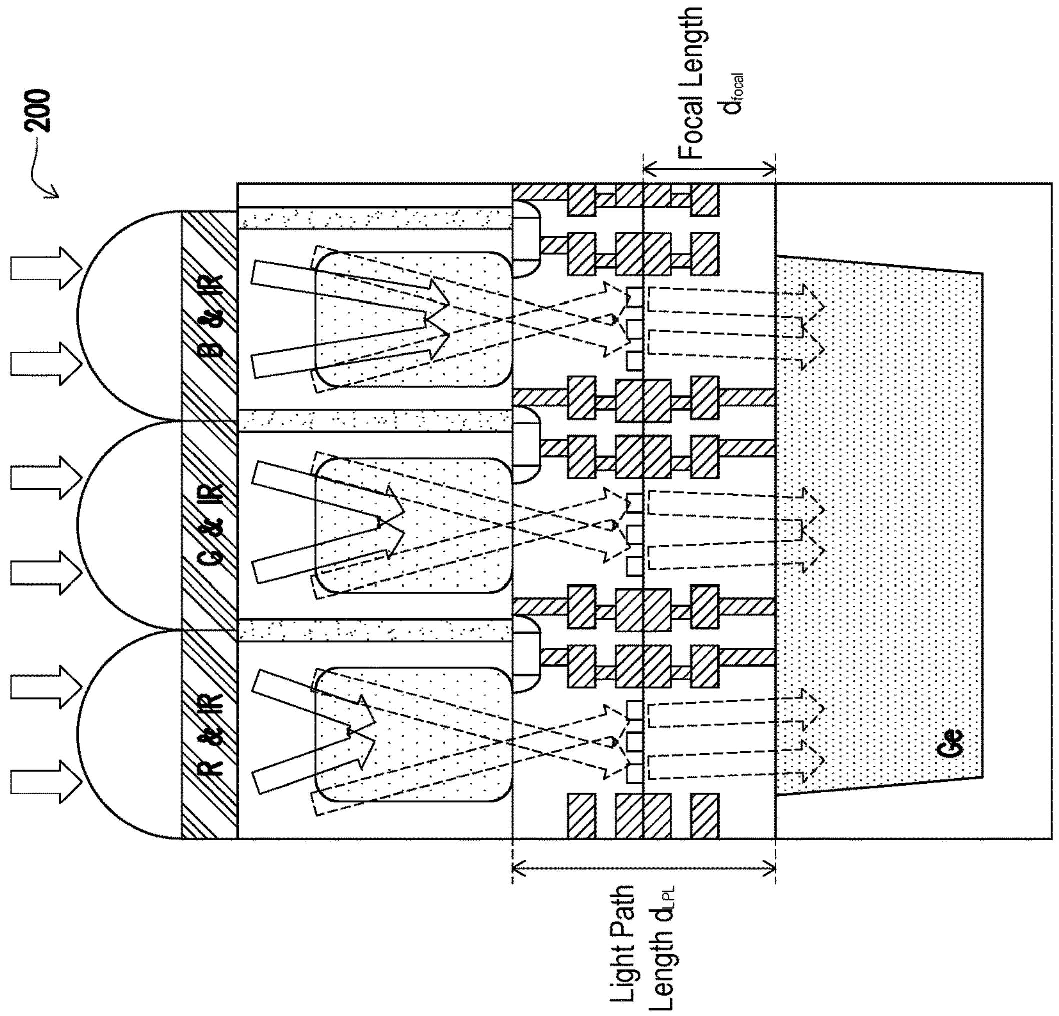
FIG. 1E illustrates further details of the metalens location and design criteria.

With reference to FIGS. 1A-1C illustrated are various cross-sectional views of an image sensor device structure in accordance with some embodiments. FIG. 1D illustrates a top and end view of a metalens in accordance with some embodiments, and FIG. 1E illustrates further details of the metalens location and design criteria.

For comparison, FIG. 1A is a cross-sectional view of a face to face multi-CIS (CMOS Image Sensor) and single-SWIR (Short Wavelength Infrared) sensor device structure, without a metalens. As shown, the image sensor device 100 may be a CMOS image sensor, or top wafer RGB CIS (CMOS Image Sensor) 120 in combination with a single-SWIR Ge sensor 160. This top/bottom wafer device also includes RGB microlens layers 110, and color filter layers 112. Metal wirings or metallization traces are disposed in a front surface of the RGB CIS wafer and front surface of the SWIR Ge wafer. As shown, incident visible light is detected by the top wafer RGB CIS, and incident SWIR light passes through the top wafer RGB CIS and is detected by the SWIR Ge wafer. The RGB microlens layers 110 is designed to focus visible light onto the red, green, and blue sensors of the CMOS image sensor 120. The microlenses 110 generally cannot be simultaneously designed to also focus infrared light onto the SWIR Ge sensor 160, due to the difference in design basis wavelength (shorter wavelength visible light versus longer wavelength infrared light) and the design-basis focal length (the red, green, and blue sensors of the CMOS image sensor are closer to the RGB microlenses 110 than the SWIR Ge sensor 160).

With reference to FIG. 1B, shown is a cross-sectional view of a face to face multi-CIS to single-SWIR, including a metalens structure in an IMD (Intermetal Dielectric) of a top semiconductor in accordance with some embodiments. As shown, the image sensor device 200 may be a CMOS image sensor, or top semiconductor RGB CIS (CMOS Image Sensor) in combination with a single-SWIR Ge sensor 260. This top/bottom semiconductor device also includes RGB microlens layers 210, and color filter layers 212. Metal wirings or metallization traces 232 and 252 are disposed in a front surface of the RGB CIS semiconductor and front surface of the SWIR Ge wafer, respectively. As shown, incident visible light is detected by the top semiconductor RGB CIS, and incident SWIR light passes through the top semiconductor RGB CIS and is detected by the SWIR Ge semiconductor 260. According to an embodiment, the top/bottom semiconductor device includes a top wafer and a bottom wafer.

For simplicity, FIG. 1B only illustrates three color photosensitive regions 222A, 222B and 222C of the image sensor device 200, but embodiments of the present disclosure are not limited thereto. In some embodiments, the photosensitive regions 222A, 222B and 222C are red, green, and blue photosensitive regions, respectively. (It should be noted that the photosensitive regions 222A, 222B and 222C may not themselves be discriminative for red, green, and blue light, but rather may be sensitive to visible light generally, with the color filter layers 112 passing red, green, and blue light, respectively, to the respective red, green, and blue photosensitive regions 222A, 222B, and 222C to implement the color-specific photosensitivity. Other combinations of the photosensitive regions 222A, 222B and 222C (e.g., implemented with other color filters) may be applied for various embodiments. As another nonlimiting illustrative example, the visible light array could include red, green, and blue photosensitive regions, and also a further visible light photosensitive region for detecting white light (where the color filter for the visible light photosensitive region may be either omitted, or pass white light). Moreover, it will be appreciated that FIG. 1B (and other similar drawings herein) illustrate a single RGB (or other color) pixel, but for imaging applications an array of instances of the image sensor device 200 are provided to provide an image sensor array.

In FIG. 1B, a semiconductor substrate 220 of the image sensor device 200 includes photosensitive regions 222 (illustrative photosensitive regions 222A, 222B, 222C) for detecting incident light and an isolation region 224 (illustrative isolation regions 224A, 224B, 224C) for isolating the photosensitive regions 222 from crosstalk. The semiconductor substrate 220 may be a silicon substrate, for example. In some exemplary examples, the semiconductor substrate 220 includes bulk silicon that may be undoped or doped (e.g., p-type, n-type, or a combination thereof). Other materials that are suitable for the formation of the image sensor device 200 may be used. For example, semiconductor substrate 220 may include a material such as germanium, quartz, sapphire, glass and/or another suitable material. Alternatively, semiconductor substrate 220 may be an active layer of a semiconductor-on-insulator (SOI) substrate. As shown in FIG. 1B, each of the photosensing members 222 extends from the front surface 220F of the semiconductor substrate 220.

An infrared light photosensing member 262 is disposed in a second photosensitive region 262 of a second semiconductor substrate 260 and is at the front surface of the semiconductor substrate 260. The Infrared light photosensing member 262 may include, for example, germanium, silicon germanium, gallium arsenide, indium phosphide, gallium antimonide, cadmium telluride, indium arsenide, indium antimonide, combinations thereof, and/or another suitable material with a bandgap or other property suitable for providing absorption of the infrared light. As shown in FIG. 1B, each of the infrared photodetector members 262 extends from the front surface 260F of the semiconductor substrate 260.

As will be described herein, a dielectric region, which include one or more dielectric layers, 230 is disposed over the front surface of the semiconductor substrate 220, and/or one or more dielectric layers 250 is disposed over the front surface of the semiconductor substrate 260, respectively. The dielectric layer 230 may include various metal grid or metallization layer(s) 232, and/or the dielectric layer 250 may include various metal grid or metallization layer(s) 252. These metallization layers 232/252 provide for electrically connecting the photosensitive member(s) 222 and/or infrared light sensing member(s) 262 with transistors (not shown, e.g. located elsewhere in the semiconductor substrate 220 and/or 260, or in a separate third substrate) to collect electrons generated by incident light and/or incident radiation (e.g. visible light and/or infrared radiation) traveling to the photosensitive regions 222 and infrared light sensitive regions 262 of the semiconductor substrates 220 and 260, respectively, and to convert the collected electrons into voltage signals. For example, the transistors may include a combination of transfer transistors, reset transistors, source follower transistors, row select transistors, and/or other suitable transistors. Optionally, there may be multiple metallization layers 232 and/or 252 separated by IMD material, formed using typical back end-of-line (BEOL) processing. The metallization of the metallization layers 232/252 may, for example, comprise metal material such as aluminum, copper, tungsten, tantalum, titanium, combinations thereof, and/or the like.

The dielectric layers 230/250 may be referred to as an inter-layer dielectric (ILD) layer or inter-metal dielectric (IMD) layer. The IMD layers 230/250 may comprise a material such as silicon dioxide ($SiO_2$), silicon nitride, silicon oxynitride, low-k dielectric, spin on glass (SOG), phosphosilicate glass (PSG), borosilicate glass (BSG), boron-doped phosphosilicate glass (BPSG), tetraethyl-orthosilicate (TEOS) oxide, multilayers thereof, or the like. In addition, the IMD layers 230/250 may include vias and conductive lines, i.e. metal grid or metallization layer(s) 252; each of the vias may be electrically connected between the conductive lines 252, and the conductive lines 252 may electrically connected the photosensors 222A, 222B, 222C, 262 to the transistors or other drive electronics (not shown) to transfer the voltage signals.

The isolation regions 224 may be implemented in some embodiments as deep trench isolation (DTI) 224 (224A, 224B, 224C) disposed in the photosensitive semiconductor substrate 220 between the photosensors 222A, 222B, 222C, in order to prevent incident light from penetrating therethrough, i.e., to provide optical isolation. The DTI 224 includes an isolation material, such as tungsten, hafnium oxide, tantalum oxide, zirconium oxide, titanium oxide, aluminum oxide, high-k dielectrics, combinations thereof, and/or another suitable material. If the DTI 224 are of an electrically insulating material then they may also enhance electrical isolation between the photosensors 222A, 222B, 222C. As shown in FIG. 1B, the illustrative DTI 224 extends from the back surface 220B of the semiconductor substrate 220. The top surface of the DTI 224 may be over the semiconductor substrate 220 or be coplanar to the back surface 220B of the semiconductor substrate 220. The DTI 224 may include a thickness $T_{DTI}$ (i.e., from the back surface 220B of the semiconductor substrate 220 to the bottom surface of the DTI 224) and a width $W_{DTI}$, and the ratio of the thickness $T_{DTI}$ to the width $W_{DTI}$, may be equal to or greater than 5, so as to provide good isolation performance. In some embodiments, the ratio of the thickness $T_{DTI}$ to the width $W_{DTI}$ ranges from about 5 to about 15. In certain embodiments, the width $W_{DTI}$ ranges from about 0.1 μm to about 0.5 μm, and the thickness $T_{DTI}$ ranges from about 1.5 μm to about 4 μm. These are merely some nonlimiting illustrative examples.

A color filter layer 212 (212A, 212B, 212C) is disposed over the semiconductor 220 back surface 220B. The color filter layer 212 allows light components in a particular wavelength band to penetrate therethrough and block unwanted light components. The passing wavelength band of the color filter layer 212 may be a red light wavelength band, a green light wavelength band a blue light wavelength band, or combinations thereof, but is not limited thereto. Infrared light may pass through the color filter layer 212 and be detected in the semiconductor substrate 260. The color filter layer 212 may include a material of, for example, pigment-based polymer, dye-based polymer, resin, and another suitable material. As previously noted, the color filter layers 212A, 212B, 212C can operate in combination with the corresponding photosensitive regions 222A, 222B, 222C to provide color-sensitive (e.g., respective red, green, and blue) photosensitive regions.

A microlens layer 210 (210A, 210B, 210C) is disposed over the color filter layer 212. The microlens layer 210 has convex shapes respectively in the photosensitive regions 222A, 222B and 222C for improving light receiving efficiency. The microlens layer 210 may be formed from glass, acrylic polymer or another suitable material with high transmittance. The microlenses 210A, 210B, 210C are designed to focus visible light on the corresponding photosensitive regions 222A, 222B, 222C. However, as previously discussed, it is difficult or impossible to design these microlenses to also focus infrared light onto the underlying infrared detector 262, both due to the difference in wavelength (e.g., visible light in the 400-700 nanometer range versus short wavelength infrared light in the 800-1800 nanometer range, in some nonlimiting illustrative embodiments) and the difference in focal distance (that is, the distance from the microlenses 210 to the visible-light photosensitive regions 222 is less than the distance from the microlenses 222 to the infrared photosensitive region 262). Consequently, the infrared light might be defocused at the infrared photosensitive region 262.

As shown in FIG. 1B, to resolve this problem the image sensor device further includes a metalens 240A disposed between the light photosensor 222 and the infrared light photosensor 262. The metalens 240A is configured to focus infrared light impinging on the back surface 220B of the photosensing semiconductor 220 onto the infrared light photosensor 262. According to his embodiment shown in FIG. 1B, the image device is a Face to Face multi-CIS to Single-SWIR IR, including Meta Lens structure in the IMD of the top semiconductor. Advantageously, the metalens 240A can be designed specifically for the infrared light (e.g., 800-1800 nanometer range in some nonlimiting illustrative embodiments) and specifically for the focal distance from the metalens 240 to the infrared photosensitive region 262. Moreover, as the metalens is after the visible light photosensitive regions 222 along the optical path (where, again, the visible and infrared light impinges on the side of the device where the microlenses 210 are located), the metalens does not impact the optical design of the visible light detection. This can be advantageous in designs for applications where high spatial resolution is desired for the visible light detection, such as in imaging arrays where the visible light sensors are providing high resolution daytime imaging and the infrared detection is providing lower resolution night vision, or in imaging arrays where the visible light sensors are providing high resolution imaging and the infrared detection is used for range detection. Still further, the metalens 240 can be made very thin, e.g. formed as an etched pattern in an interface of the semiconductor or dielectric layer, and hence does not impact the compact design of the combined visible/infrared sensor.

With reference to FIG. 1D and FIG. 1E, FIG. 1D illustrates a top and end view of a metalens in accordance with some embodiments, and FIG. 1E illustrates further details of the metalens location and design criteria.

The function of the metalens 240 is to focus incident light focus impinging on the back surface of the photosensitive semiconductor 220 onto the infrared light photosensor semiconductor 260. Specifically, the metalens focuses infrared light received that passes through each photosensitive region 222A, 222B and 222C to the infrared light photosensing region 262.

The configuration of the metalens includes a plurality of optical meta-elements 241A, 241B, 241C, . . . 241*n* arranged in a periodic grid according to an embodiment. Each optical meta-element is defined by a width $d_{wome}$ and height $d_{hOME}$. In addition, the metalens grid is further defined by a spacing of the optical meta-elements $d_{SPOME}$, which is periodic according to the embodiment described. The optical meta-element width $d_{wome}$, height $d_{hOME}$, spacing $d_{SPOME}$, and Grid Width $W_{grid}$ determine the wavelength filtering performance of the metalens. Specifically, the optical meta-element width $d_{wome}$, height $d_{hOME}$, and spacing $d_{SPOME}$ determine the wavelength ranges of light that passes to the infrared light photosensing region 262, and the Grid Width $W_{grid}$ determines the width of the light beam that passes to the infrared light photosensing region, as well as the optical alignment of the metalens, photosensitive region 222A, 222B and 222C and infrared light photosensing regions 262A, 262B and 262C.

As shown in FIG. 1E, the focal length of the metalens, Focal Length $d_{focal}$, is defined by the distance from the metalens to the front surface of the infrared light photosensor 262 and the Light Path Length $d_{LPL}$ is defined as the length from the light photosensing region face, i.e., semiconductor face 220F, to the infrared light photosensor 262 front face 262F.

According to an embodiment, the Focal Length dfocal is 0.1 $\mu m<d_{focal}<2$ μm, and the optical meta-element height $d_{hOME}>0.5$ μm. Tin addition, 0<optical meta-element width<2*target wavelength/refractive index of metalens material, 0<optical meta-element space<2*wavelength/refractive index of metalens material. In other words, the Grid size is defined as being equal to Optical Meta-element Width+Optical Meta-element Spacing.

Further details of the metalens and its design according to some nonlimiting illustrative examples include the following. The light path distance depends on metal layers, and according to an embodiment is range: 3~20 μm. The light path distance may depend on characteristics of any intervening metal layers (e.g., metallization layers 232 and/or 252), and according to some nonlimiting example embodiments is in a range of 3~20 μm. The metalens elements 241 in some embodiments may comprise a polymer or organic material. In some embodiments, the heights of all the metalens elements 241 are equal in order to facilitate efficient fabrication, although this is not required. In some embodiments, the metalens 240 (e.g., its dimensions as shown in FIG. 1D) are optimized for a design-basis infrared wavelength and design basis metalens 240-to-infrared detector 262 distance and the refractive indices of the intervening dielectric material using optical simulation (e.g. optical ray tracing simulation). In some embodiments, an etch process is used to define the meta-lens 240 as an etched pattern in a semiconductor face, or dielectric region. The meta-lens grid design may vary for the different targeted wavelengths, and to exclude unwanted wavelengths (e.g., by diffraction or refraction away from the infrared photodetector 262). According to an embodiment, the wavelength range for an infrared light photosensor Ge sensor is 800 nm~1800 nm. The periodic structure of the metalens 240 in some embodiments enables the configuration of the metalens to prevent unwanted wavelengths from reaching the infrared light photosensor area. In some embodiments, the metalens grid may be coated with a High-N material, for example but not limited to, $TiO_2$, $Ta_2O_5$, or $ZrO_2$ deposited on the metalens grid surface.

With reference to FIG. 1C, shown is a cross-sectional view of a face to face multi-CIS to single-SWIR, including a metalens structure in an IMD (Intermetal Dielectric) of a bottom semiconductor in accordance with some embodiments (300). As shown, the image sensor device 300 may be a CMOS image sensor 220, or top semiconductor RGB CIS (CMOS Image Sensor) in combination with a single-SWIR Ge sensor 260. This top/bottom semiconductor device also includes RGB microlens layers 210, and color filter layers 212. Metal wirings or metallization traces 232 and 252 are disposed in a front surface of the RGB CIS semiconductor and front surface of the SWIR Ge wafer, respectively. As shown, incident visible light is detected by the top semiconductor RGB CIS 220, and incident SWIR light passes through the top semiconductor RGB CIS 220 and is detected by the SWIR Ge semiconductor 260. According to an embodiment, the top/bottom semiconductor device includes a top wafer and a bottom wafer.

For simplicity, FIG. 1C only illustrates three color photosensitive regions 222A, 222B and 222C of the image sensor device 300, but embodiments of the present disclosure are not limited thereto. In some embodiments, the photosensitive regions 222A, 222B and 222C are red, green, and blue photosensitive regions, respectively. Other combinations of the photosensitive regions 222A, 222B and 222C may be applied for various embodiments.

In FIG. 1C, a semiconductor substrate 220 of the image sensor device 300 includes photosensitive regions 222 for detecting incident light and an isolation region 224 for isolating the photosensitive regions 222 from crosstalk. The semiconductor substrate 220 may be a silicon substrate, for example. In some exemplary examples, the semiconductor substrate 220 includes bulk silicon that may be undoped or doped (e.g., p-type, n-type, or a combination thereof). Other materials that are suitable for the formation of the image sensor device 200 may be used. For example, semiconductor substrate 220 may include a material such as germanium, quartz, sapphire, glass and/or another suitable material. Alternatively, semiconductor substrate 220 may be an active layer of a semiconductor-on-insulator (SOI) substrate. As shown in FIG. 1C, each of the photosensing members 222 extends from the front surface 220F of the semiconductor substrate 220.

An Infrared light photosensing member 262 is disposed in a second photosensitive region 262 of a second semiconductor substrate 260 and are at the front surface of the semiconductor substrate 260. The Infrared light photosensing member 262 may include, for example, germanium, silicon germanium, gallium arsenide, indium phosphide, gallium antimonide, cadmium telluride, indium arsenide, indium antimonide, combinations thereof, and/or another suitable material. As shown in FIG. 1C, each of the photosensing members 262 extends from the front surface 260F of the semiconductor substrate 260.

Further details of the dielectric layers, 230/250, deep trench isolation (DTI) 224 (224A, 224B, 224C), metal grid or metallization layer(s) 232, color filter layer 212 (212A, 212B, 212C), and microlens layer 210 (210A, 210B, 210C) are described above with reference to FIG. 1B.

As shown in FIG. 1C, the image sensor device includes the metalens 240 disposed between the light photosensor 222 and the infrared light photosensor 262. The metalens 240 is configured to focus infrared light impinging on the back surface 220B of the photosensing semiconductor 220 onto the infrared light photosensor 260. According to the embodiment shown in FIG. 2C, the image device is a Face to Face multi-CIS to Single-SWIR, including Meta Lens structure in the IMD of the BOTTOM semiconductor, as compared with FOG 2B which shows the metalens structure in the IMD of the TOP semiconductor.

Figure 2A:
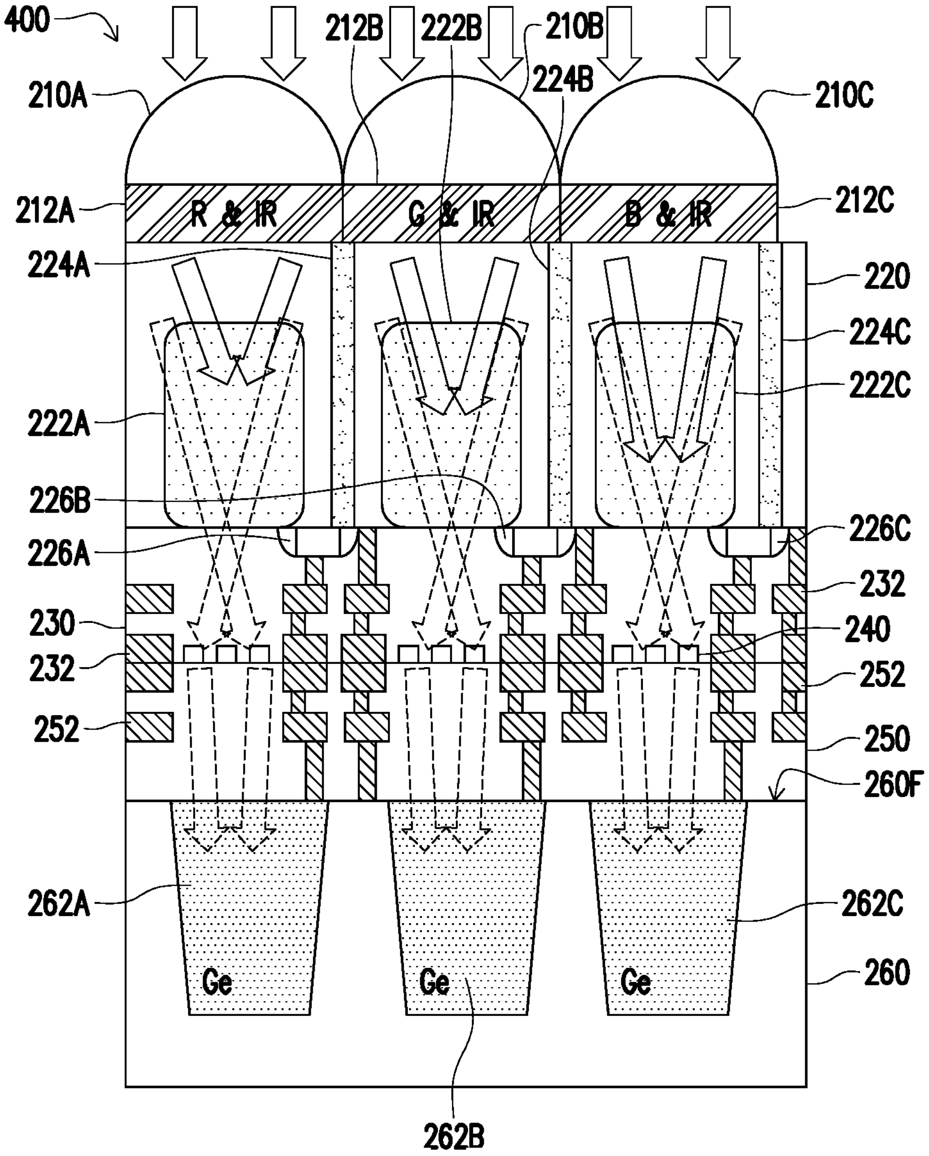
FIGS. 2A-2B illustrate various cross-sectional views of an image sensor device structure in accordance with some embodiments.
Figure 2B:
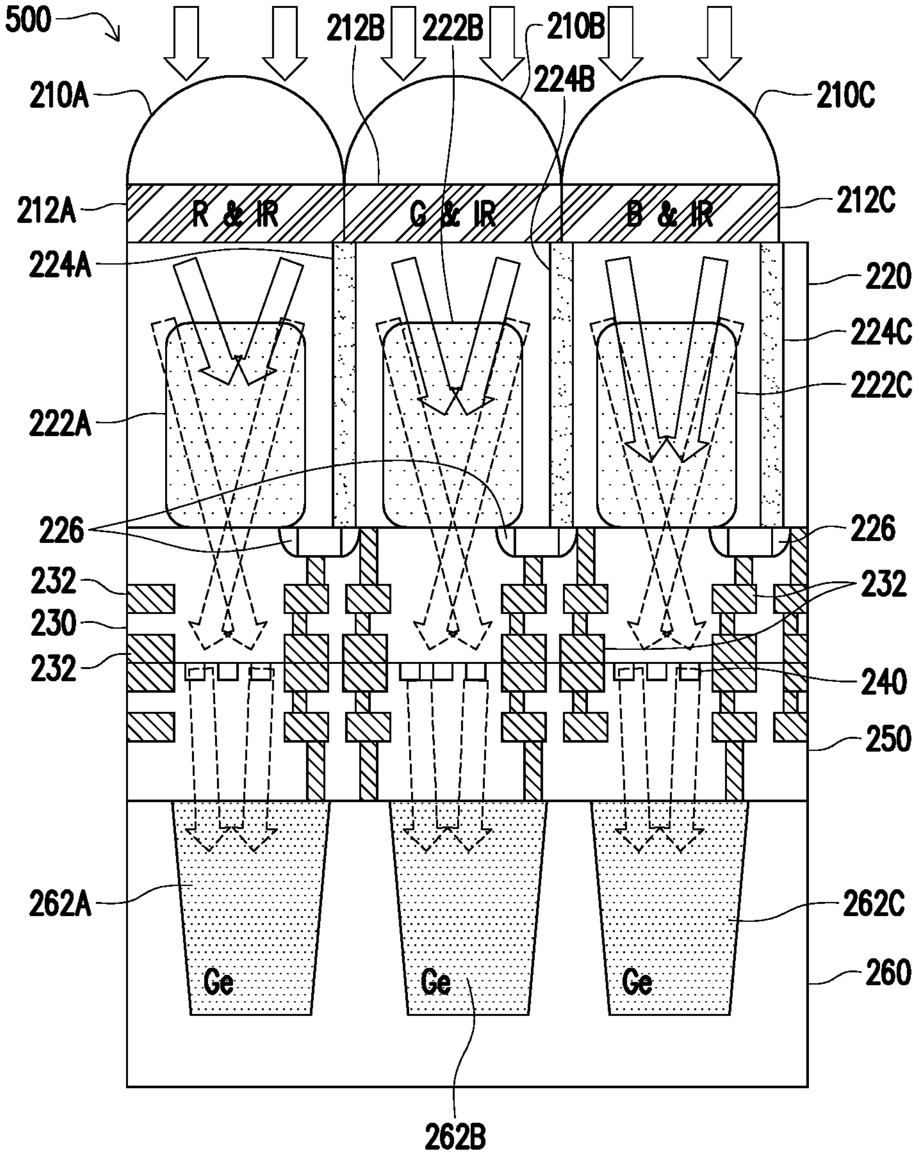

With reference to FIGS. 2A-2B, there are shown various views cross-sectional views of an image sensor device structure in accordance with some embodiments. The embodiments of FIGS. 2A and 2B differ in that the metalens 240 is formed into the surface of the dielectric material 230 in the embodiment of FIG. 2A; whereas the metalens 240 is formed into the surface of the dielectric material 250 in the embodiment of FIG. 2B.

With reference to FIG. 2A, shown is a cross-sectional view of a face to face single-CIS to single-SWIR, including a metalens structure in an IMD (Intermetal Dielectric) of a top semiconductor in accordance with some embodiments (400). In contrast to the image sensor described with reference to FIGS. 1B, 1C and 1D, this image sensor includes a configuration that provides single-CIS to single-SWIR detection. In other words, the bottom infrared light photosensor semiconductor includes 3 independent infrared light detection regions that are each optically aligned with respective Red, Green and Blue photosensing regions of the top, photosensing semiconductor. As described with reference to FIG. 1B, the metalens is incorporated into the top semiconductor IMD (Intermetal Dielectric) 230.

With reference to FIG. 2B, shown is a cross-sectional view of a face to face single-CIS to single-SWIR, including a metalens structure in an IMD (Intermetal Dielectric) of a bottom semiconductor in accordance with some embodiments (500). In contrast to the image sensor described with reference to FIGS. 1B, 1C and 1D, this image sensor includes a configuration that provides single-CIS to single-SWIR detection. In other words, the bottom infrared light photosensor semiconductor includes 3 independent infrared light detection regions that are each optically aligned with respective Red, Green and Blue photosensing regions of the top, photosensing semiconductor. As described with reference to FIG. 1C, the metalens is incorporated into the bottom semiconductor IMD (Intermetal Dielectric) 250.

With reference to FIGS. 3A-3D, there are shown various views cross-sectional views of an image sensor device structure in accordance with some further embodiments.

Figure 3A:
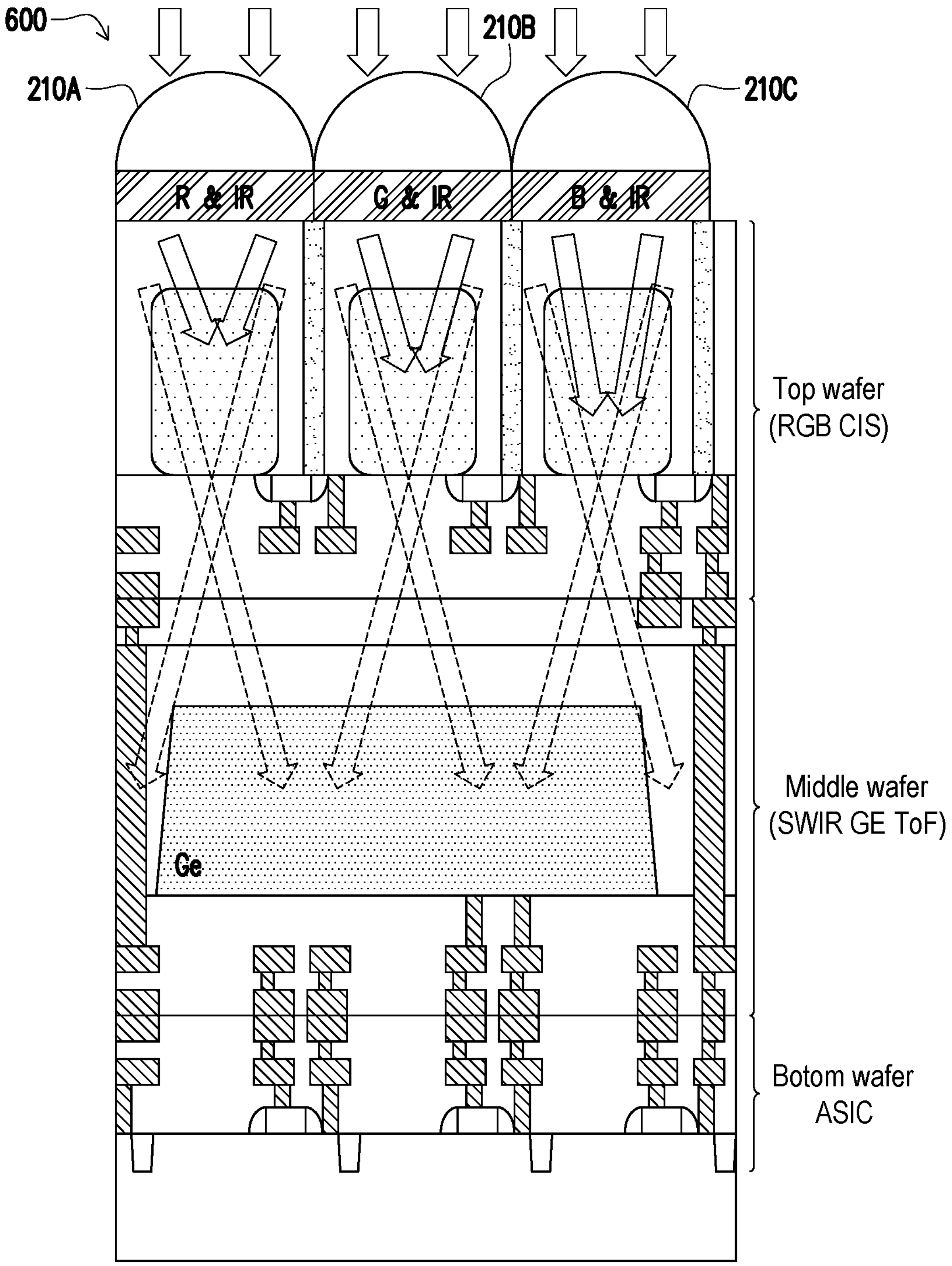
FIGS. 3A-3D illustrate various cross-sectional views of an image sensor device structure in accordance with some embodiments.

With reference to FIG. 3A, and for comparison with FIGS. 3B-D, and FIGS. 4A-4C shown is a cross-sectional view of a device structure 600 that includes a face to back multi-CIS to Single-SWIR and that further includes an ASIC (Application Specific Integrated Circuit) 270. The embodiment of FIG. 3A does not include a metalens. As shown, the face to back multi-CIS to Single-SWIR and ASIC not including a metalens structure can be limited in performance by defocusing of infrared light at the Ge sensing area.

Figure 3B:
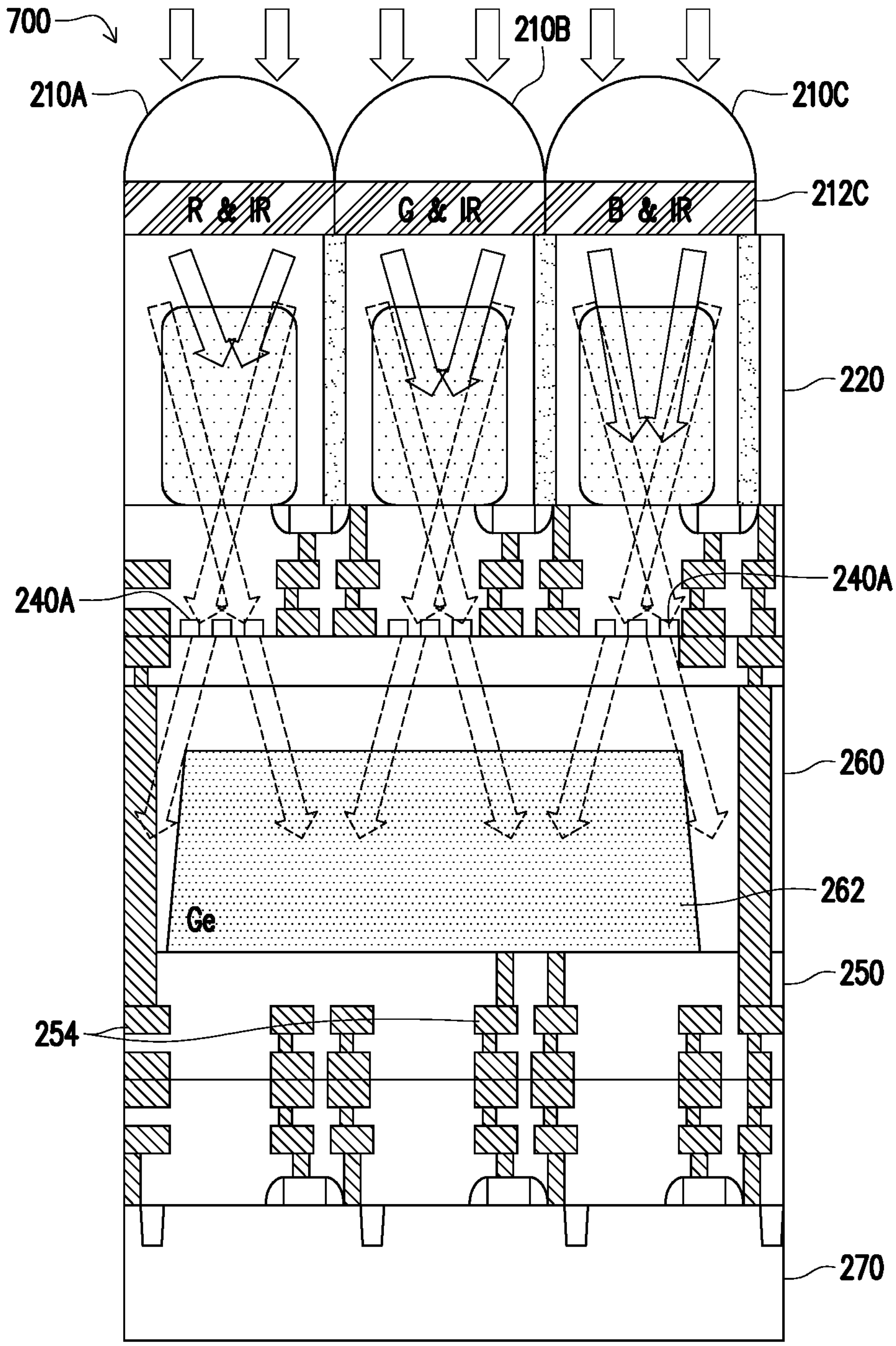

With reference to FIG. 3B, shown is a cross-sectional view of a device structure 700 including a face to back multi-CIS to single-SWIR, and including a metalens structure 240A in an IMD of a top semiconductor, and further including the ASIC 270.

Similar to FIG. 1B, the metalens of the embodiment of FIG. 3B is integrated into an IMD of a top semiconductor. However, in contrast to the face to face configuration of FIG. 1B, this embodiment includes a face to back configuration. In addition, the third ASIC substrate or wafer 270 is bonded to the infrared light photosensor semiconductor face, for example providing transistor-based electronics for operating the combined visible/infrared light sensor array.

Figure 3C:
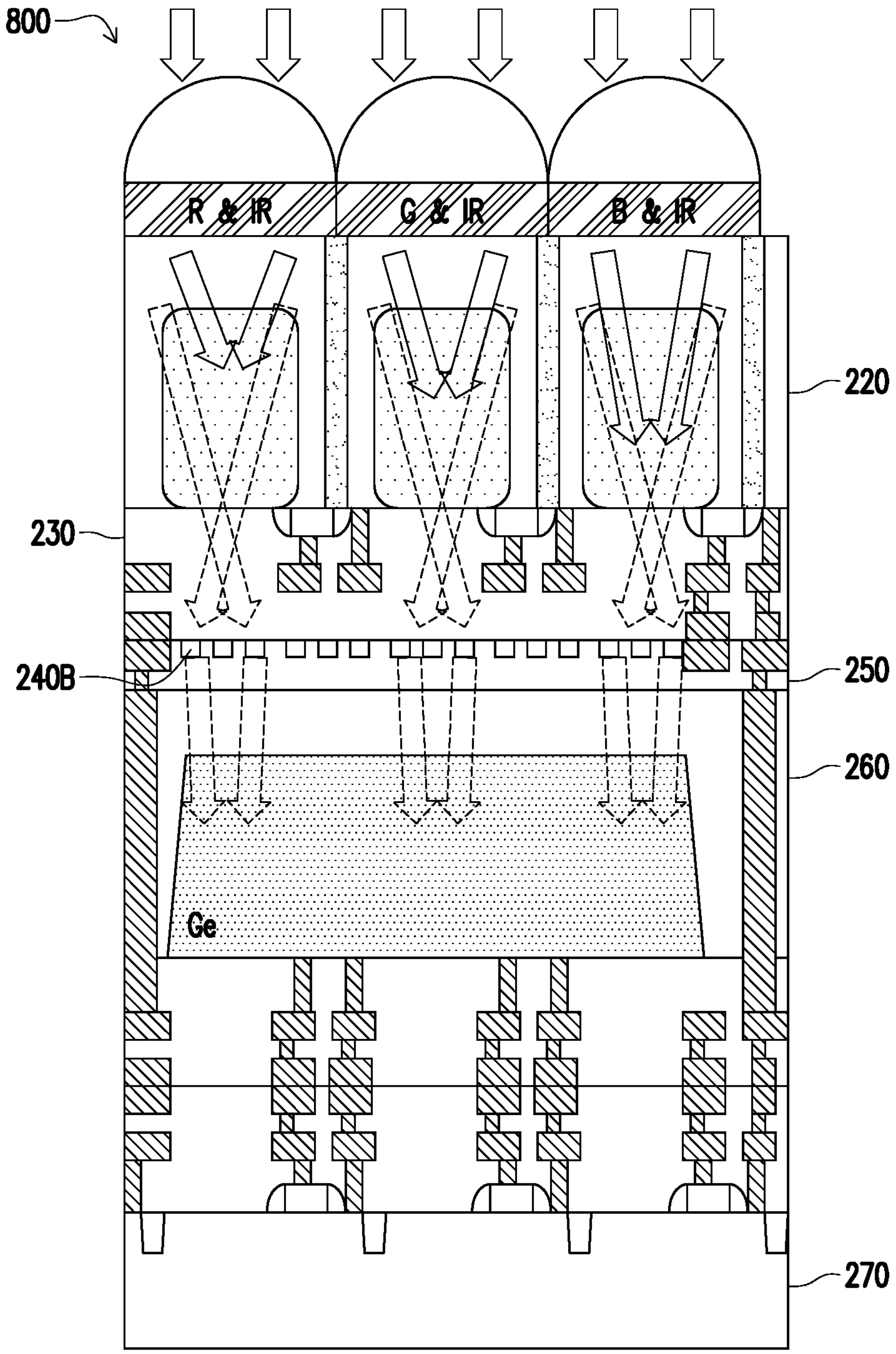

With reference to FIG. 3C, shown is a cross-sectional view of a device structure 800 including a face to back multi-CIS to Single-SWIR, including a metalens 240B structure in an IMD of a bottom semiconductor, and the ASIC 270.

Similar to FIG. 1C, the metalens is integrated into an IMD of a bottom semiconductor. However, in contrast to the face to face configuration of FIG. 1C, this embodiment includes a face to back configuration. In addition, the third ASIC substrate or wafer 270 is bonded to the infrared light photosensor semiconductor face.

Figure 3D:
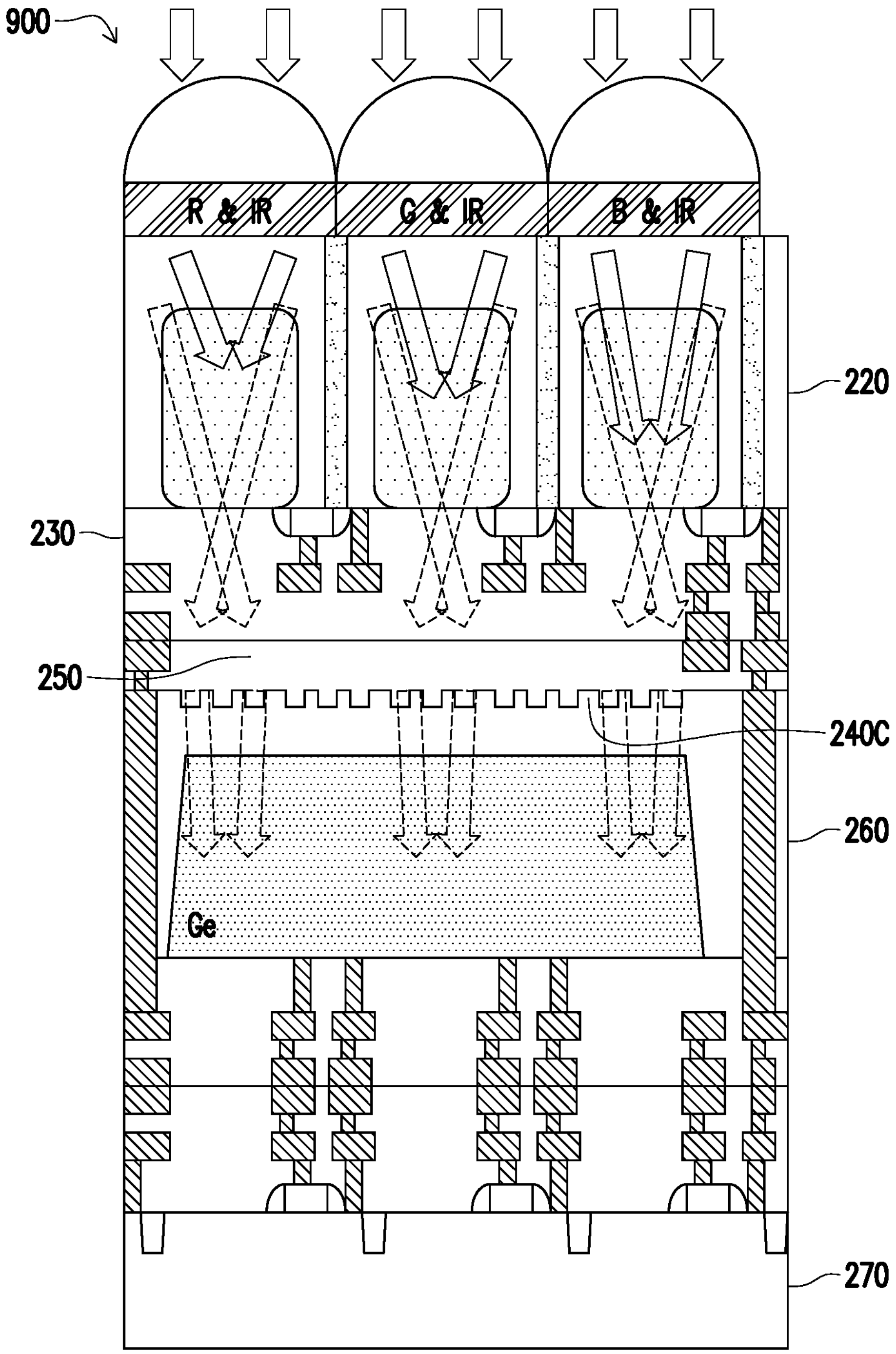

With reference to FIG. 3D, shown is a cross-sectional view of a device structure 900 including a face to back multi-CIS to single-SWIR, including a metalens 240C structure in a semiconductor face of a bottom semiconductor, and the ASIC 270.

Similar to FIG. 3C, the metalens is integrated into a bottom semiconductor. However, in contrast to the face to back configuration of FIG. 3C, this embodiment includes the etching of metalens 240C into the back of the semiconductor, prior to forming the dielectric and metallization layers. In addition, the third ASIC substrate or wafer 270 is bonded to the infrared light photosensor semiconductor face.

Figure 4A:
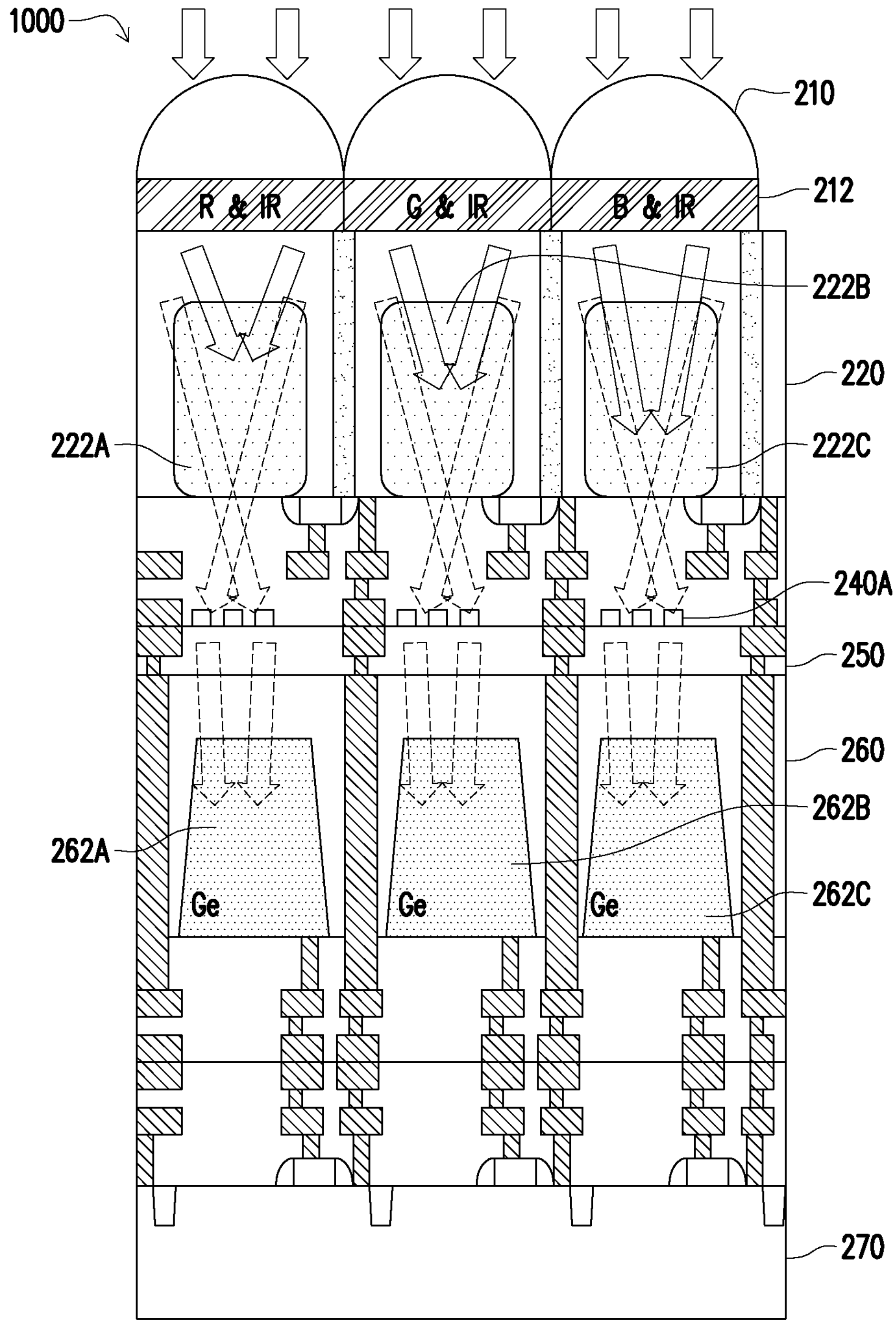
FIGS. 4A-4C illustrate various cross-sectional views of an image sensor device structure in accordance with some embodiments.
Figure 4B:
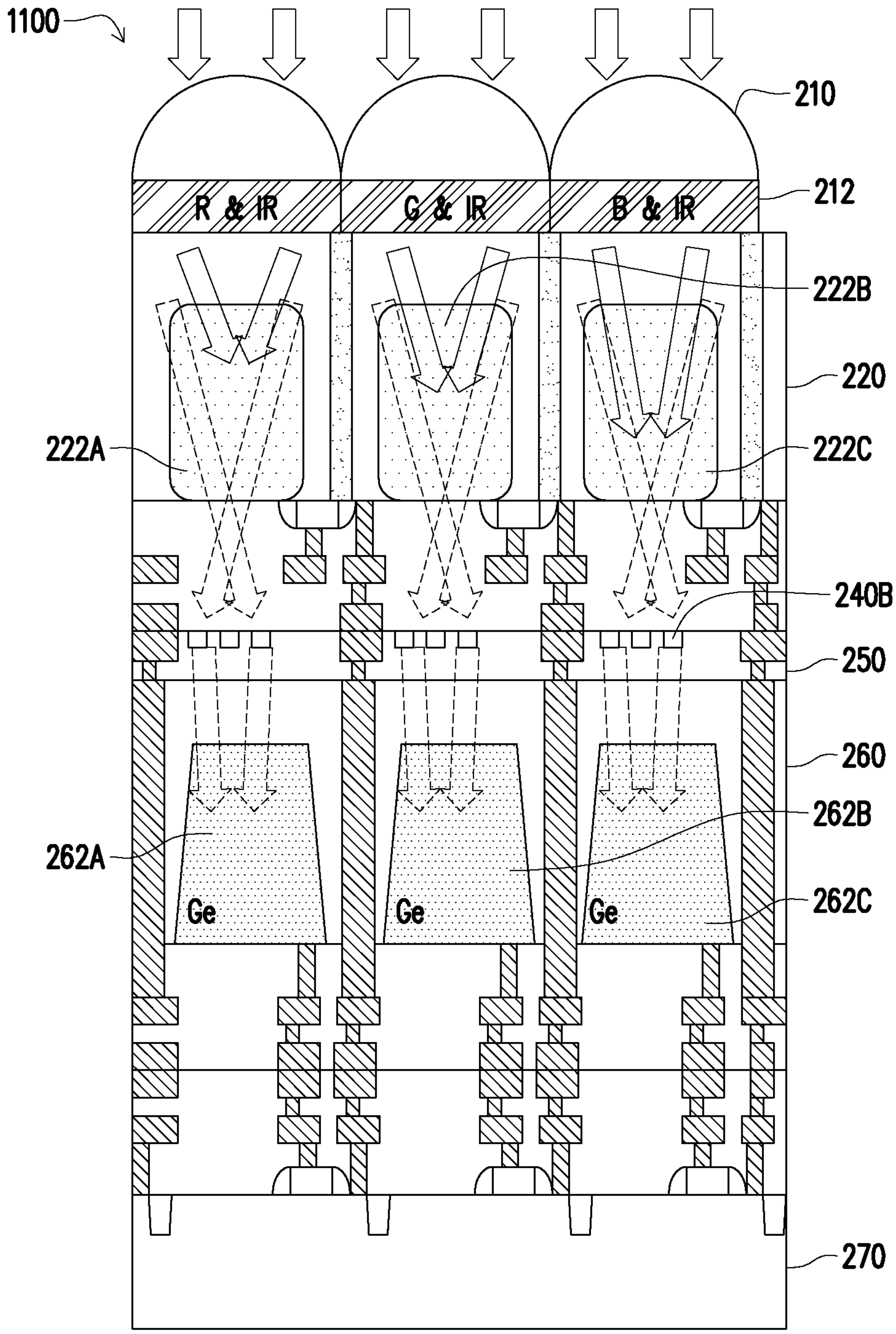
Figure 4C:
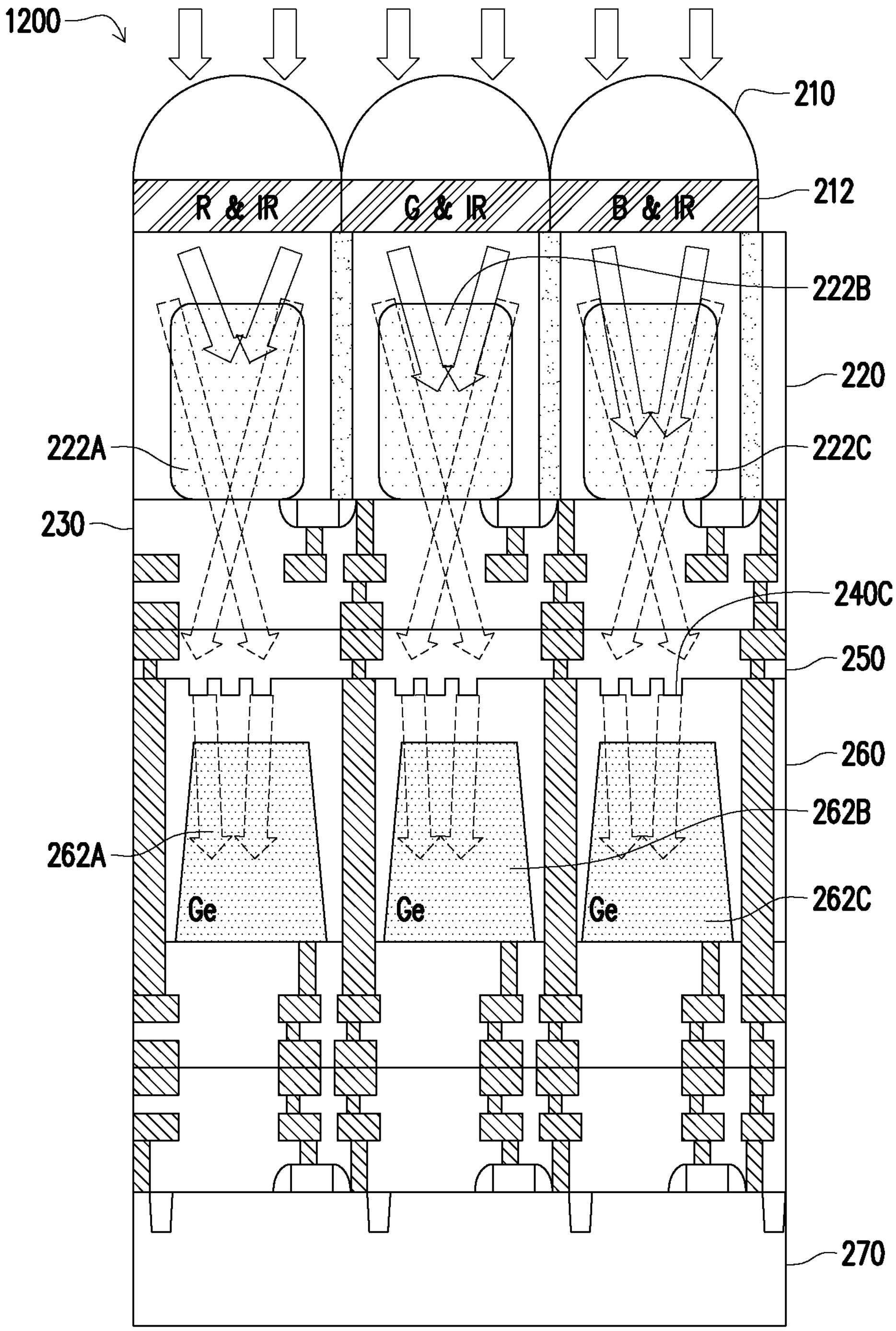

With reference to FIGS. 4A-4C, there are shown various cross-sectional views of an image sensor device structure in accordance with some further embodiments. In these embodiments, there are three infrared detectors 262, that is, an infrared detector 262A corresponding to the visible light detector 222A, an infrared detector 262B corresponding to the visible light detector 222B, and an infrared detector 262C corresponding to the visible light detector 222C.

With reference to FIG. 4A, shown is a cross-sectional view of a device structure 1000 including a face to back multi-CIS to Multi-SWIR, including a metalens structure 240A in an IMD of a top semiconductor, and ASIC 270.

Similar to the multi-CIS to Multi-SWIR image device described with reference to FIG. 2A, the metalens is integrated into an IMD of a top semiconductor. However, in contrast to the face to face configuration of FIG. 2A, this embodiment includes a face to back configuration. In addition, the third ASIC substrate or wafer 270 is bonded to the infrared light photosensor semiconductor face.

With reference to FIG. 4B, shown is a cross-sectional view of a device structure 1100 including a face to back multi-CIS to multi-SWIR, including a metalens structure 240B in an IMD of a bottom semiconductor, and ASIC 270.

Similar to the multi-CIS to Multi-SWIR image device described with reference to FIG. 2B, the metalens is integrated into an IMD of a bottom semiconductor. However, in contrast to the face to face configuration of FIG. 2B, this embodiment includes a face to back configuration. In addition, the third ASIC substrate or wafer 270 is bonded to the infrared light photosensor semiconductor face.

With reference to FIG. 4C, shown is a cross-sectional view of a device structure 1200 including a face to back multi-CIS to multi-SWIR, including a metalens structure 240C in a face of a bottom semiconductor, and ASIC 270.

Similar to the multi-CIS to multi-SWIR image device described with reference to FIG. 4B, this embodiment includes a multi-CIS to multi-SWIR configuration, and the metalens is integrated into a bottom semiconductor. This embodiment includes the etching of a metalens into the back of the semiconductor, prior to forming the dielectric and metallization layers. In addition, the third ASIC substrate or wafer 270 is bonded to the infrared light photosensor semiconductor face.

In the previous embodiments, the metalens is formed in the dielectric layer 230 or the dielectric layer 250. In the following embodiments, the metalens is formed into the surface of the semiconductor substrate 220 or the semiconductor substrate 260.

Figure 5A:
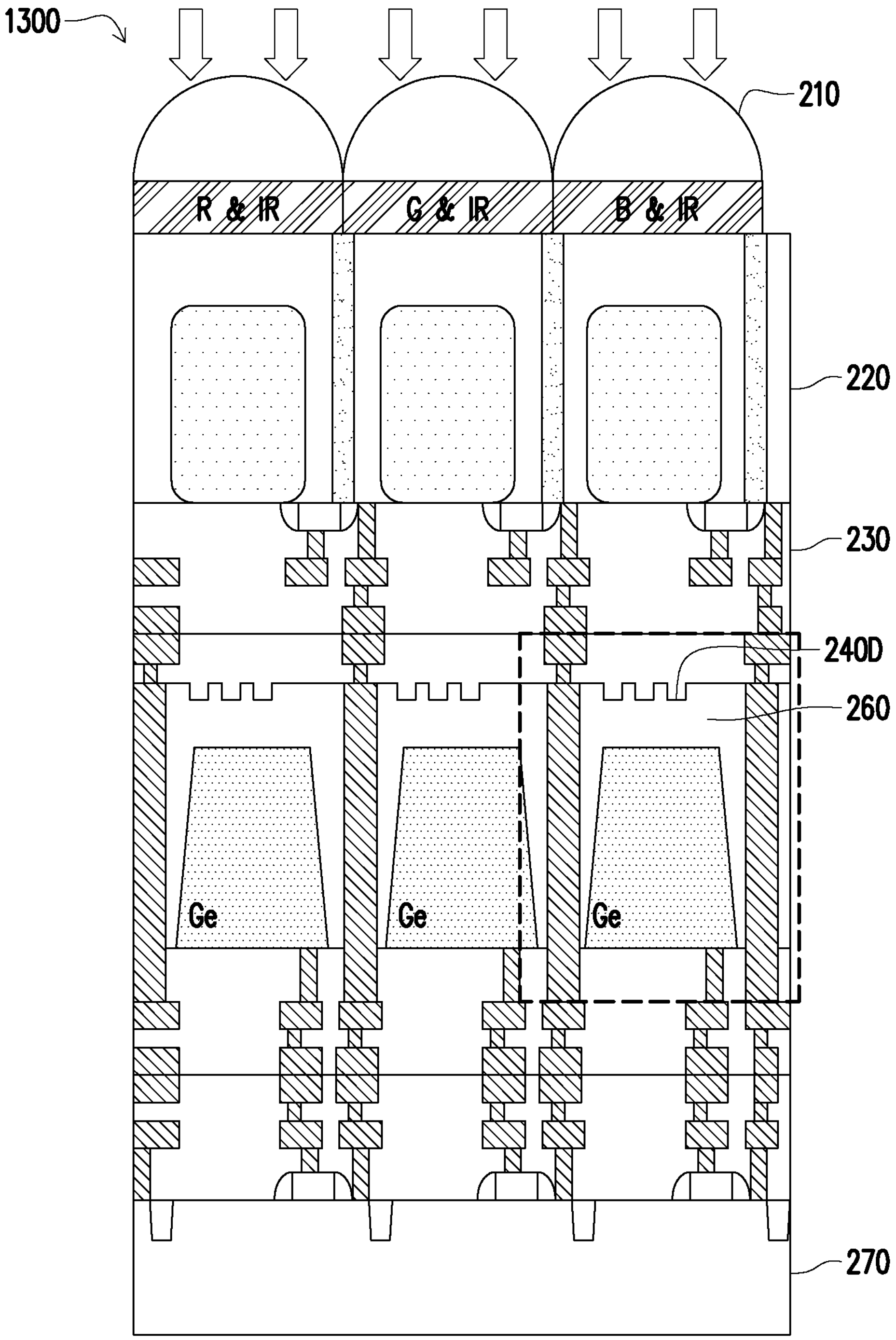
FIGS. 5A-5B illustrate various cross-sectional views of an image sensor device structure, including a face to back multi-CIS wavelength filter/target wavelength detector in accordance with some embodiments, the wavelength filter/target wavelength detector including a metalens structure in a face of a bottom semiconductor.
Figure 5B:
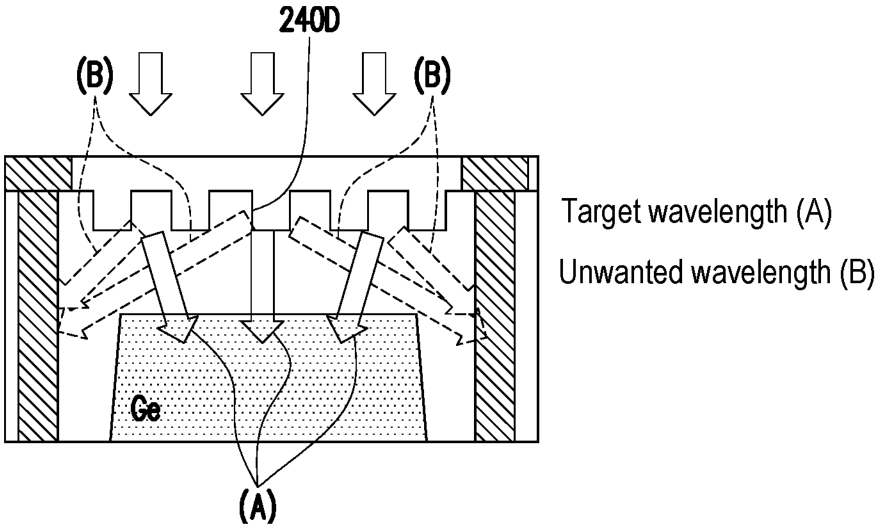

With reference to FIGS. 5A-5B, there are shown various cross-sectional views of an image sensor device structure 1300 in accordance with some embodiments. Specifically, shown is a face to back multi-CIS wavelength filter/target wavelength detector in accordance with some embodiments, the wavelength filter/target wavelength detector including a metalens structure 240D in a face of the bottom semiconductor 260.

As shown, according to this embodiment, a metalens 240D is etched into the bottom semiconductor similar to that described with reference to FIGS. 3D and 4C. However, it is to be understood that other embodiments can include the metalens incorporated into the dielectric regions of the top or bottom semiconductors as previously described.

In the previous embodiments, the metalens is designed for a single design-basis infrared wavelength. In the next embodiment described, the metalens may be designed to direct different design basis infrared wavelengths to different infrared sensors.

Figure 6A:
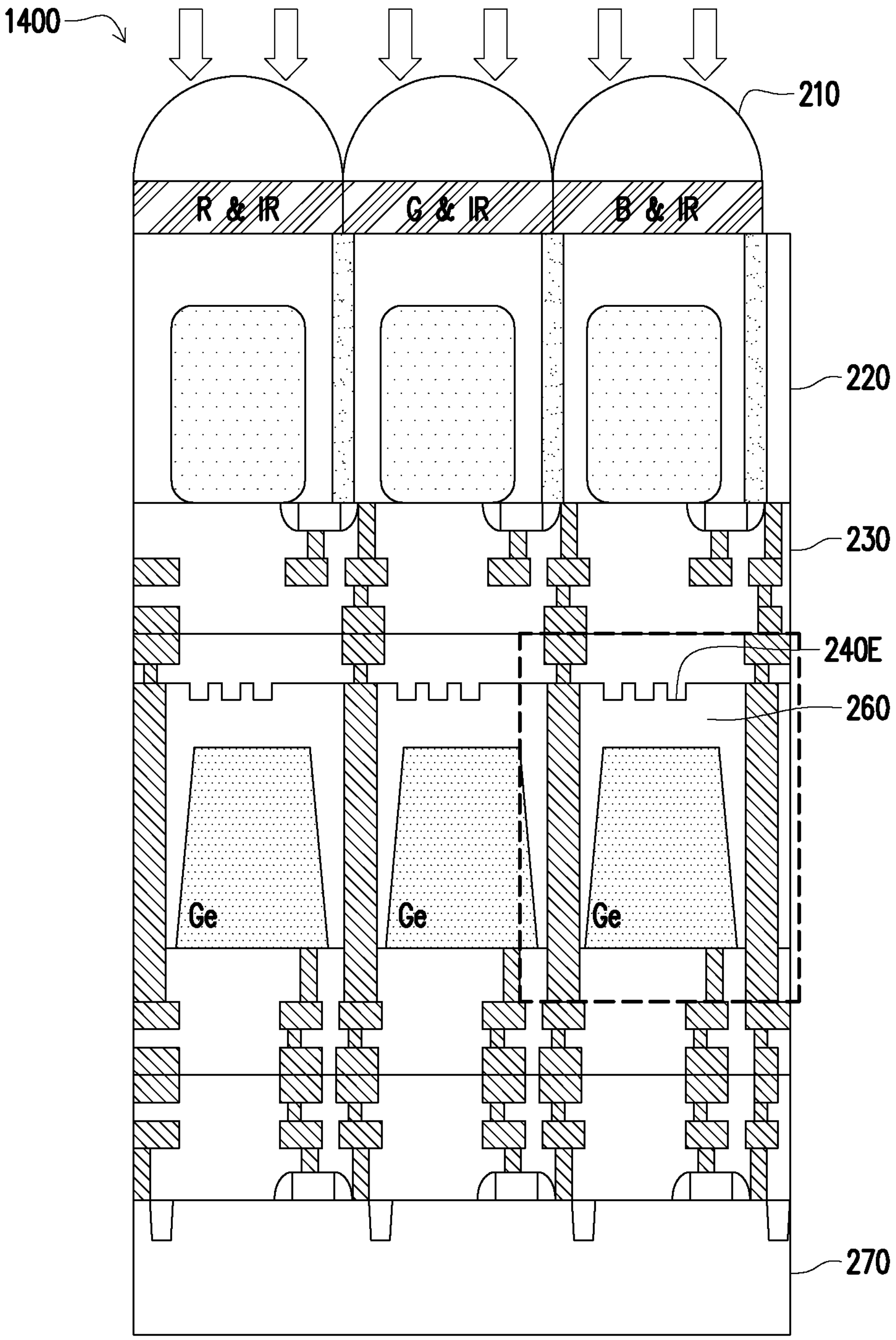
FIGS. 6A-6B illustrate various cross-sectional views of an image sensor device structure, including a face to back multi-CIS wavelength filter/multi-target wavelength detector in accordance with some embodiments, the wavelength filter/multi-target wavelength detector including a metalens structure in a face of a bottom semiconductor.
Figure 6B:
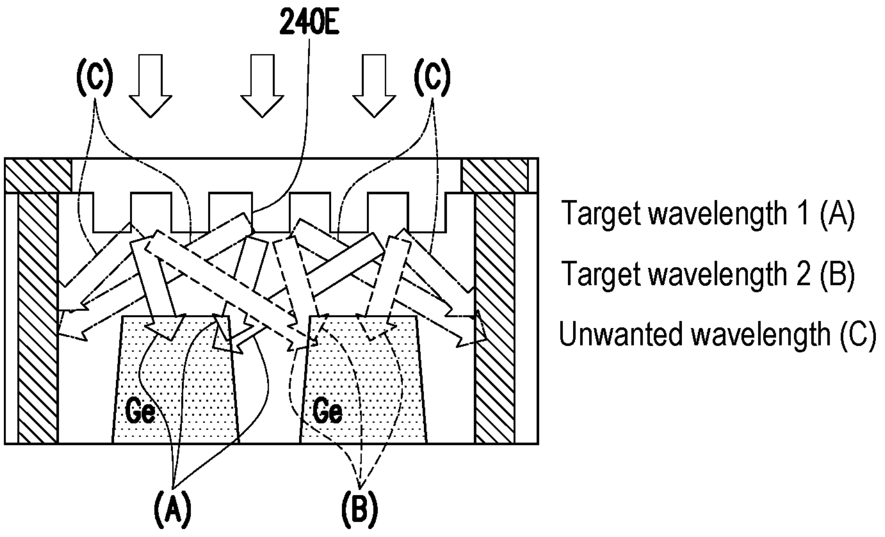

With reference to FIGS. 6A-6B, there are shown various views cross-sectional views of an image sensor device structure 1400 in accordance with some embodiments. Specifically, shown is a face to back multi-CIS wavelength filter/multi-target wavelength detector in accordance with some embodiments, the wavelength filter/multi-target wavelength detector including a metalens structure 240E in a face of a bottom semiconductor 260. Specifically, light of a first target wavelength (A) are directed to the left infrared detector, while light of a second target wavelength (B) are directed to the right infrared detector. The first target wavelengths (A) and the second target wavelength (B) are different infrared wavelength.

As shown, according to this embodiment, a metalens is etched into the bottom semiconductor similar to that described with reference to FIGS. 3D and 4C. However, it is to be understood that other embodiments can include the metalens incorporated into the dielectric regions of the top or bottom semiconductors as previously described.

Figure 7A:
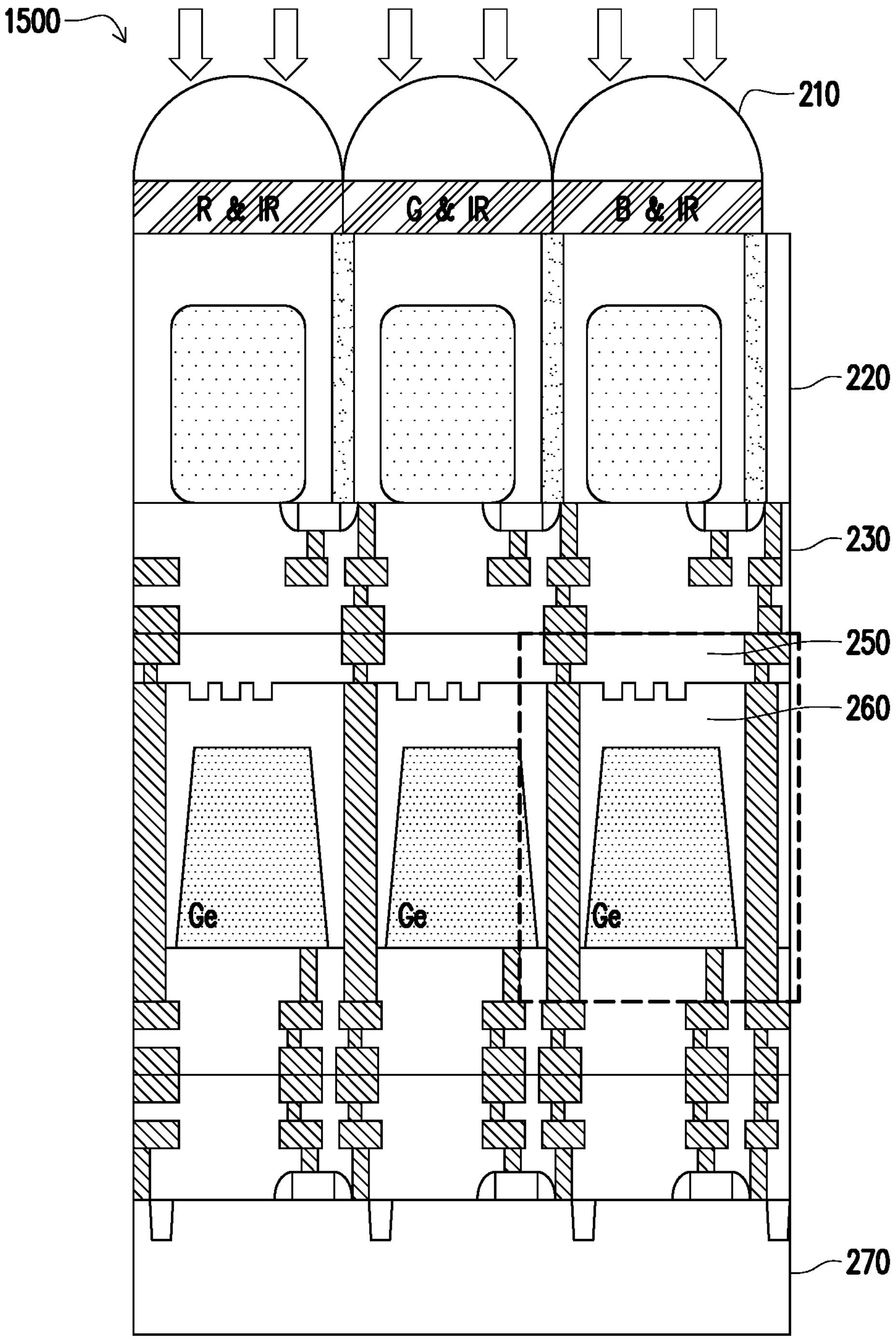
FIGS. 7A-7B illustrate various cross-sectional views of an image sensor device structure, including a face to back multi-CIS multi-wavelength filter/multi-target wavelength detector in accordance with some embodiments, the multi-wavelength filter/multi-target wavelength detector including a metalens structure in a face of a bottom semiconductor.
Figure 7B:
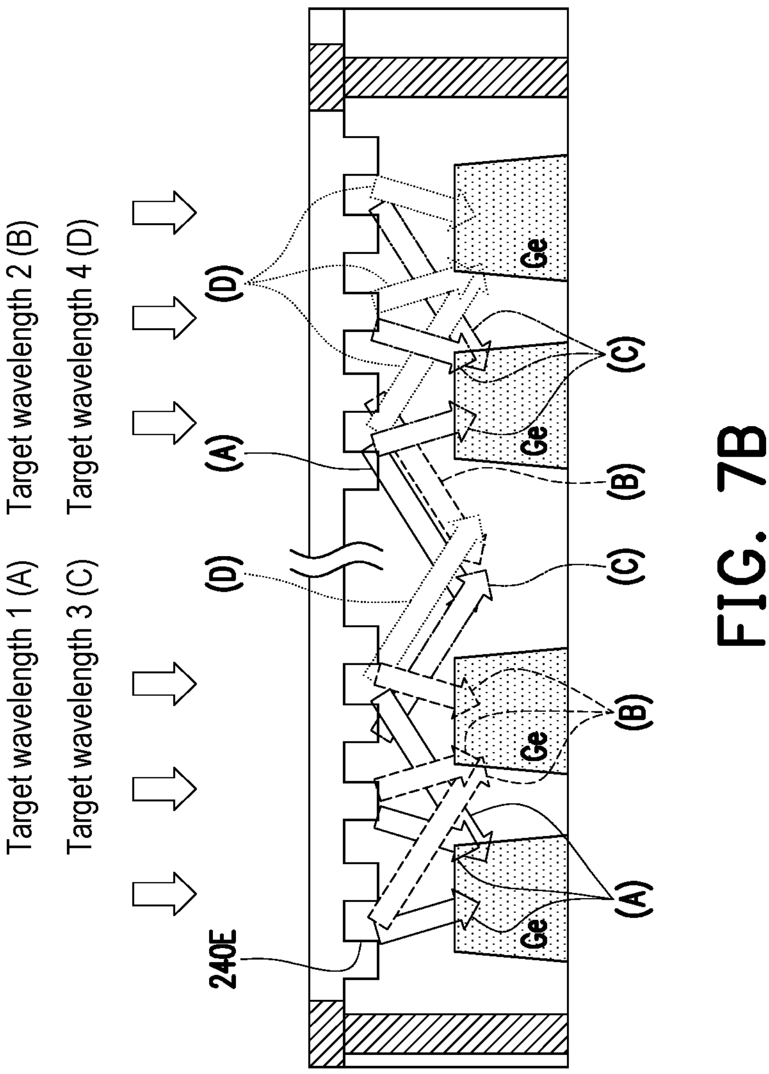

With reference to FIGS. 7A-7B, there are shown various cross-sectional views of an image sensor device structure 1500 in accordance with some embodiments. Specifically, shown is a face to back multi-CIS multi-wavelength filter/multi-target wavelength detector, the multi-wavelength filter/multi-target wavelength detector including a metalens structure in a face of a bottom semiconductor. The approach is similar to that of FIGS. 6A-6B, but includes four infrared detectors, and the metalens is designed to direct infrared light of a first target wavelength (A), a second target wavelength (B), a third target wavelength (C), and a fourth target wavelength (D) to the respective four different infrared detectors.

As shown, according to this embodiment, a metalens is etched into the bottom semiconductor similar to that described with reference to FIGS. 3D and 4C. However, it is to be understood that tother embodiments can include the metalens incorporated into the dielectric regions of the top or bottom semiconductors as previously described.

With reference to FIGS. 8A-8D, 9A-9C and 10, there are shown various fabrication steps of an image sensor device as shown in FIG. 1B (face to face multi-CIS to single-SWIR).

With reference to FIGS. 8A-8D, illustrated are various fabrication steps of the top semiconductor portion including a metalens structure in an IMD of the top semiconductor.

Figure 8A:
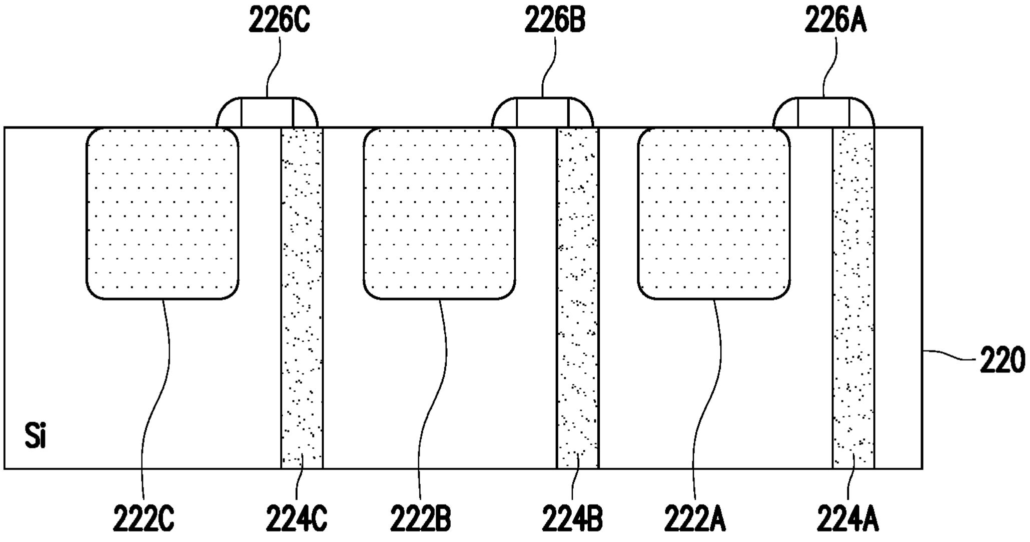
FIGS. 8A-8D illustrate various fabrication steps of an image sensor device as shown in FIG. 1B (face to face multi-CIS to single-SWIR). Specifically.

As shown in FIG. 8A, a semiconductor substrate 220 is provided. The semiconductor substrate 220 may be formed from a semiconductor material of silicon, for example. In some exemplary examples, the semiconductor substrate 220 includes bulk silicon that may be undoped or doped (e.g., p-type, n-type, or a combination thereof). Other materials that are suitable for the formation of the image sensor device may be used. For example, the semiconductor substrate 220 may be formed from a material such as germanium, quartz, sapphire, glass and/or another suitable material. Alternatively, the semiconductor substrate 220 may be formed as an active layer of an SOI substrate.

In addition, as shown in FIG. 8A, the semiconductor substrate 220 includes photosensitive regions 222 for detecting incident light and an isolation region 224 for isolating the photosensitive regions 222 from crosstalk.

Afterwards, as further shown in FIG. 8A, a DTI 224 is formed in the semiconductor substrate 220, in order to prevent incident light from penetrating therethrough. In detail, an etching process is performed on a semiconductor surface of the semiconductor substrate 220 to form a deep trench 224, and then a deposition process is performed to fill an isolation material into the deep trench 224 to form the DTI 224. In the etching process of forming the deep trench 224, a patterned photoresist (not shown) is used as a mask to cover the photosensitive regions 222 of the semiconductor substrate 220, so as to form the deep trench 224 in the semiconductor substrate 220. The etching process of forming the deep trench 224 may be, for example, a reactive ion etching process, a plasma etching process, a dry etching process, a wet etching process, and/or another suitable etching process. After the etching process of forming the deep trench 224, the patterned photoresist (not shown) is stripped.

Subsequently, an isolation material is filled in the deep trench 224, so as to form the DTI 224 in the semiconductor substrate 220. The isolation material used to form the DTI 224 may be, for example, hafnium oxide, tantalum oxide, zirconium oxide, titanium oxide, aluminum oxide, high-k dielectrics, combinations thereof, and/or another suitable material. In some embodiments, the isolation material is filled on by utilizing a process, such as a high density plasma chemical vapor deposition (HDPCVD) process, a chemical vapor deposition (CVD) process, a subatmospheric CVD (SACVD) process, a spin-on coating process, a sputtering process, and/or another suitable process, combinations thereof, and/or another suitable process. In some embodiments, a chemical-mechanical polishing (CMP) process may be performed to planarize the top surface of the DTI 224. The top surface of the DTI 224 may be over the semiconductor substrate 220 or be coplanar with the back surface 220B of the semiconductor substrate 220.

In some embodiments, the DTI 224 is formed including multiple layers, including one or more layers of a high-k dielectric material, such as hafnium oxide, tantalum oxide, zirconium oxide, titanium oxide, aluminum oxide, combinations thereof, and/or the like. Other layers may include, for example, silicon oxide, silicon nitride, silicon oxynitride, silicon carbide, combinations thereof, and/or the like.

Figure 8B:
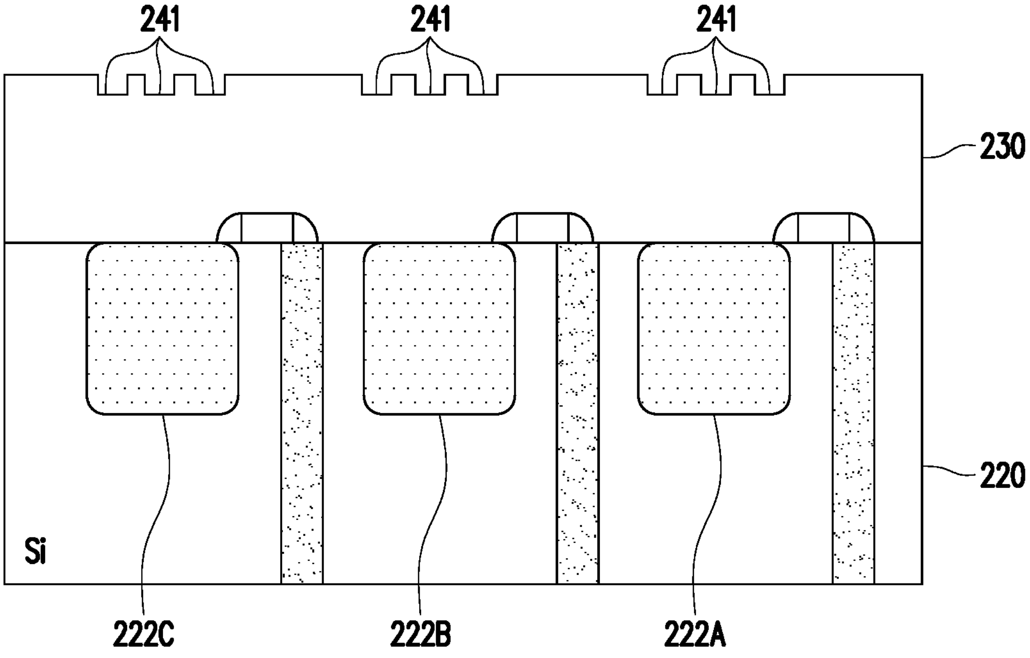

Then, as shown in FIG. 8B, a dielectric region is formed over the front surface 220F of the semiconductor substrate 220. The dielectric layer 230 may be formed including various transistors electrically connected with the photosensing members 222 to collect electrons generated by incident light and/or incident radiation (e.g. visible light and/or infrared radiation) For example, the transistors in the dielectric layer 230 may include a combination of transfer transistors, reset transistors, source follower transistors, row select transistors, and/or other suitable transistors. For the sake of simplicity, detailed structures of the transistors and the other components in the dielectric layer 230 are not shown.

The dielectric layer 230 may be formed also including an ILD layer (not shown) and an IMD layer (not shown) over the ILD layer (not shown), in accordance with some embodiments. The ILD layer (not shown) may be formed from PSG, BSG, BPSG, TEOS oxide, or the like. In addition, contact plugs may be formed in the ILD layer (not shown) for electrically connecting the transistors in the dielectric region 230. The IMD layer (not shown) may include vias and conductive lines; each of the vias may be electrically connected between the conductive lines, and the conductive lines may be electrically connected to the transistors in the dielectric layer 230 to transfer the voltage signals.

As previously described with reference to FIG. 1B, the metalens 241 is formed to focus incident light focus impinging on the back surface of the photosensitive semiconductor 220 onto the infrared light photosensor semiconductor 260. Specifically, the metalens focuses infrared light received that passes through each photosensitive region 222A, 222B and 222C to the infrared light photosensing region 262. According to an embodiment, the metalens optical meta-elements are etched into the dielectric region 230.

Figure 8C:
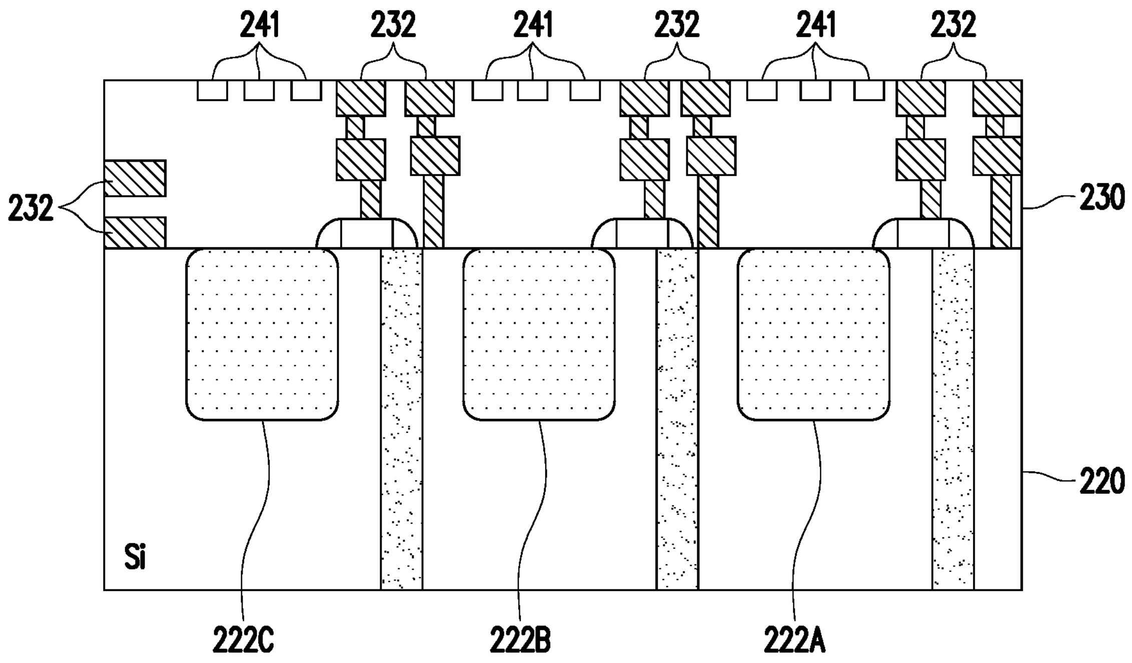

Optionally, as shown in FIG. 8C, the formation of the dielectric region 230 can comprise back end-of-line (BEOL) processing in which metallization layer(s) 232 are formed alternating with layers of the dielectric material 230 to form a metallization stack over the front surface 220B the semiconductor substrate 220.

The dielectric region 230 may be formed from silicon oxide, silicon nitride, silicon oxynitride, high-k dielectric, SOG, and/or another suitable dielectric material. The dielectric layer 230 may be formed by a deposition process such as a physical vapor deposition (PVD) process, a CVD process, a low pressure CVD (LPCVD) process, a plasma-enhanced CVD (PECVD) process, an HDPCVD process, a spin-on coating process, a sputtering process, and/or another suitable process.

Figure 8D:
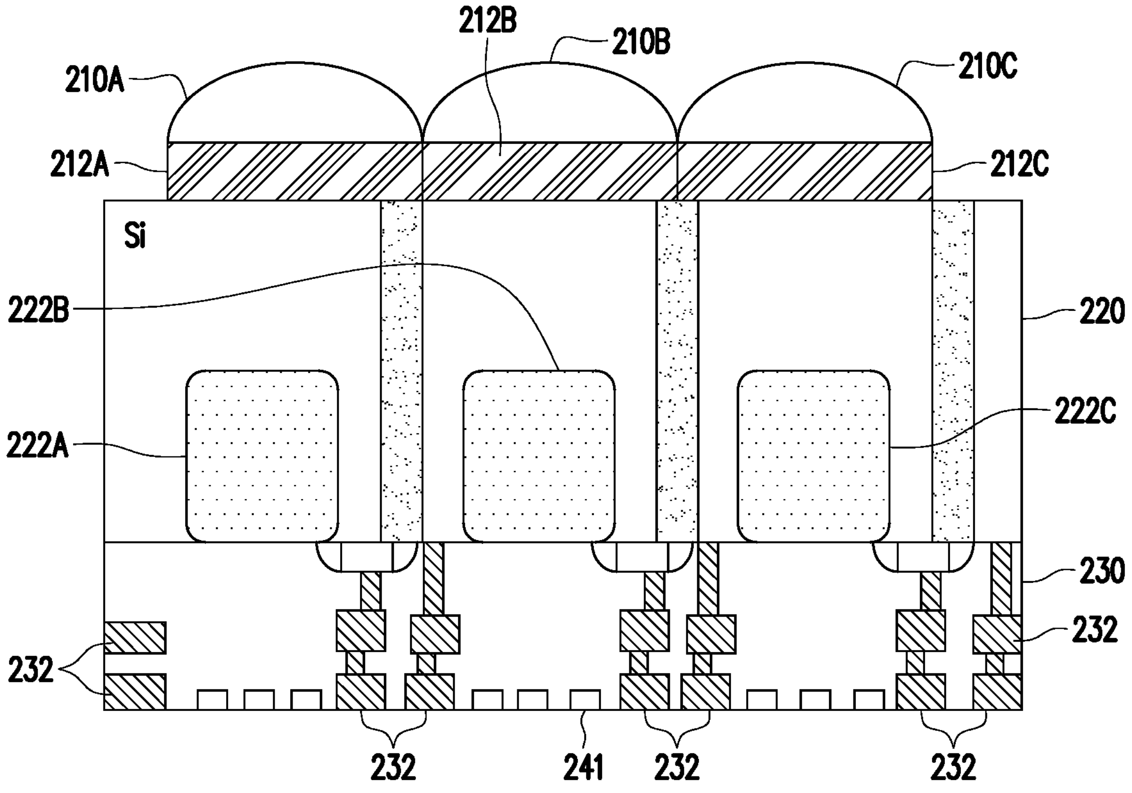

Thereafter, as shown FIG. 8D, a color filter layer 212 is formed over the back surface of the semiconductor 220, and then a microlens layer 210 is formed over the color filter layer 212. The color filter layer 212 is formed for allowing light components in a particular wavelength band to penetrate therethrough and blocking unwanted light components. The passing wavelength band of the color filter layer 212 may be a red light wavelength band, a green light wavelength band a blue light wavelength band, or combinations thereof, but is not limited thereto. Infrared light may pass through the color filter layer 212 and travel to the infrared light photosensor semiconductor substrate 260. The color filter layer 212 may be formed form a material, such as pigment-based polymer, dye-based polymer, resin and another suitable material, and may be formed by a coating process or another suitable process. The microlens layer 210 is formed having a convex shape at its light receiving for improving light receiving efficiency. The microlens layer 210 may be formed from glass, acrylic polymer, or another suitable material with high transmittance, and may be formed by a spin-on process, a CVD process, a PVD process, and/or another suitable process.

Figure 9A:
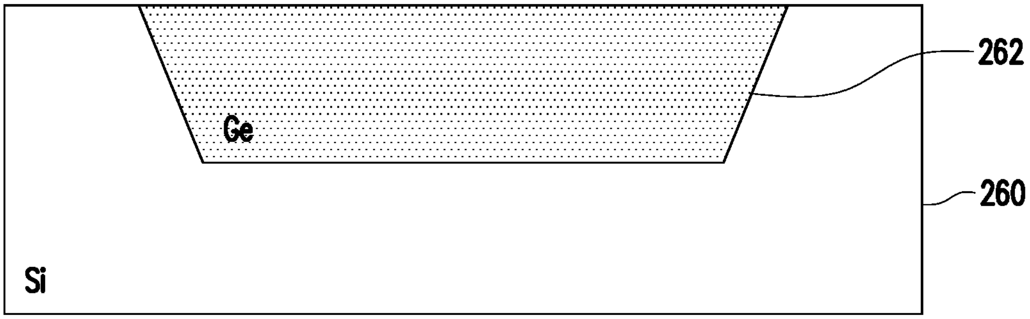
FIGS. 9A-9C illustrate various fabrication steps of an image sensor device as shown in FIG. 1B (face to face multi-CIS to single-SWIR). Specifically.
Figure 9B:
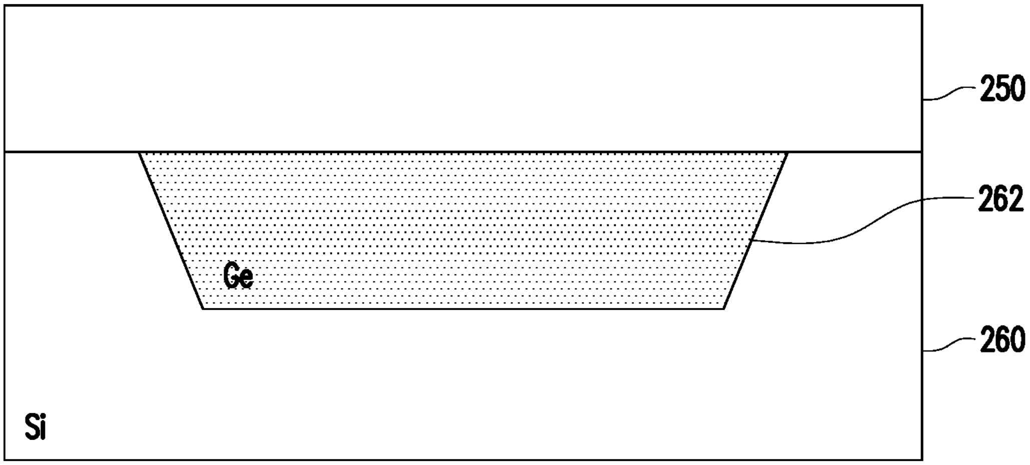
Figure 9C:
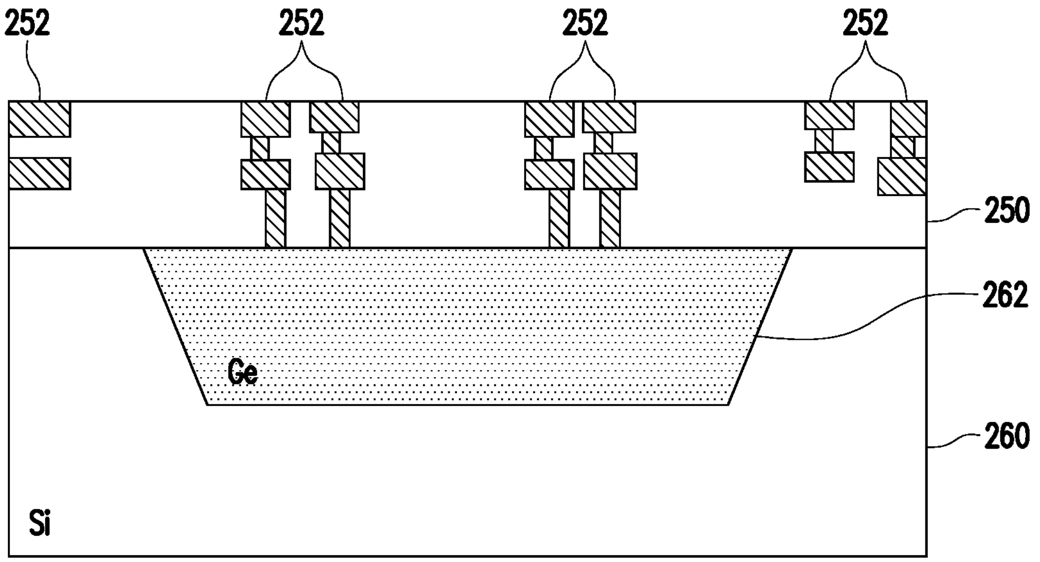

With reference to FIGS. 9A-9C, illustrated are various fabrication steps of the bottom semiconductor portion.

According to this embodiment, the semiconductor substrate 260 is formed from silicon and the infrared light photosensing region 262 is formed from germanium. Next, as shown in FIG. 9B, a dielectric region 250 is formed on the front surface of the semiconductor substrate 260.

FIG. 9A shows the fabrication step(s) of forming the germanium infrared light photosensing region 262 on the face of semiconductor 260.

FIG. 9B shows the fabrication step(s) of forming the dielectric region 250 on the face of semiconductor 260.

FIG. 9C shows a variant embodiment in which the dielectric region 250 includes one or more patterned metallization layers 252 formed as part of BEOL processing.

Figure 10:
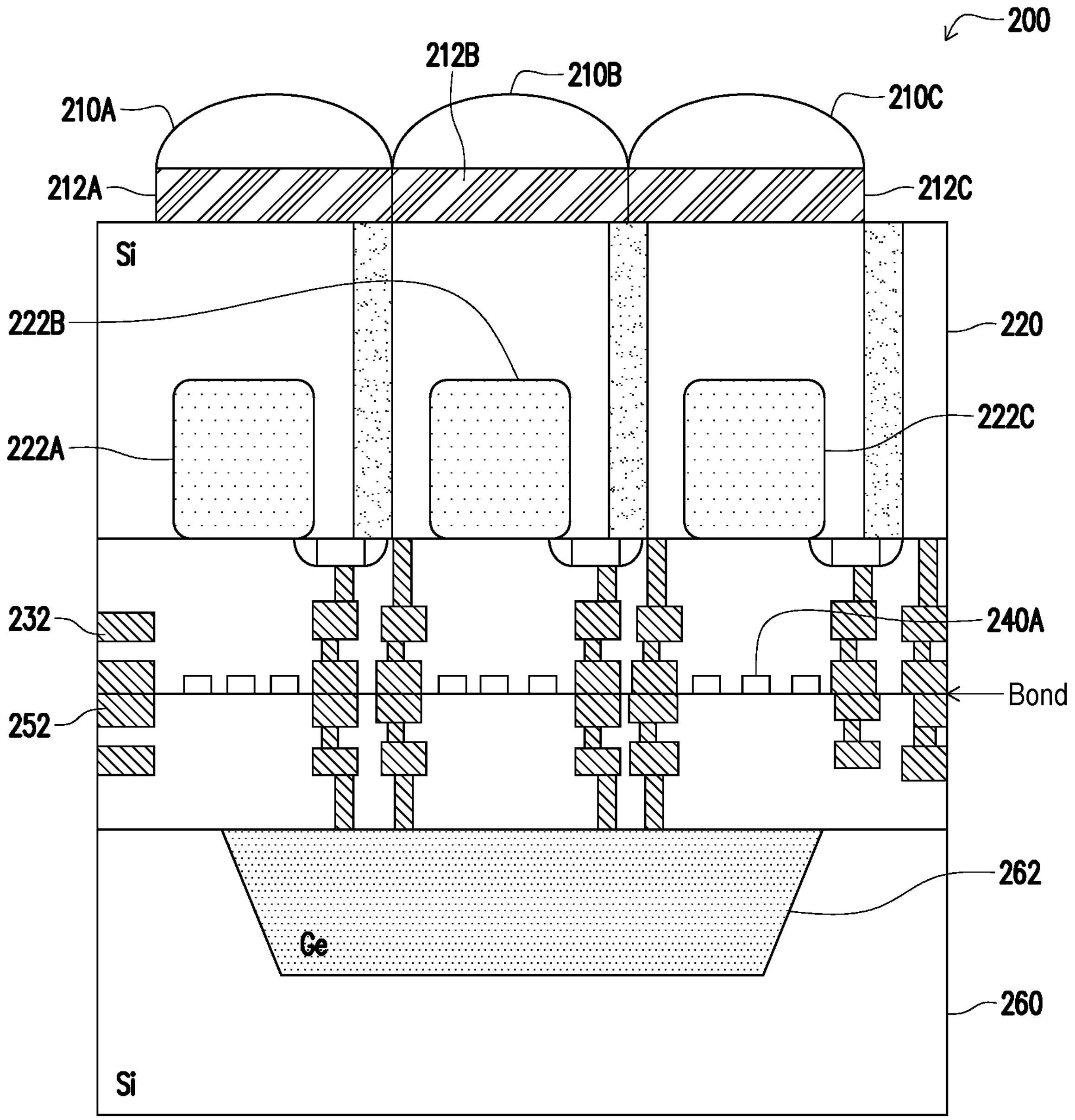
FIG. 10 illustrates a fabrication step of an image sensor device as shown in FIG. 1B (face to face multi-CIS to single-SWIR). Specifically.

With reference to FIG. 10, illustrated is the fabrication step of the top semiconductor portion, including a metalens structure in an IMD of the top semiconductor, bonded with the bottom semiconductor portion. According to one embodiment, the bonding process includes bonding by a hybrid (Cu—Cu & Ox-Ox) bond process.

As shown in FIG. 10, the photosensing semiconductor 220 dielectric region 230 is bonded to the infrared light photosensor semiconductor 260 dielectric region 250 by a bonding process, in accordance with some embodiments. In some embodiments, the bonding process may include a molecular force bonding process, such as a direct bonding process and an optical fusion bonding process. In another embodiment, the bonding process may include another suitable bonding process known in the art.

With reference to FIGS. 11A-11D, 12A-12C and 13 there are shown various fabrication steps of an image sensor device as shown in FIG. 1C (face to face multi-CIS to single-SWIR).

With reference to FIGS. 11A-11D, illustrated are various fabrication steps of the top semiconductor portion.

Figure 11A:
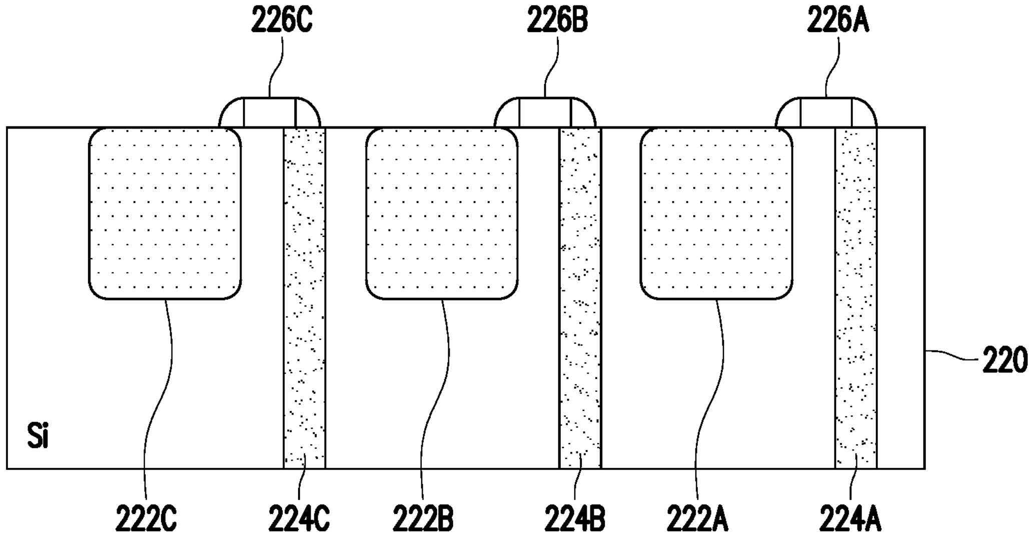
FIGS. 11A-11D illustrate various fabrication steps of an image sensor device as shown in FIG. 1C (face to face multi-CIS to single-SWIR). Specifically.

Similar to FIG. 8A, FIG. 11A shows the fabrication step(s) of forming the photosensitive regions, deep trenches, and transistors in the top semiconductor.

Figure 11B:
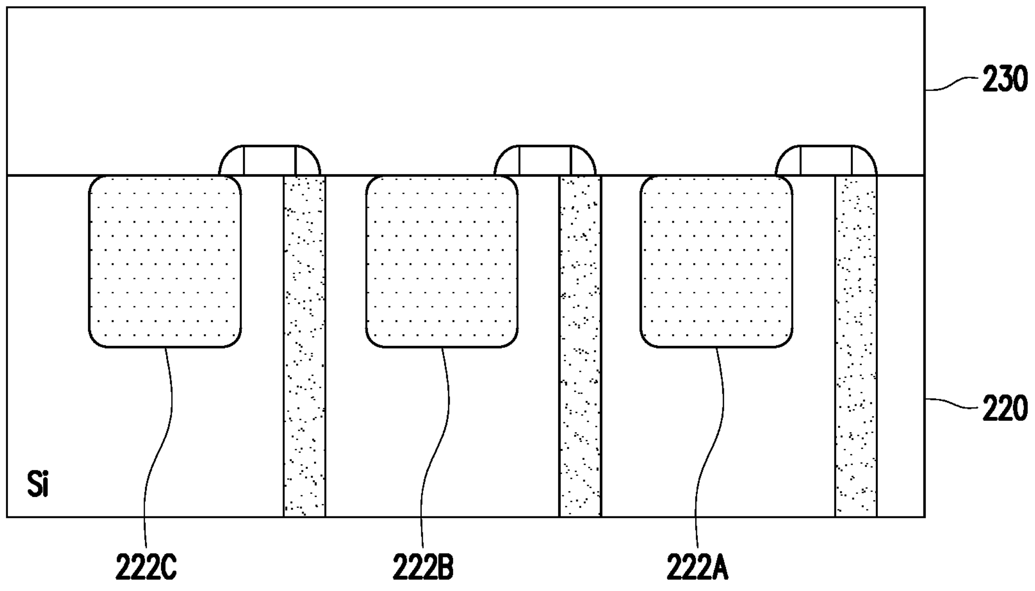

Similar to FIG. 8B, FIG. 11B shows the fabrication step(s) of forming dielectric region 230 on the back of semiconductor 220.

Figure 11C:
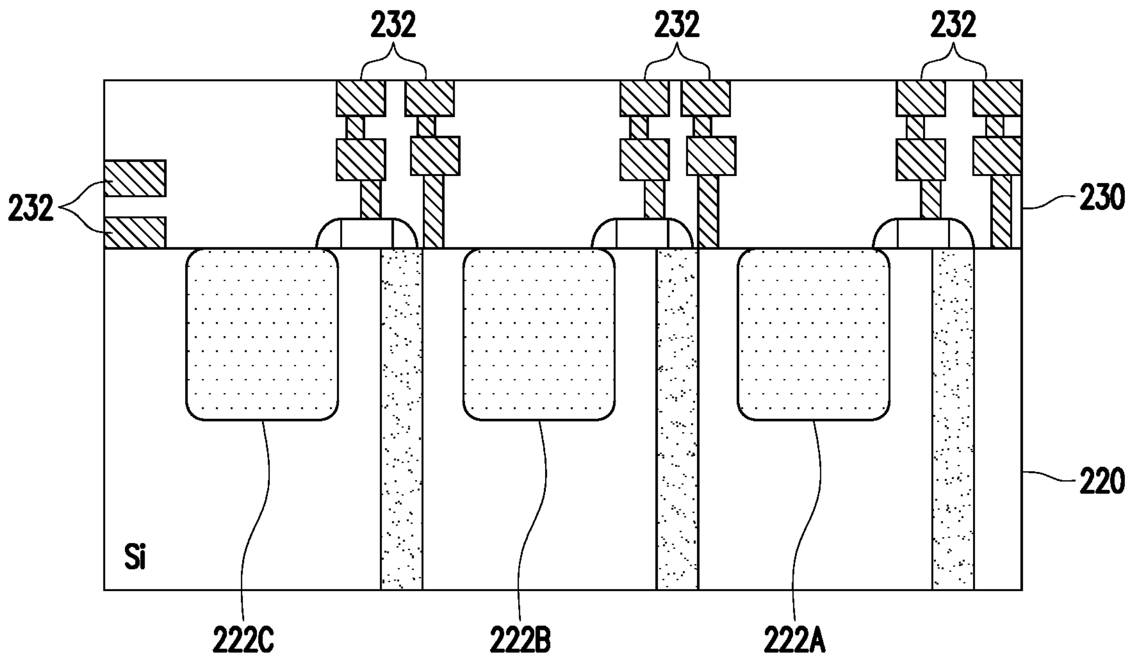

Similar to FIG. 8C, FIG. 11C shows the alternative process in which BEOL processing is performed to include patterned metallization layers 232 in the dielectric layer on semiconductor 220.

Figure 11D:
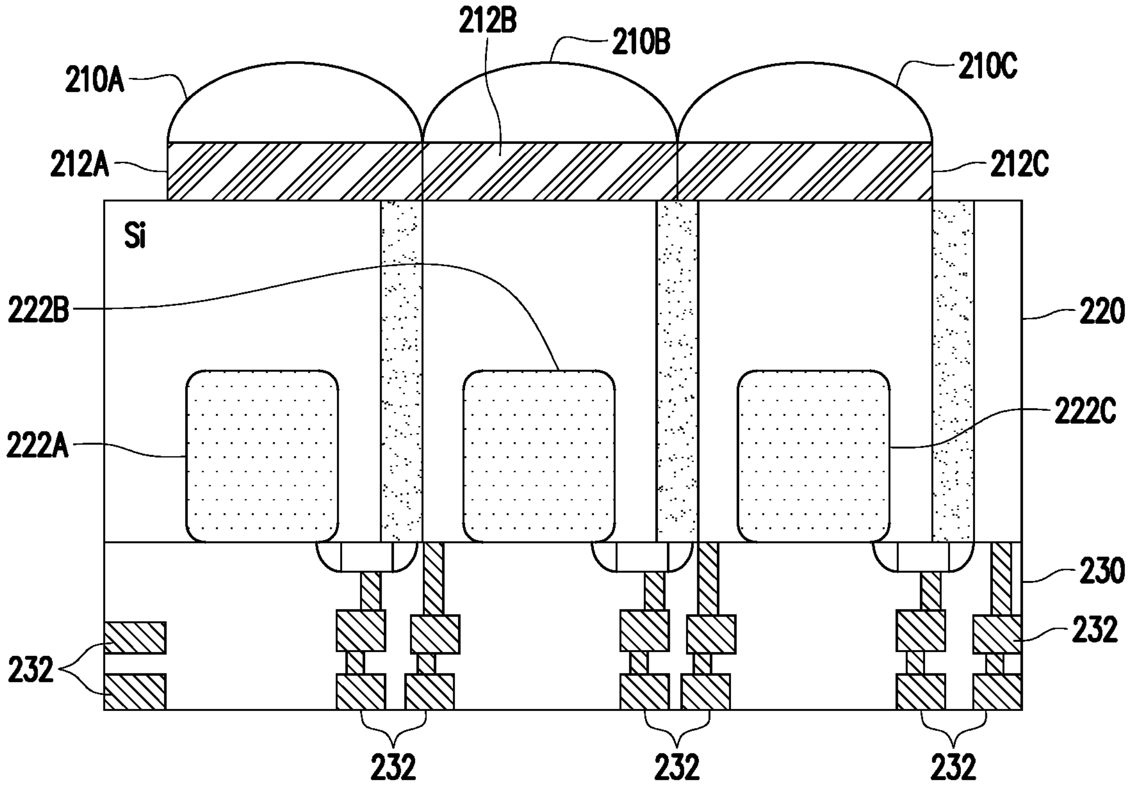

Similar to FIG. 8D, FIG. 11D shows the fabrication step(s) of forming the microlenses 210 and color filters 212 on semiconductor 220.

Figure 12A:
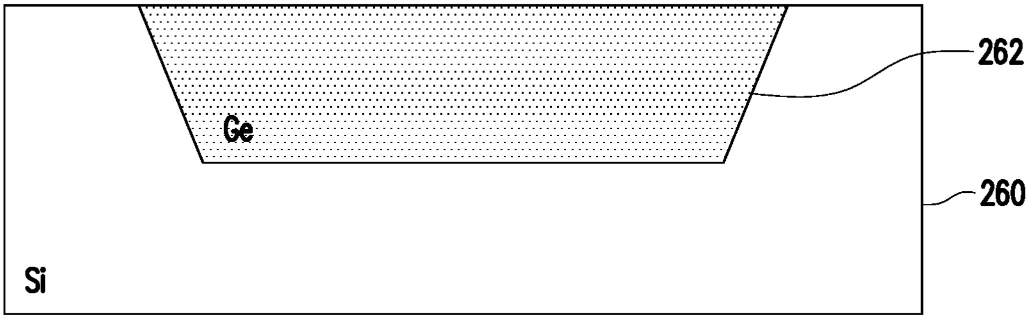
FIGS. 12A-12C illustrate various fabrication steps of an image sensor device as shown in FIG. 1C (face to face multi-CIS to single-SWIR). Specifically.
Figure 12B:
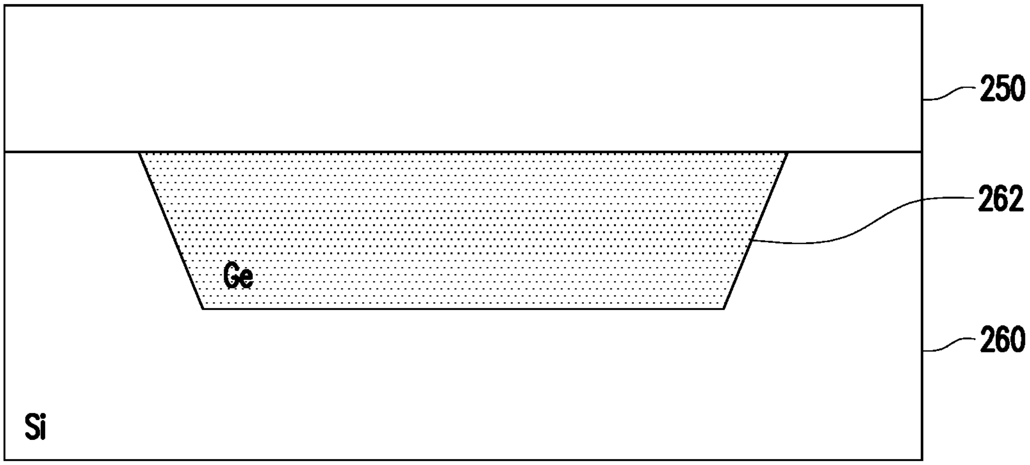
Figure 12C:
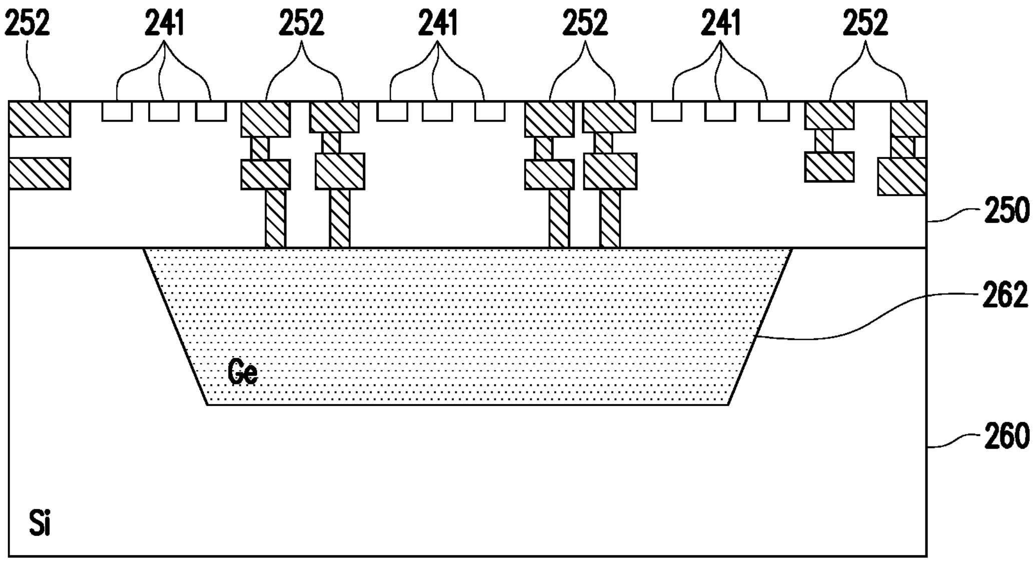

With reference to FIGS. 12A-12C, illustrated are various fabrication steps of the bottom semiconductor portion including a metalens structure in an IMD of the bottom semiconductor.

Similar to FIG. 9A, FIG. 12A shows the fabrication step(s) of forming the germanium infrared light photosensing region 262 on the face of semiconductor 260.

Similar to FIG. 9B, FIG. 12B shows the fabrication step(s) of forming the dielectric region 250 on the face of semiconductor 260.

Similar to FIG. 9C, FIG. 12C shows the alternative approach of performing BEOL processing to form the patterned metallization layers 252, except here the metalens is etched into dielectric region 250.

Figure 13:
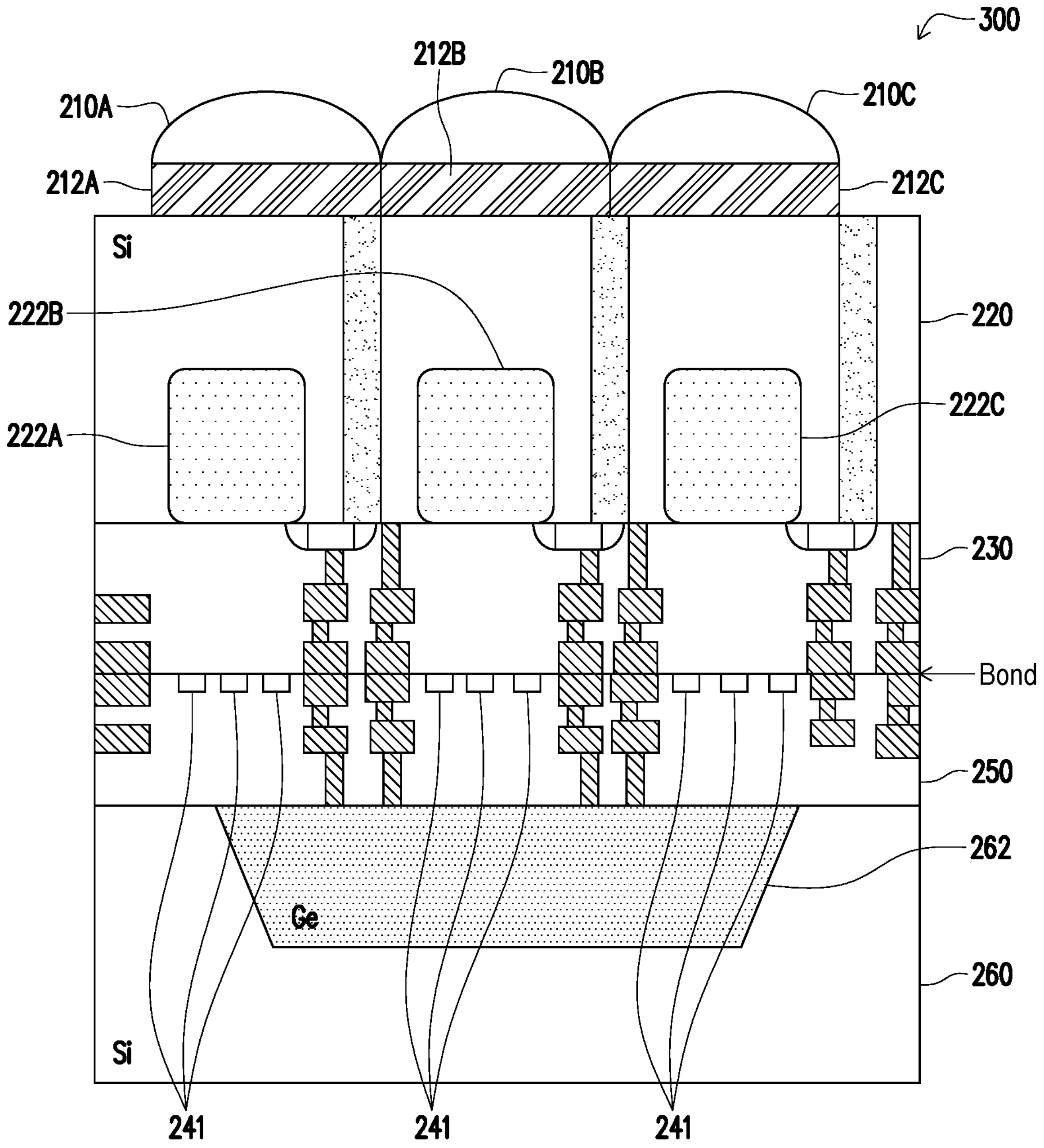
FIG. 13 illustrate various fabrication steps of an image sensor device as shown in FIG. 1C (face to face multi-CIS to single-SWIR). Specifically.
Figure 14A:
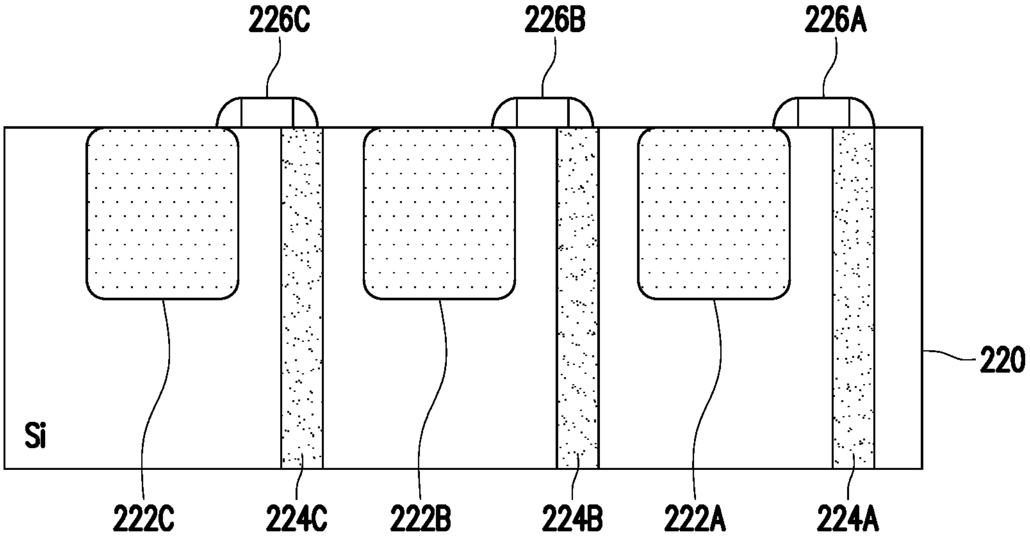
FIGS. 14A-14D illustrate various fabrication steps of an image sensor device as shown in FIG. 2A (face to face single-CIS to single-SWIR). Specifically.
Figure 14B:
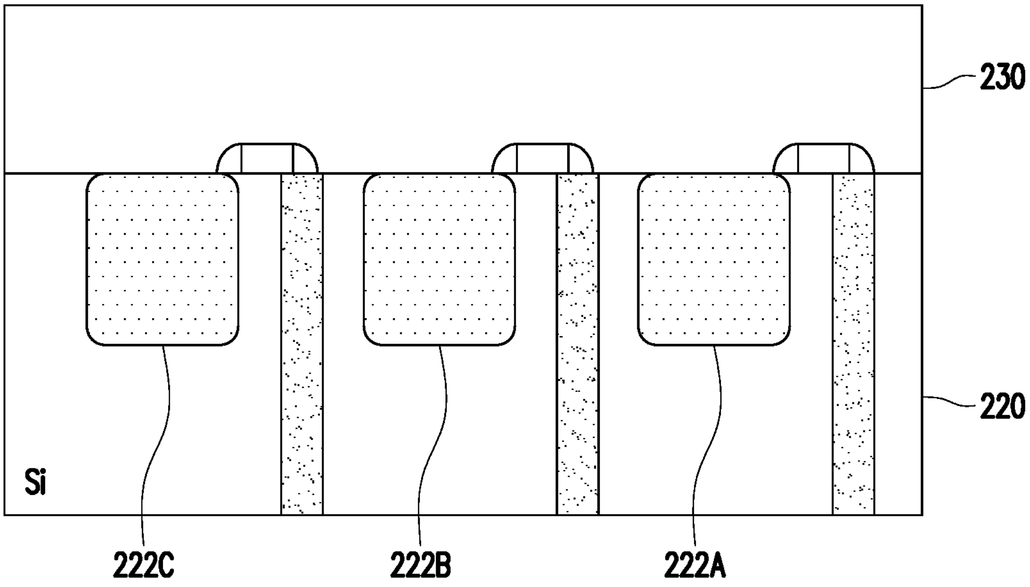
Figure 14C:
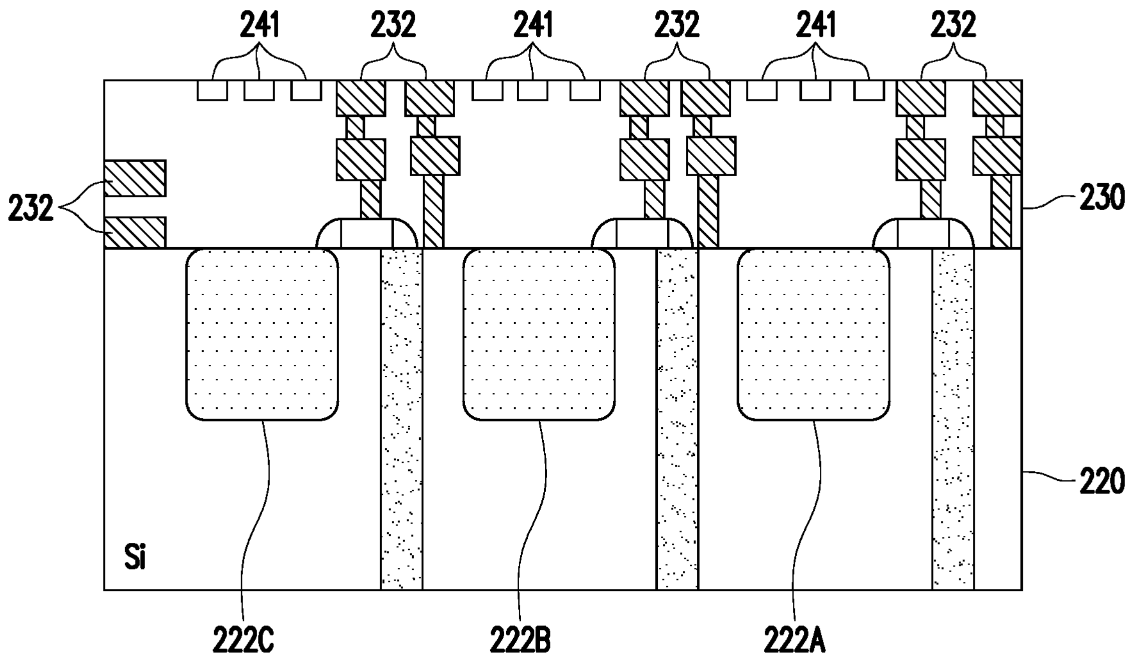
Figure 14D:
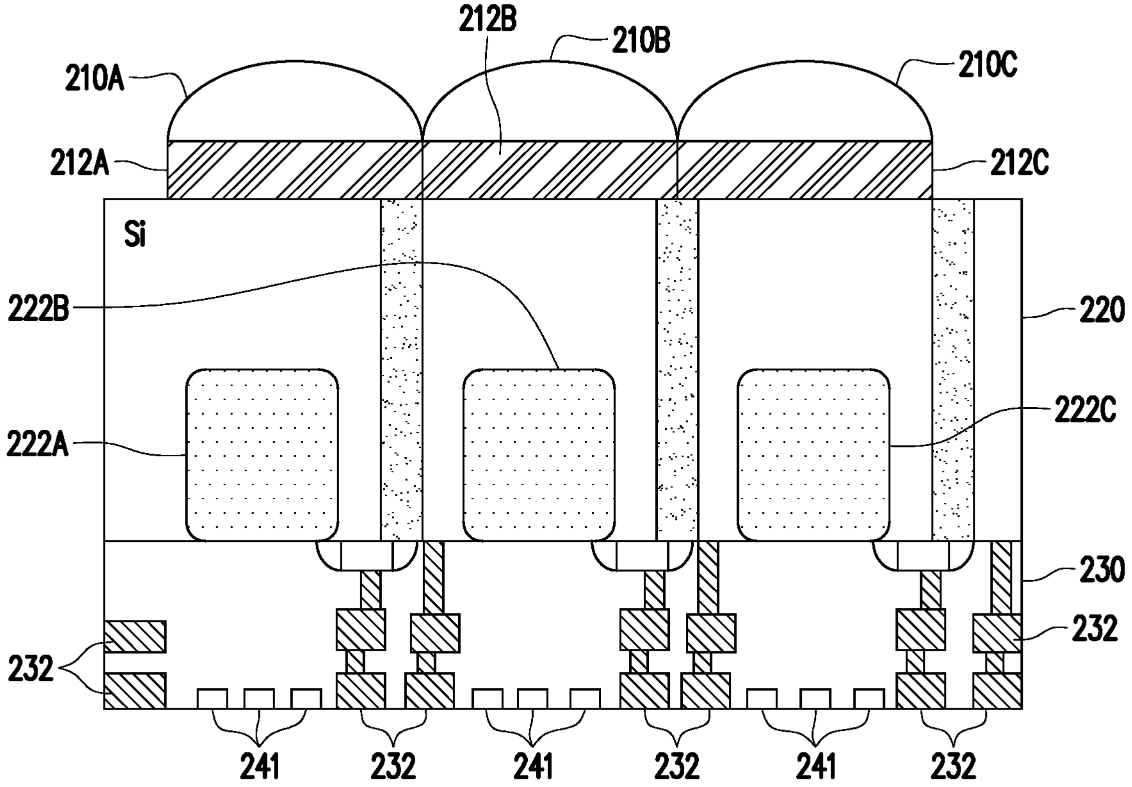

Similar to FIG. 10, with reference to FIG. 13, illustrated is the fabrication step of the top semiconductor portion bonded with the bottom semiconductor portion, including a metalens structure in an IMD of the bottom semiconductor.

As will be apparent to one of skill in the art, the prosses described above are applicable to the fabrication steps illustrated in the Figures below. The details of the processes are not repeated here or below.

With reference to FIGS. 14A-14D, 15A-15C and 16, there are shown various fabrication steps of an image sensor device as shown in FIG. 2A (face to face single-CIS to single-SWIR).

Figure 15A:
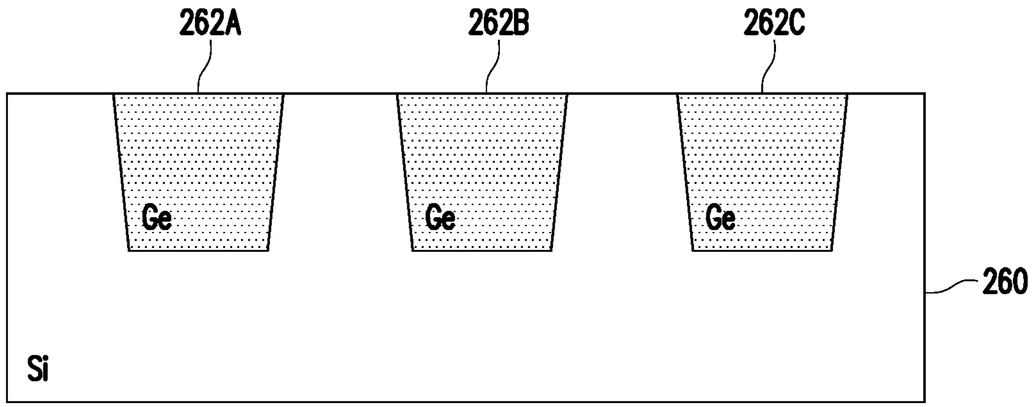
FIGS. 15A-15C illustrate various fabrication steps of an image sensor device as shown in FIG. 2A. (face to face single-CIS to single-SWIR) Specifically.
Figure 15B:
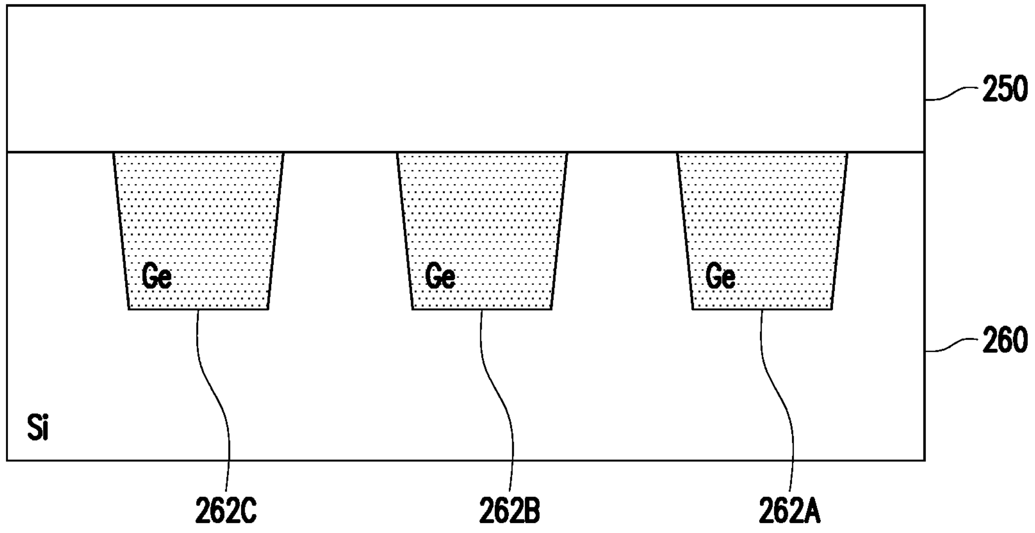
Figure 15C:
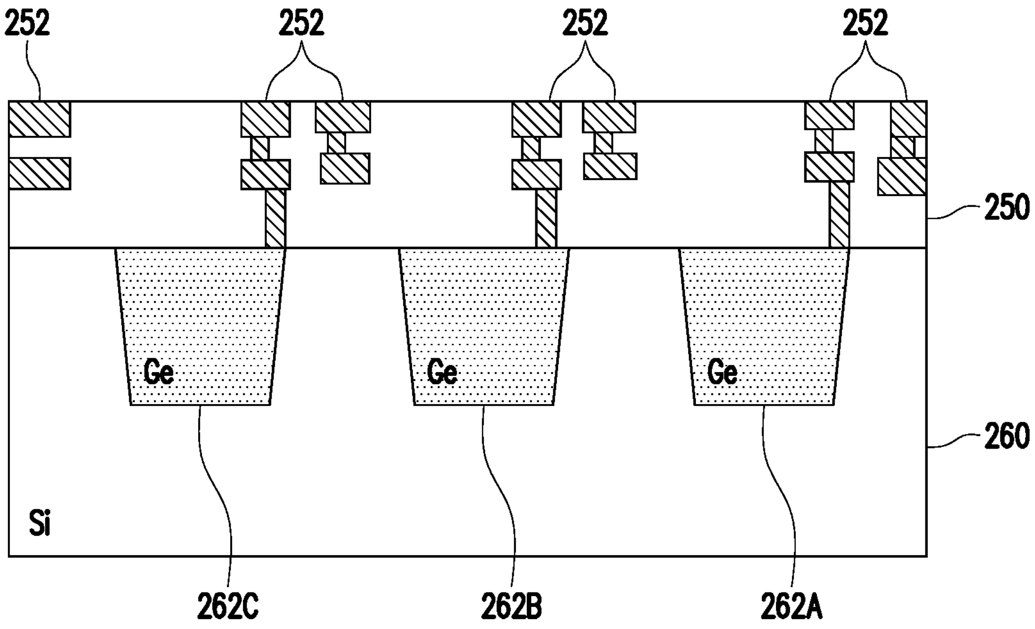

With reference to FIGS. 15A-15C, illustrated are various fabrication steps of the bottom semiconductor portion.

Figure 16:
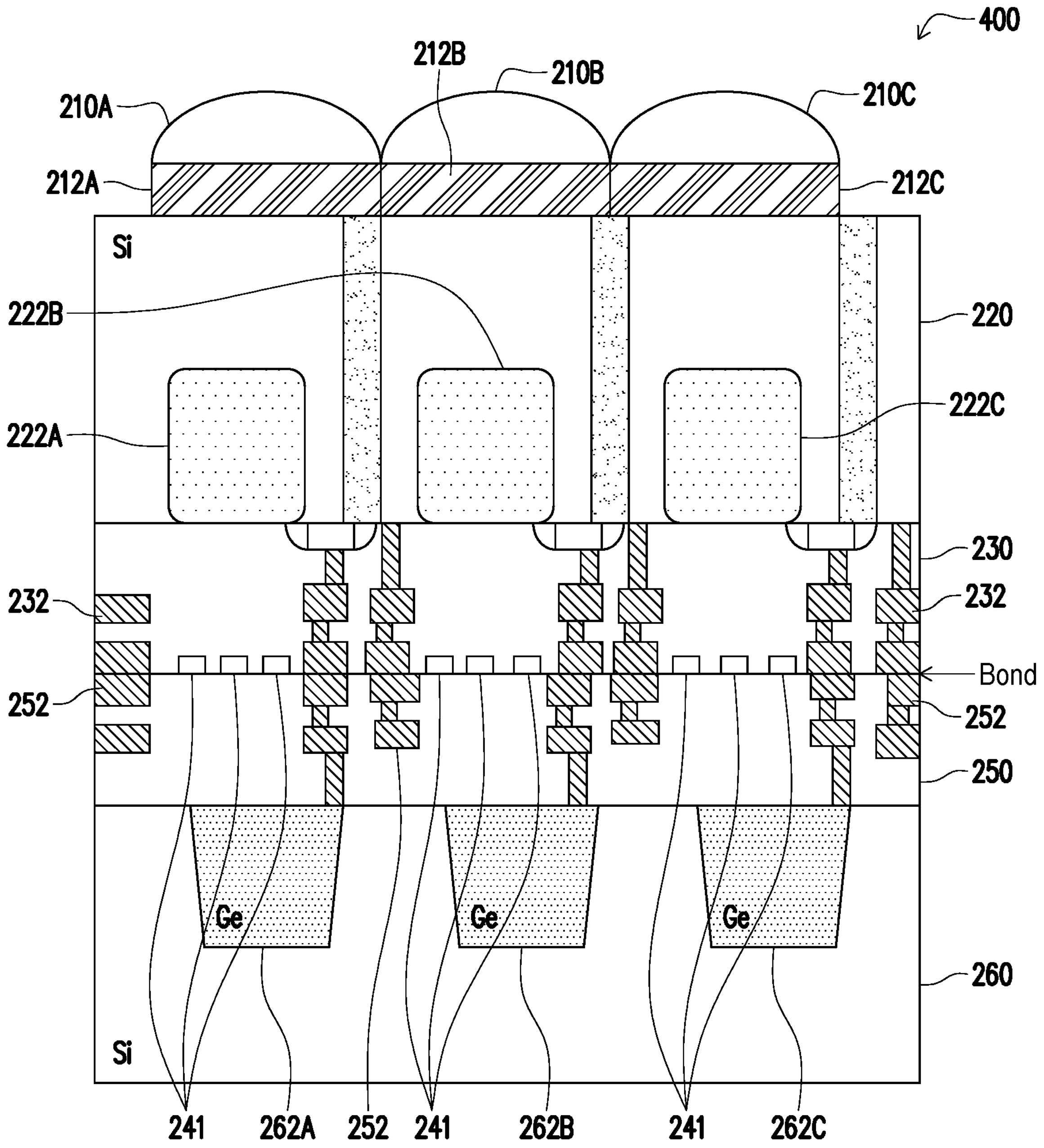
FIG. 16 illustrates a fabrication step of an image sensor device as shown in FIG. 2A (face to face single-CIS to single-SWIR). Specifically.
Figure 17A:
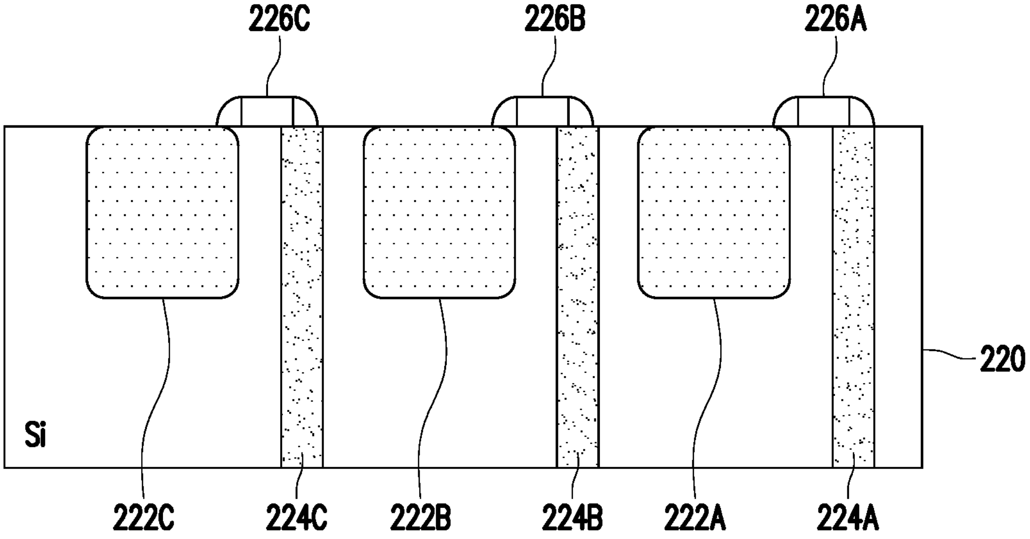
FIGS. 17A-17D illustrate various fabrication steps of an image sensor device as shown in FIG. 2B (face to face single-CIS to single-SWIR). Specifically.
Figure 17B:
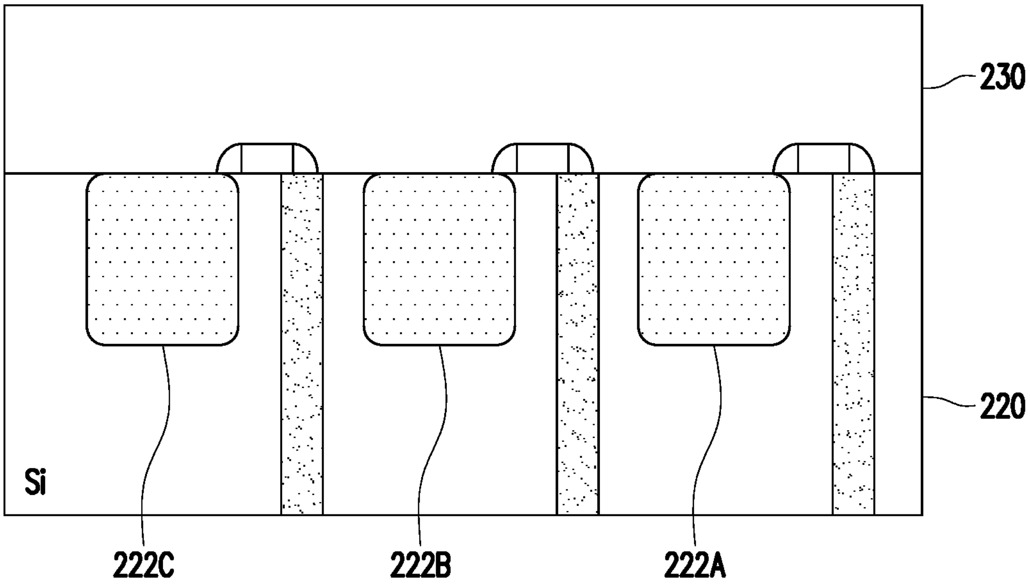
Figure 17C:
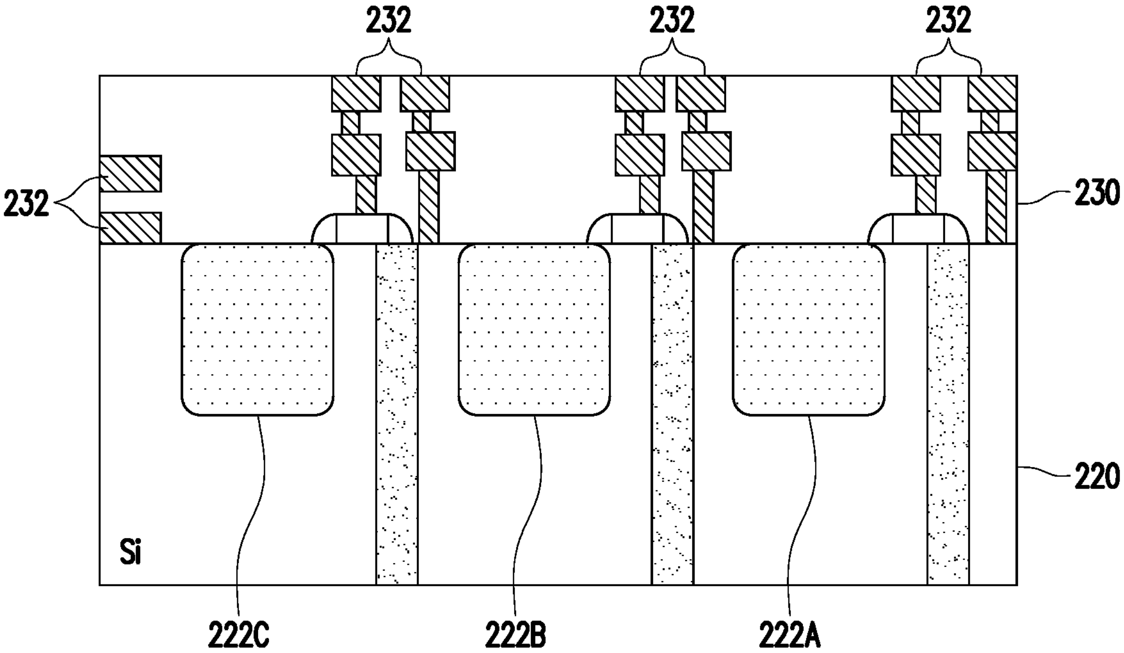
Figure 17D:
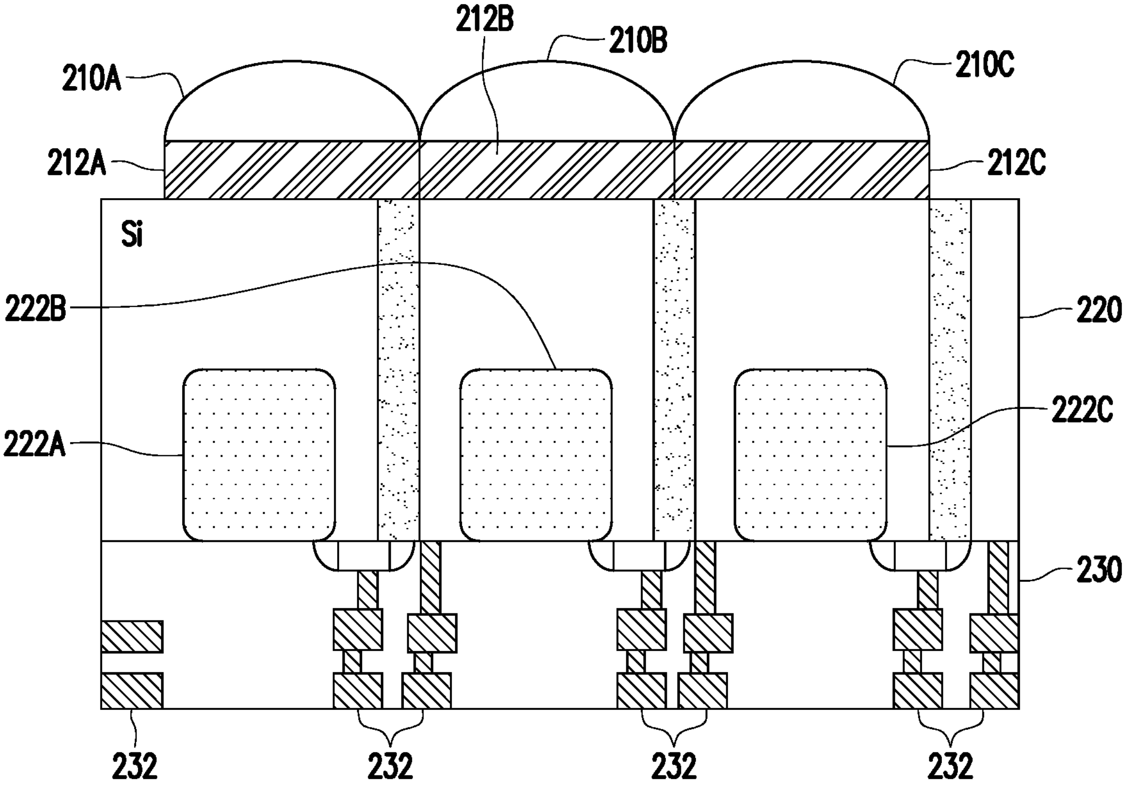

With reference to FIG. 16, illustrated is the fabrication step of the top semiconductor portion, including a metalens structure in an IMD of the top semiconductor, bonded with the bottom semiconductor portion.

With reference to FIGS. 17A-17D, 18A-18C and 19, there are shown various fabrication steps of an image sensor device as shown in FIG. 2B (face to face single-CIS to single-SWIR).

With reference to FIGS. 17A-17D, illustrated are various fabrication steps of the top semiconductor portion.

Figure 18A:
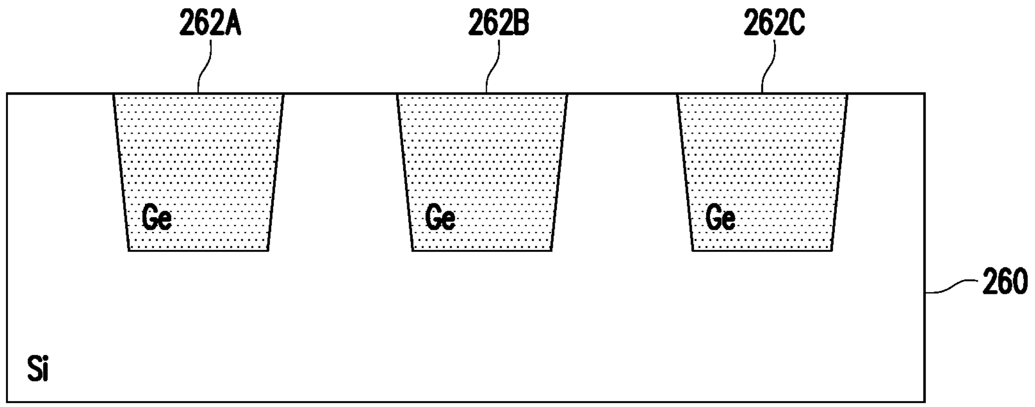
FIGS. 18A-18C illustrate various fabrication steps of an image sensor device as shown in FIG. 2B (face to face single-CIS to single-SWIR). Specifically.
Figure 18B:
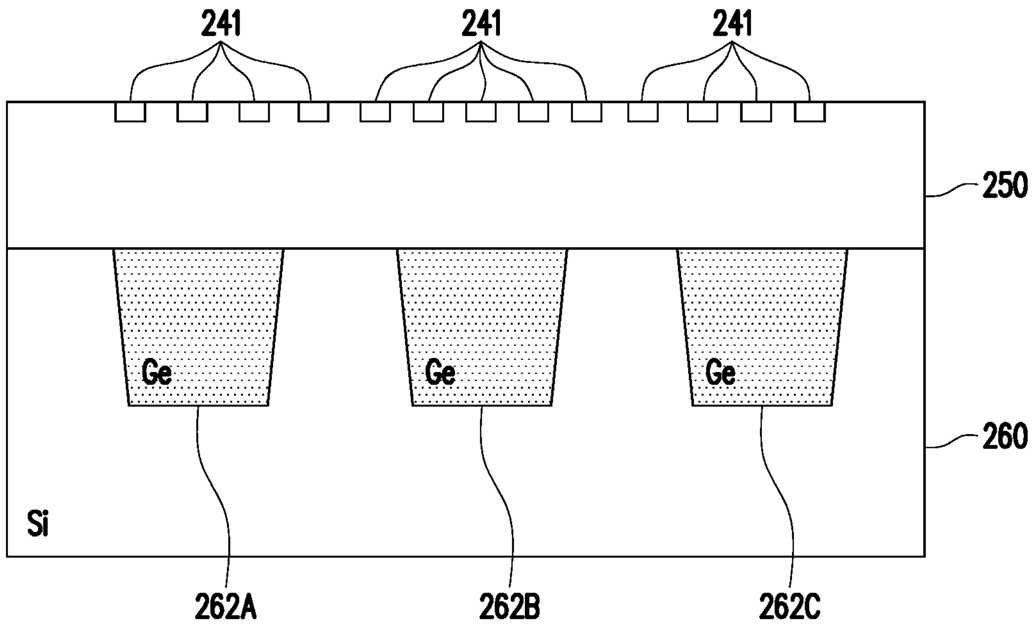
Figure 18C:
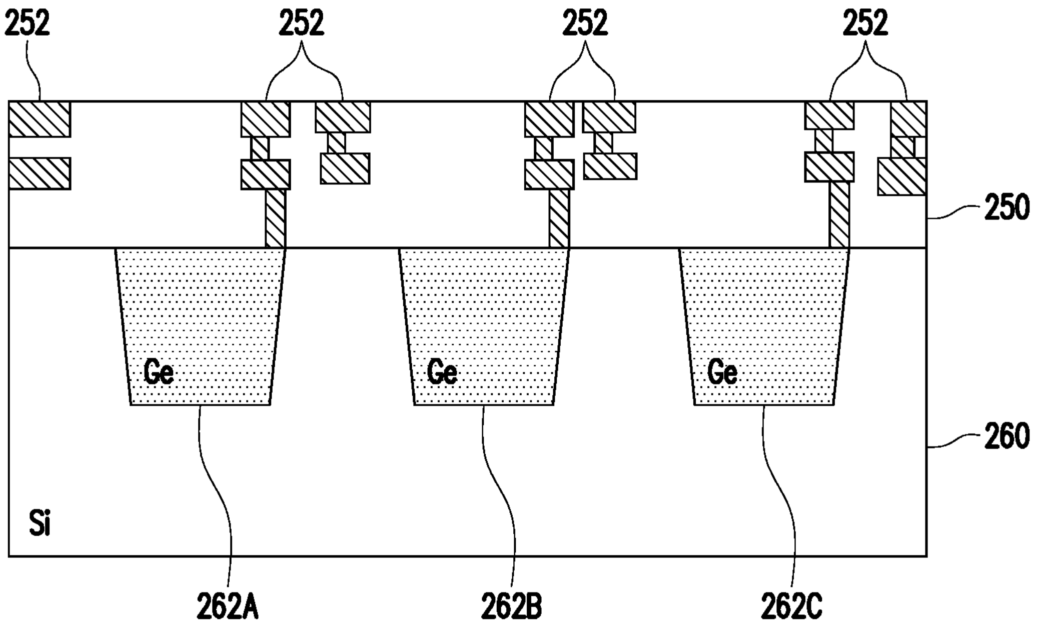

With reference to FIGS. 18A-18C, illustrated are various fabrication steps of the bottom semiconductor portion, including a metalens structure in an IMD of the bottom semiconductor.

Figure 19:
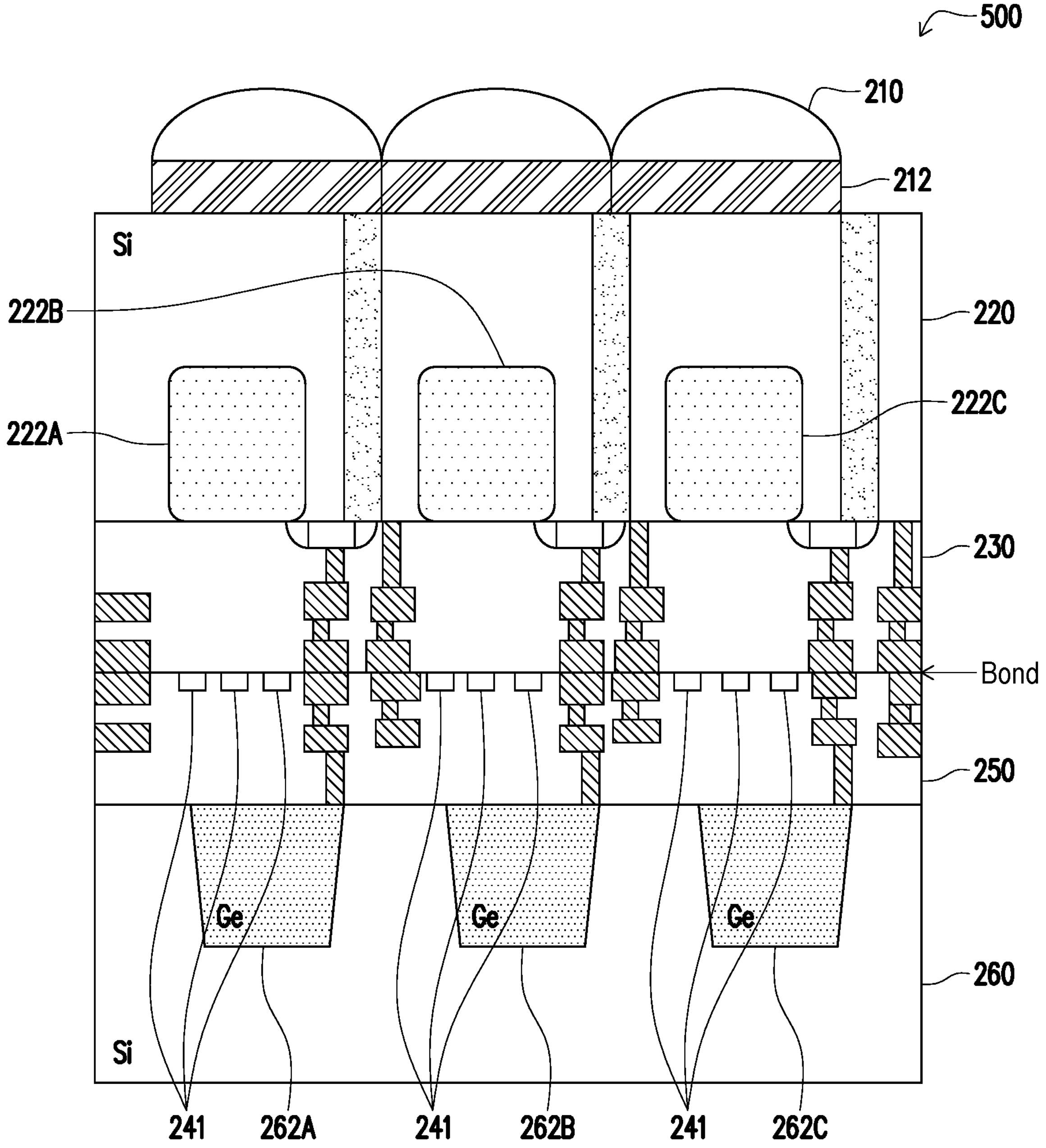
FIG. 19 illustrates a fabrication step of an image sensor device as shown in FIG. 2B (face to face single-CIS to single-SWIR). Specifically.
Figure 20A:
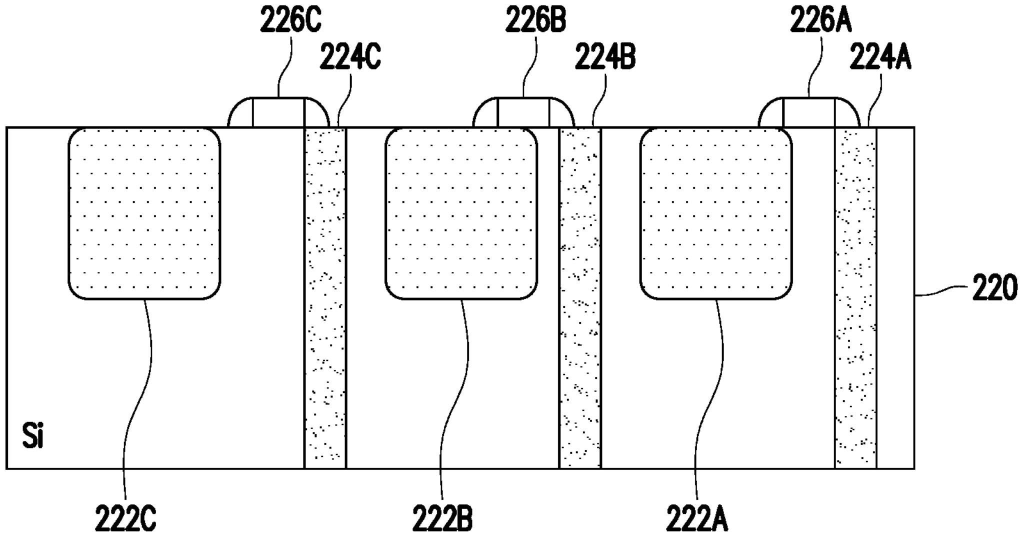
FIGS. 20A-20D illustrate various fabrication steps of an image sensor device as shown in FIG. 3B (face to back multi-CIS to single-SWIR). Specifically.
Figure 20B:
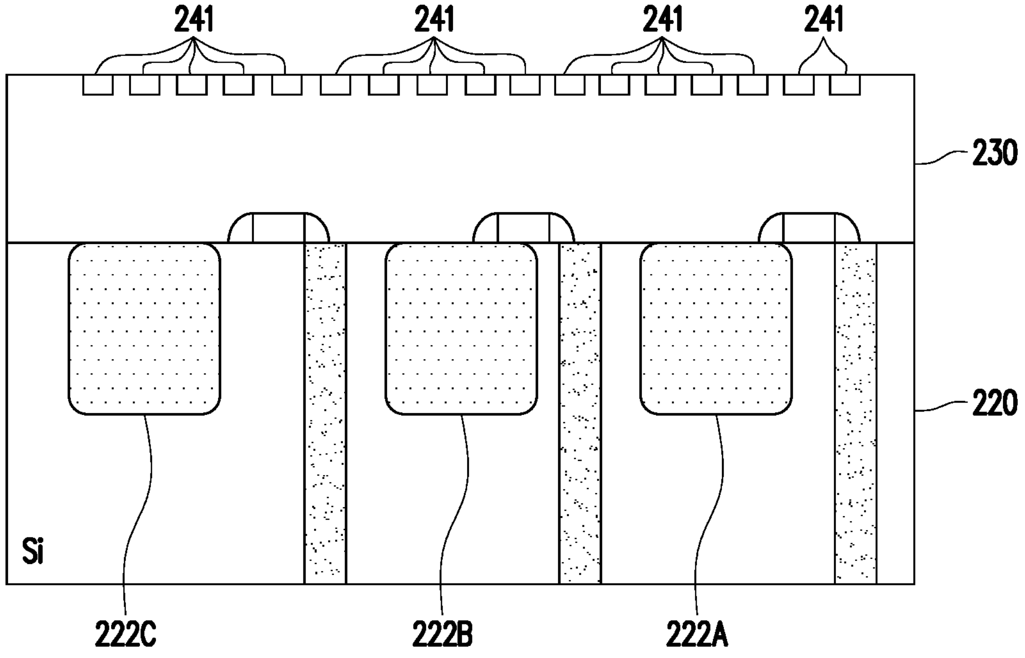
Figure 20C:
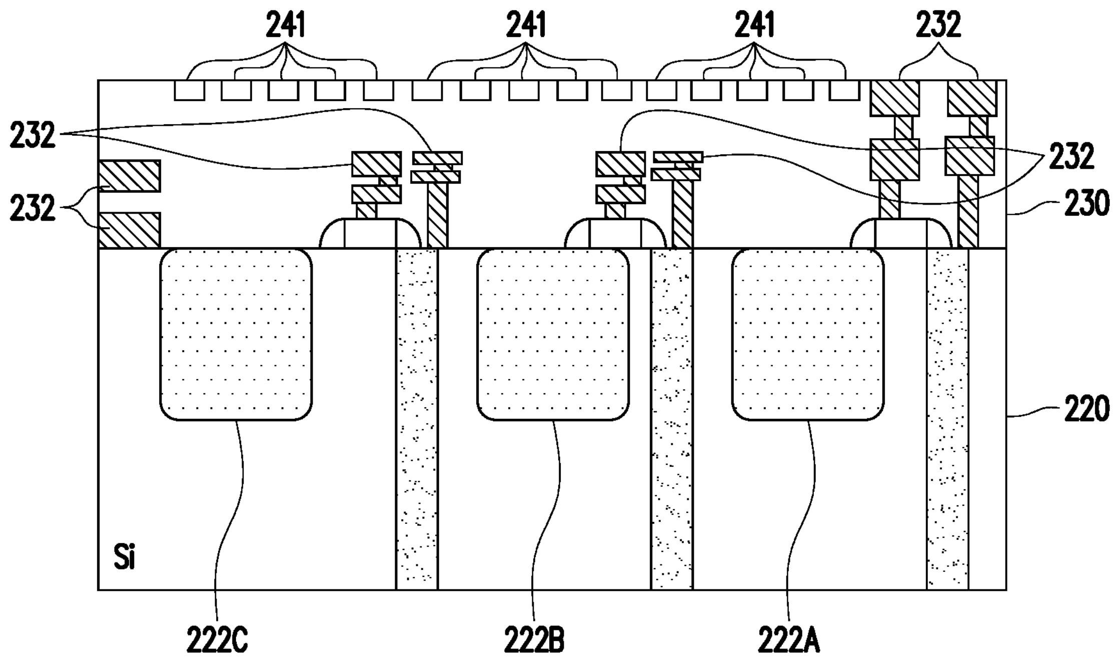
Figure 20D:
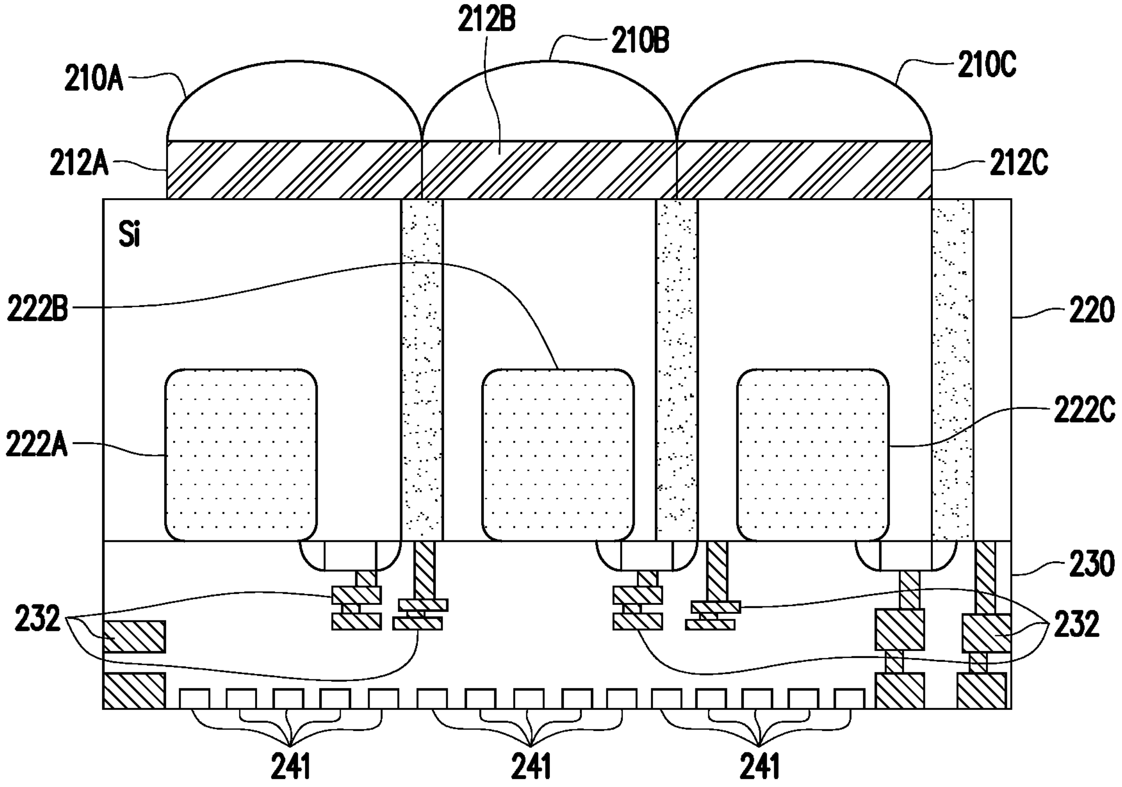

With reference to FIG. 19, illustrated is the fabrication step of the top semiconductor portion bonded with the bottom semiconductor portion, including a metalens structure in an IMD of the bottom semiconductor.

With reference to FIGS. 20A-20D, 21A-21C and 22, there are shown various fabrication steps of an image sensor device as shown in FIG. 3B (face to back multi-CIS to single-SWIR).

With reference to FIGS. 20A-20D, illustrated are various fabrication steps of the top semiconductor portion, including a metalens structure in an IMD of the top semiconductor.

Figure 21A:
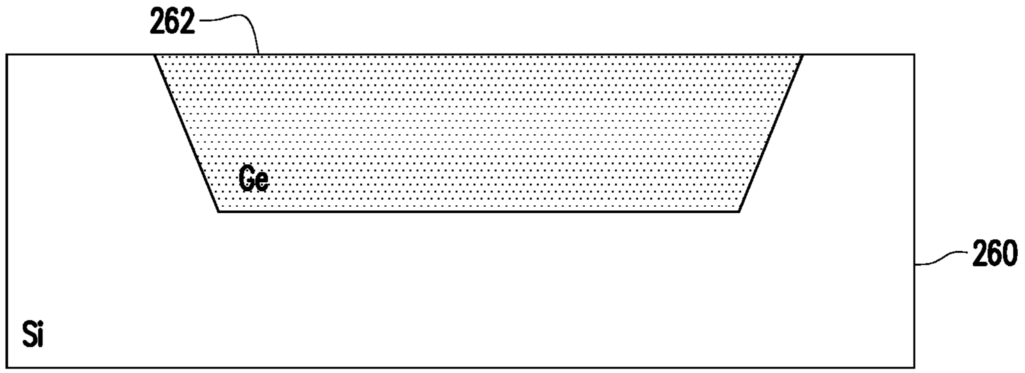
FIGS. 21A-21C illustrate various fabrication steps of an image sensor device as shown in FIG. 3B (face to back multi-CIS to single-SWIR). Specifically.
Figure 21B:
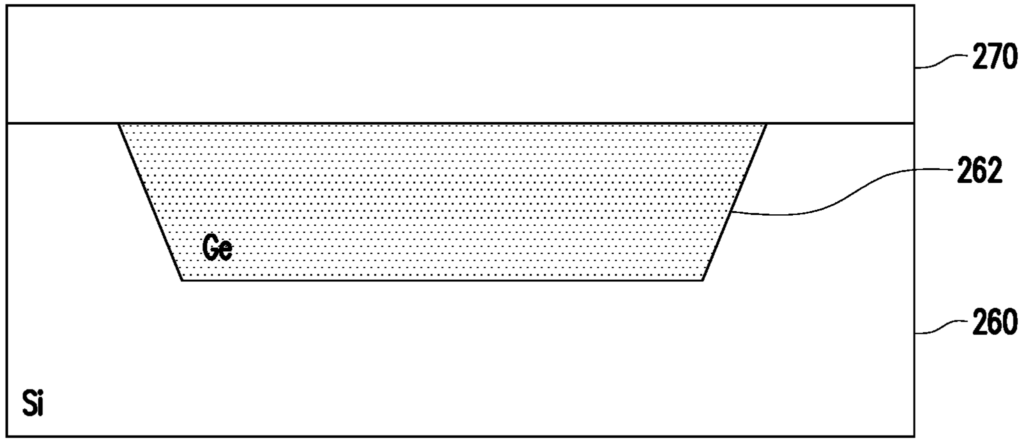
Figure 21C:
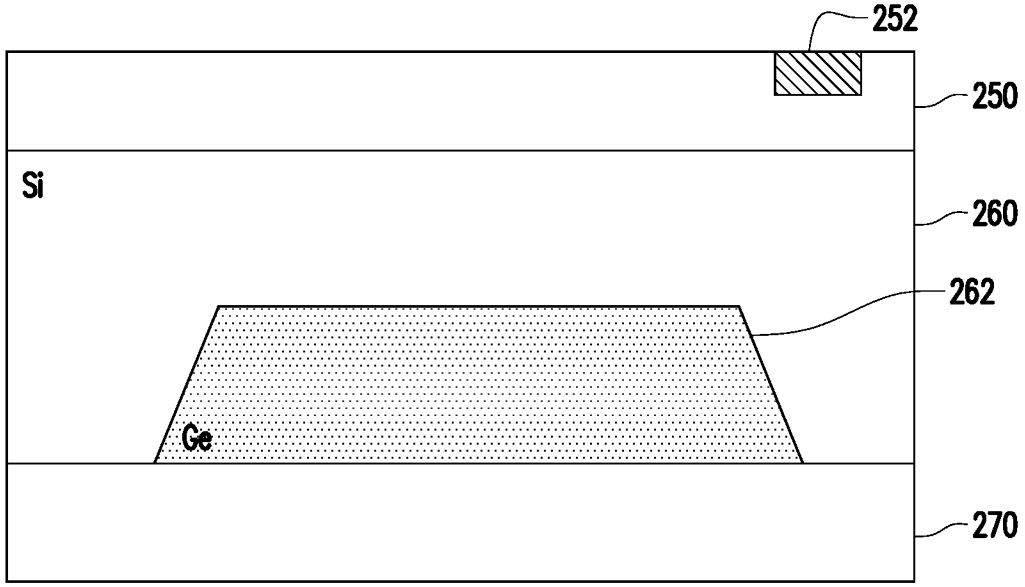

With reference to FIGS. 21A-21C, illustrated are various fabrication steps of the bottom semiconductor portion.

Figure 22:
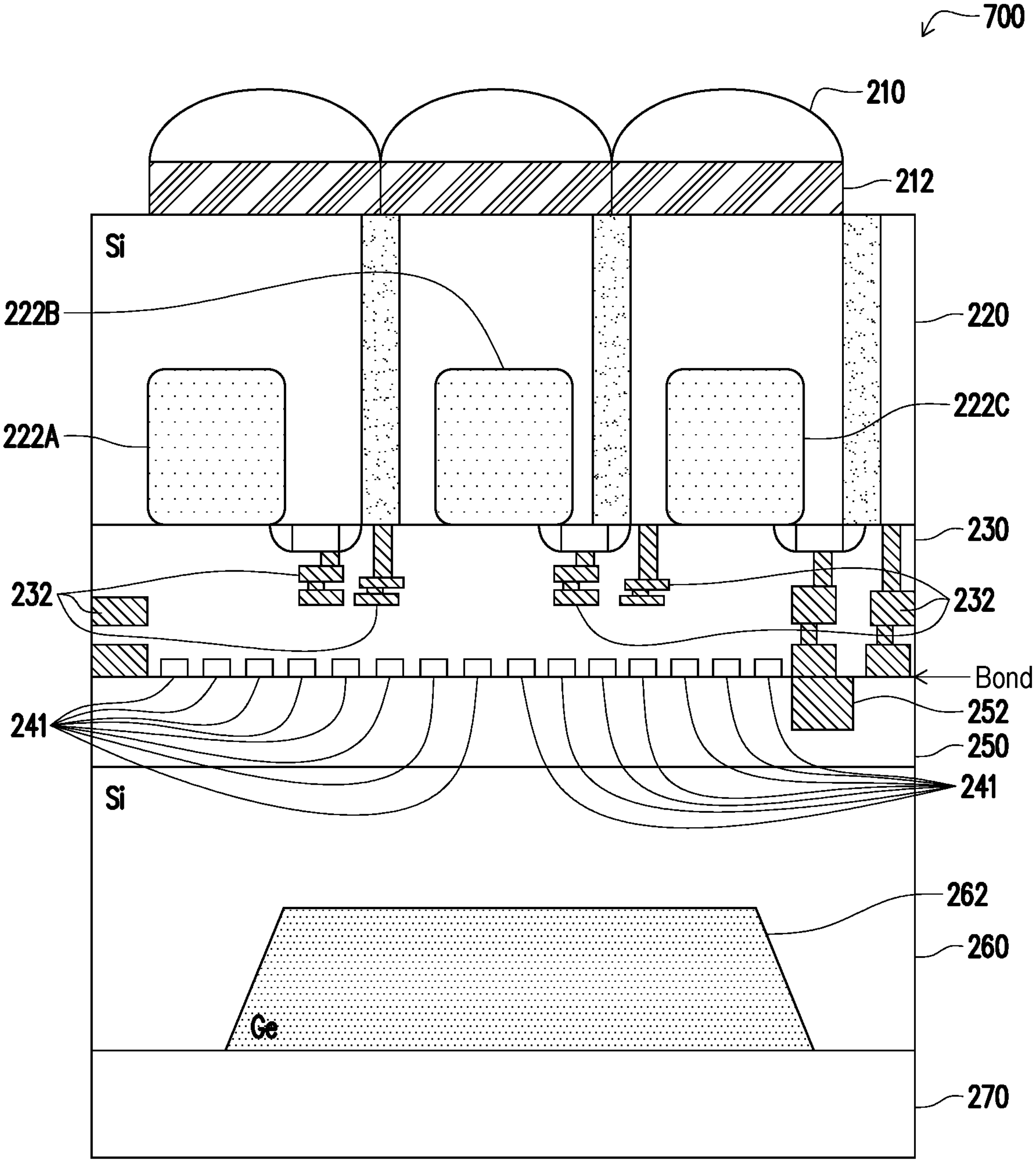
FIG. 22 illustrates a fabrication step of an image sensor device as shown in FIG. 3B (face to back multi-CIS to single-SWIR). Specifically.
Figure 23A:
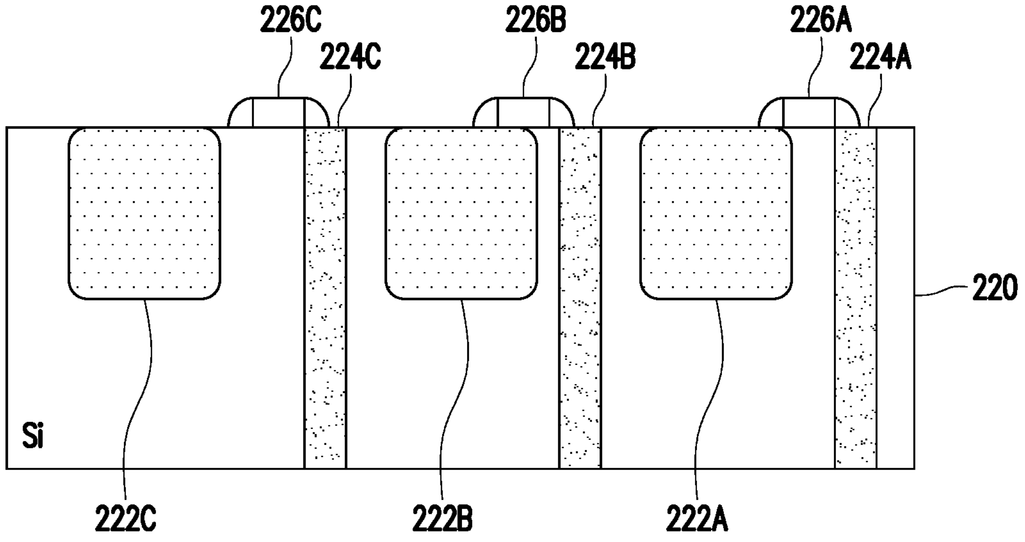
FIGS. 23A-23D illustrate various fabrication steps of an image sensor device as shown in FIG. 3C (face to back multi-CIS to single-SWIR). Specifically.
Figure 23B:
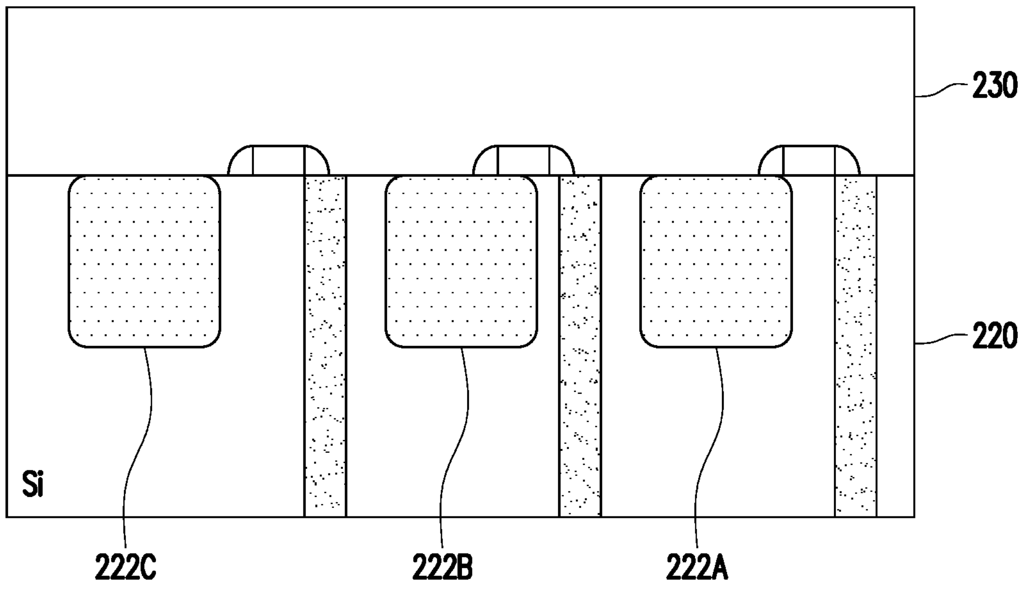
Figure 23C:
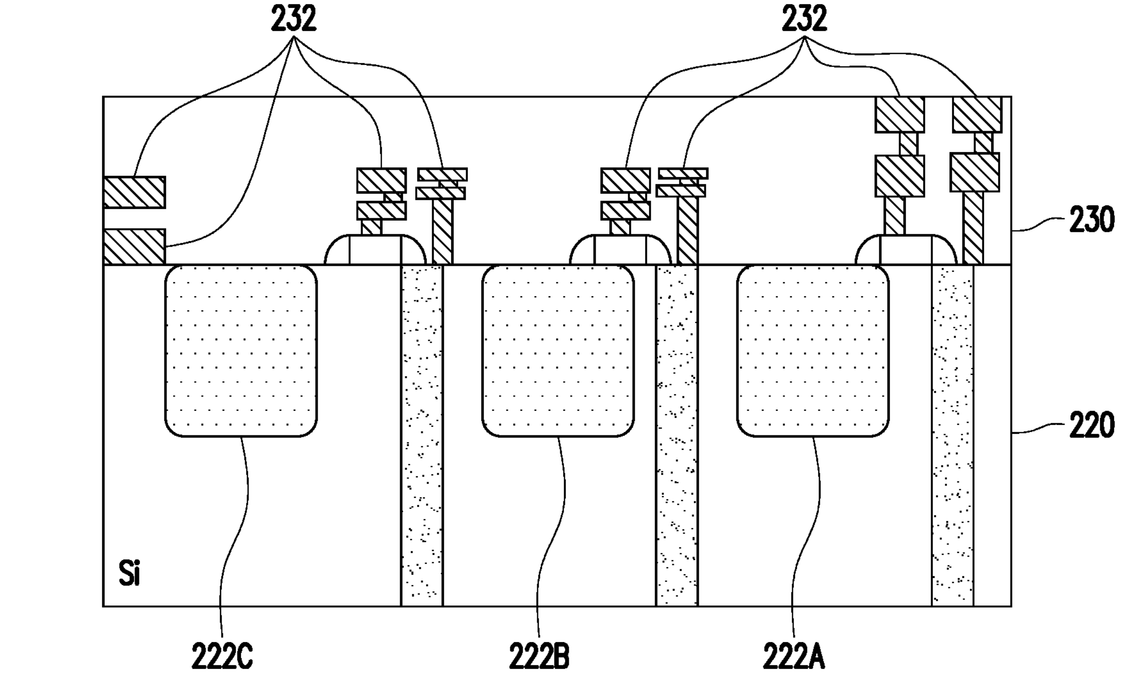
Figure 23D:
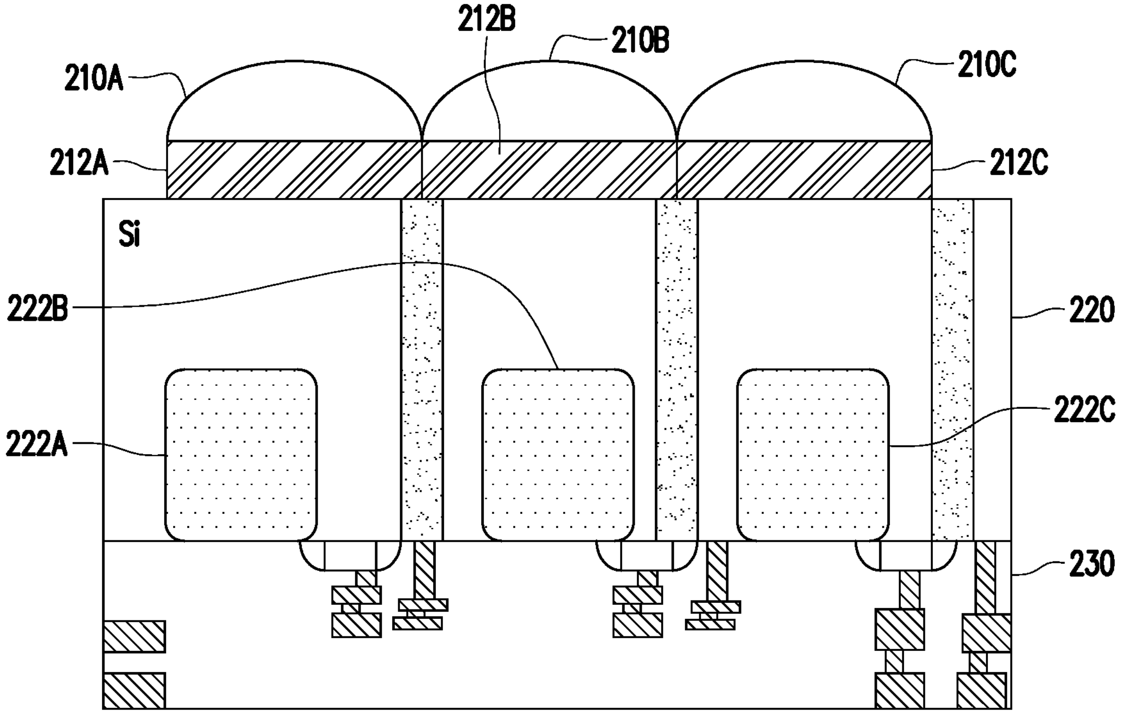

With reference to FIG. 22, illustrated is the fabrication step of the top semiconductor portion, including a metalens structure in an IMD of the top semiconductor, bonded with the bottom semiconductor portion, With reference to FIGS. 23A-23D, 24A-24C and 25, there are shown various fabrication steps of an image sensor device as shown in FIG. 3C (face to back multi-CIS to single-SWIR).

With reference to FIGS. 23A-23D, illustrated are various fabrication steps of the top semiconductor portion.

Figure 24A:
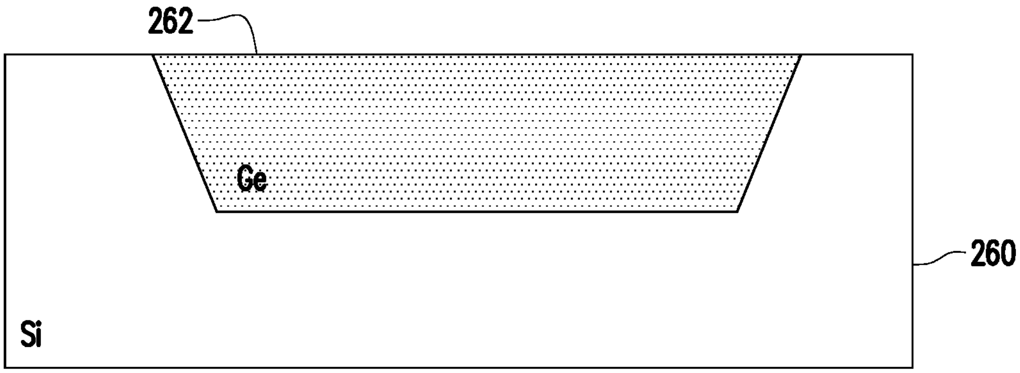
FIGS. 24A-24C illustrate various fabrication steps of an image sensor device as shown in FIG. 3C (face to back multi-CIS to single-SWIR). Specifically.
Figure 24B:
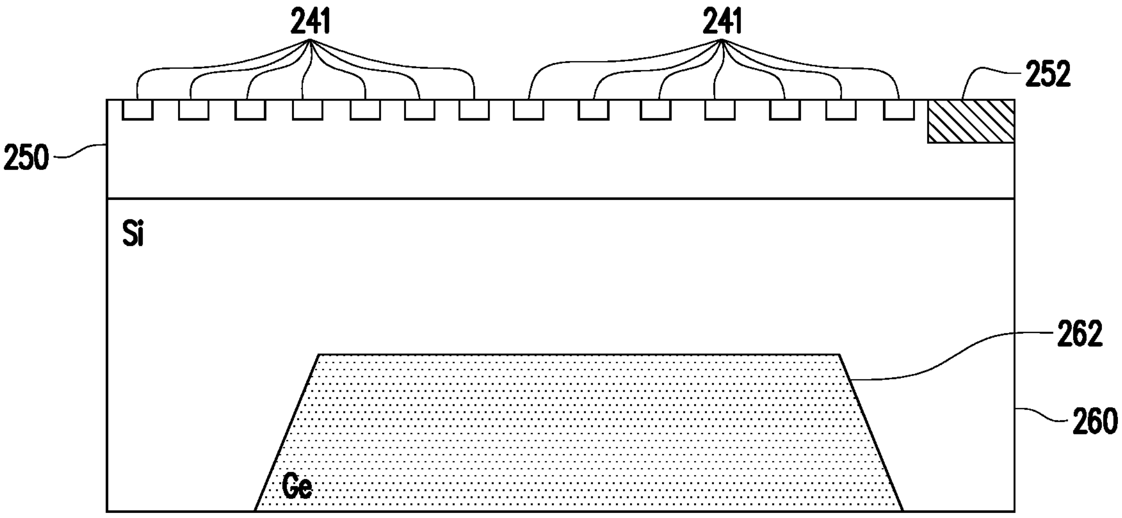
Figure 24C:
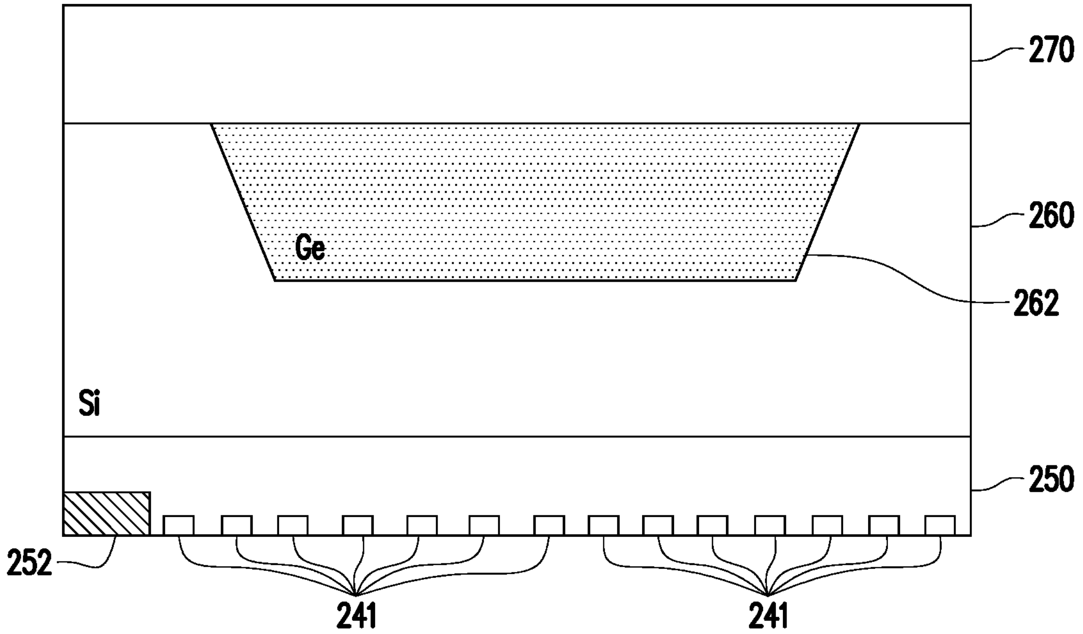

With reference to FIGS. 24A-24C, illustrate are various fabrication steps of the bottom semiconductor portion, including a metalens structure in an IMD of the bottom semiconductor.

Figure 25:
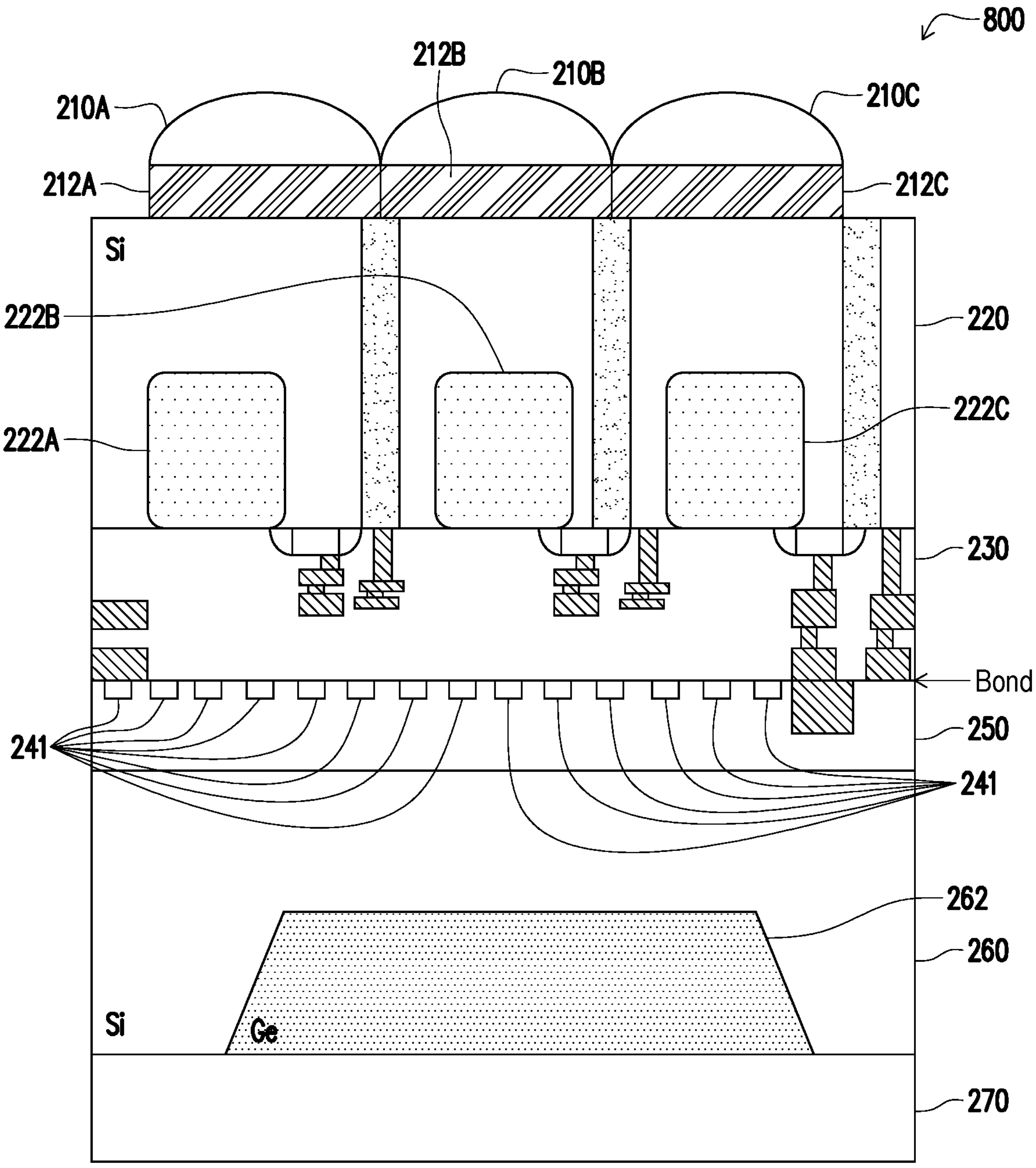
FIG. 25 illustrates a fabrication step of an image sensor device as shown in FIG. 3C (face to back multi-CIS to single-SWIR). Specifically.
Figure 26A:
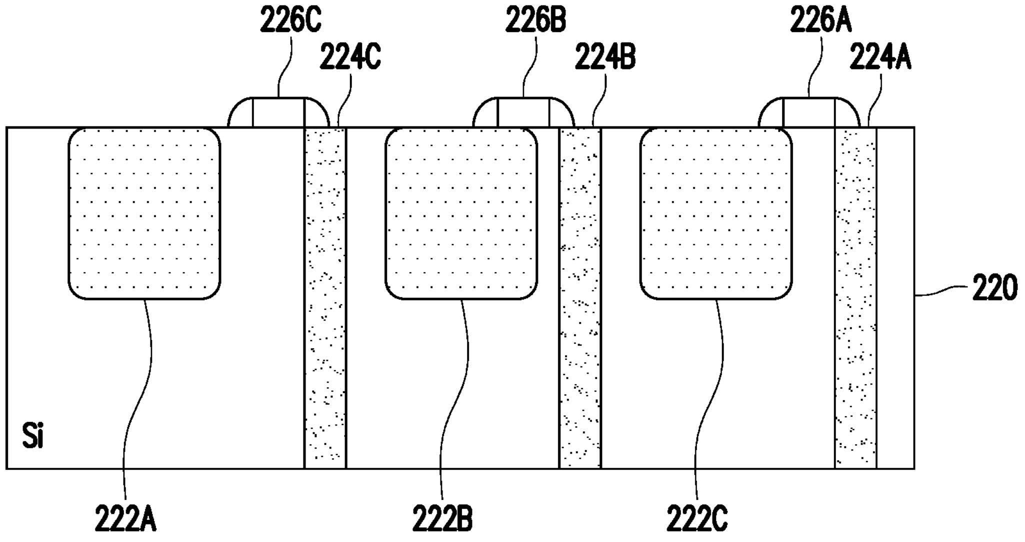
FIGS. 26A-26D illustrate various fabrication steps of an image sensor device as shown in FIG. 3D (face to back multi-CIS to single-SWIR). Specifically.
Figure 26B:
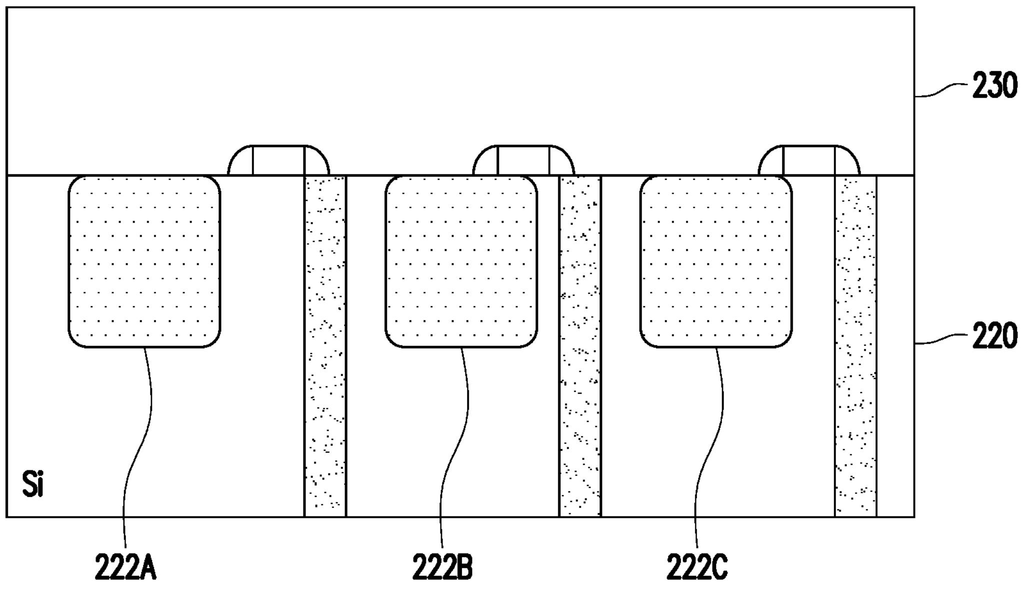
Figure 26C:
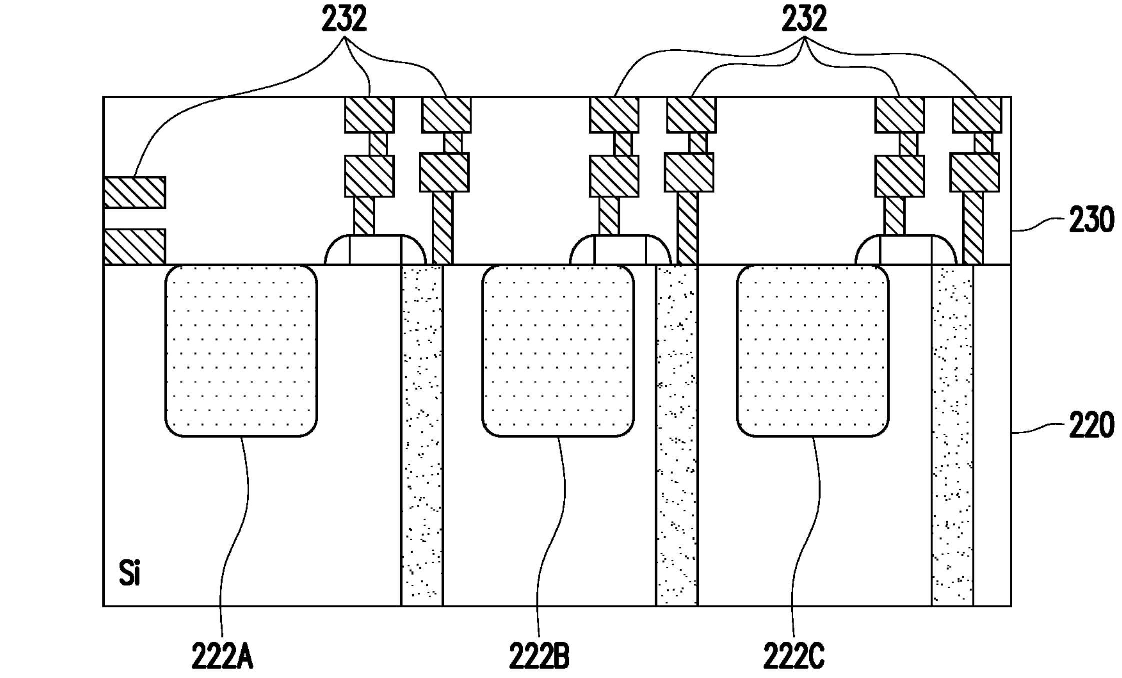
Figure 26D:
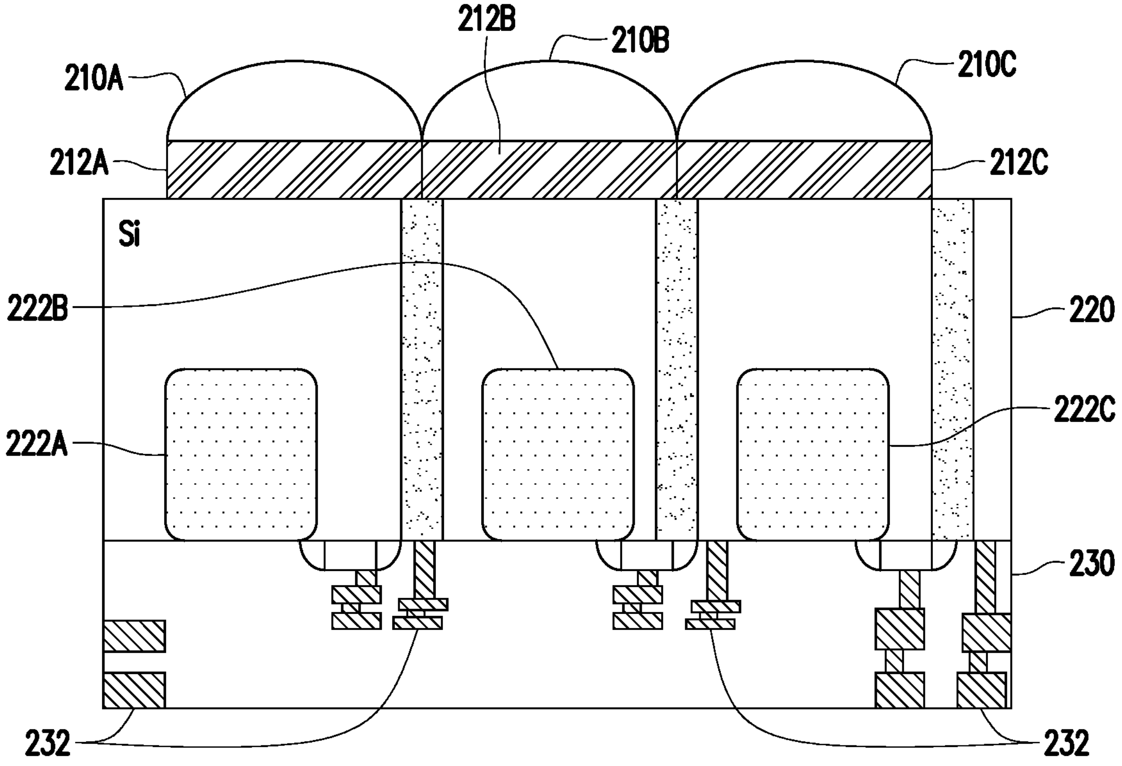
Figure 27A:
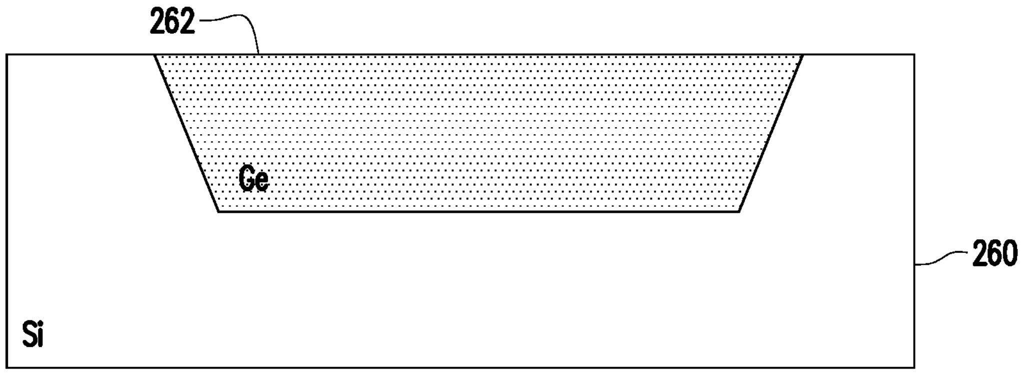
FIGS. 27A-27D illustrate various fabrication steps of an image sensor device as shown in FIG. 3D (face to back multi-CIS to single-SWIR). Specifically.
Figure 27B:
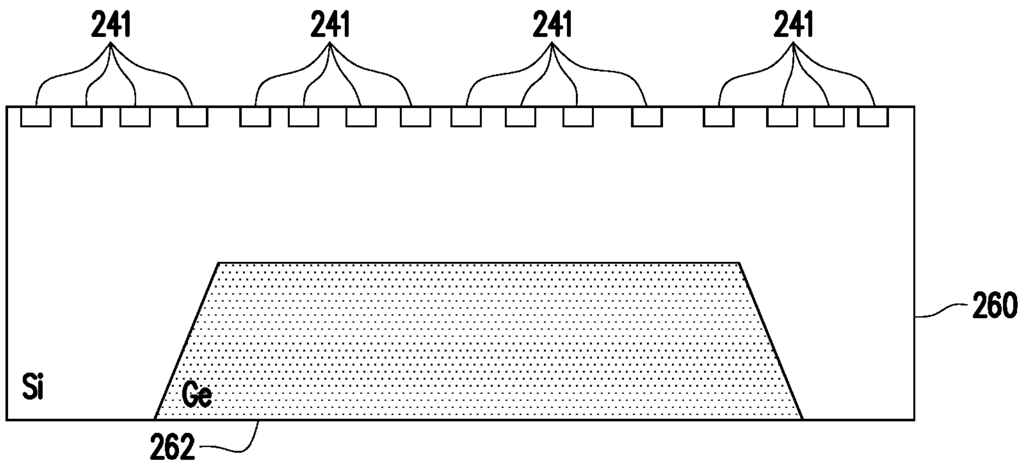
Figure 27C:
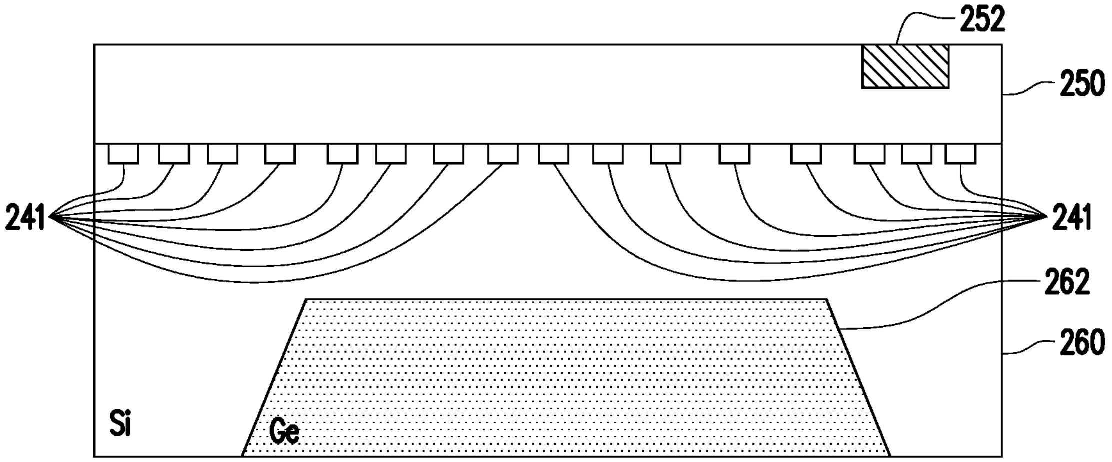
Figure 27D:
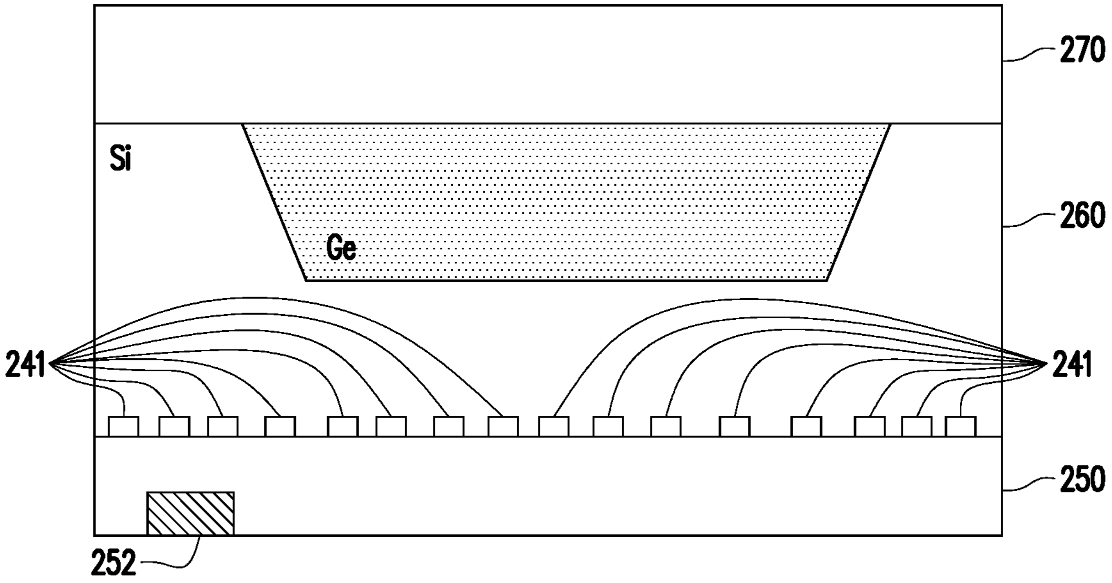

With reference to FIG. 25, illustrated is the fabrication step of the top semiconductor portion bonded with the bottom semiconductor portion, including a metalens structure in an IMD of the bottom semiconductor.

With reference to FIGS. 26A-26D, 27A-27D and 28, there are shown various fabrication steps of an image sensor device as shown in FIG. 3D (face to back multi-CIS to single-SWIR).

With reference to FIGS. 27A-27D, illustrated are various fabrication steps of the bottom semiconductor portion, including a metalens structure in a surface of the bottom semiconductor.

Figure 28:
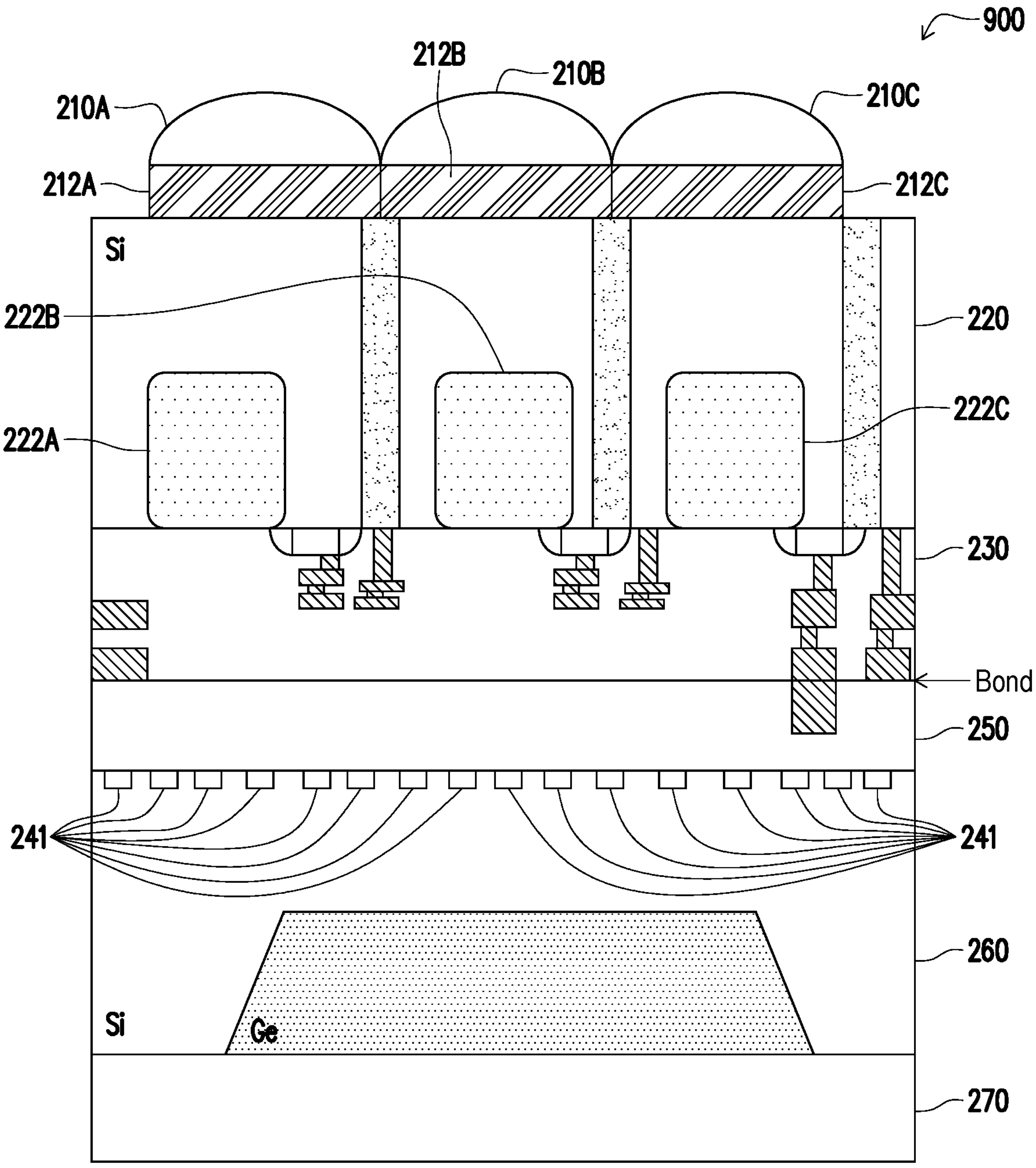
FIG. 28 illustrates a fabrication step of an image sensor device as shown in FIG. 3D (face to back multi-CIS to single-SWIR). Specifically.

With reference to FIG. 28, illustrated is the fabrication step of the top semiconductor portion bonded with the bottom semiconductor portion, including a metalens structure in a surface of the bottom semiconductor.

In accordance with a first embodiment, there is provided an image sensor device comprising: a first substrate including a first side and a second side opposite the first side, the first substrate including at least one visible light photosensor disposed between the first side of the first substrate and the second side of the first substrate, the at least one visible-light photosensor configured to detect visible light; a first dielectric region disposed on the first side of the first substrate and including one or more patterned metallization layers; a second substrate including a first side and a second side opposite the first side, the second substrate including at least one infrared light photosensor disposed between the second side of the second substrate and the first side of the second substrate, the at least one infrared light photosensor configured to detect infrared light; a second dielectric region disposed on the second side of the second substrate and including one or more patterned metallization layers electrically connected with the one or more patterned metallization layers of the first dielectric region; and a metalens disposed between the at least one visible light photosensor and the at least one infrared light photosensor, the metalens configured to focus infrared light impinging on the second side of the first substrate onto the at least one infrared light photosensor.

In accordance with a second embodiment, there is provided a method of forming an image sensor device comprising: providing a first substrate including at least one visible light photosensor configured to detect visible light; forming a first dielectric region on a first side of the first substrate that includes one or more patterned metallization layers, the first dielectric region having a first side distal from the first substate; providing a second substrate including at least one infrared light photosensor configured to detect infrared light; forming a second dielectric region disposed on a first side of the second substrate that includes one or more patterned metallization layers, the second dielectric region having a first side distal from the second semiconductor; forming a metalens in the first side of the first substrate, the first side of the second substrate, the first side of the first dielectric region, or the first side of the second dielectric region; and bonding together the first sides of the respective first and second dielectric regions, the bonding including electrically connecting the one or more patterned metallization layers of the first dielectric region and the one or more patterned metallization layers of the second dielectric region.

In accordance with a third embodiment, there is provided an RGB (Red Green Blue) CIS (CMOS Image Sensor) device comprising: a first substrate including a back surface and a front surface opposite the back surface, the first substrate including: a red photosensitive region, a green photosensitive region, and a blue photosensitive region, the red, green, and blue photosensitive regions disposed between the front surface and the back surface, and the photosensitive regions separated by deep isolation trenches; and a dielectric region extending from the photosensitive regions to the front surface; and a second substrate including a back surface and a front surface opposite the back surface, the second substrate including a radiation sensing detector region disposed between the back surface and the front surface, and a dielectric region extending from the radiation sensing detector region to the back surface, wherein one of the first substrate dielectric region and the second substrate dielectric region includes a metalens grid structure optically aligned with each of the red, green, and blue image detection regions to focus incident radiation to the second substrate radiation sensing detector, the incident radiation passing thru the first substrate to the second substrate radiation sensing detector, and the first substrate and second substrate are stacked and bonded to: a) connect the first substrate dielectric region and the second substrate dielectric region and b) optically align the photosensitive and the radiation sensing detector region.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An image sensor device comprising:

a first substrate including a first side and a second side opposite the first side, the first substrate including visible light photosensors disposed between the first side of the first substrate and the second side of the first substrate, the visible-light photosensors configured to detect visible light;

a first dielectric region disposed on the first side of the first substrate and including one or more patterned metallization layers;

a second substrate including a first side and a second side opposite the first side, the second substrate including infrared light photosensors disposed between the second side of the second substrate and the first side of the second substrate, the infrared light photosensors configured to detect infrared light and including at least a first infrared light photosensor and a second infrared light photosensor;

a second dielectric region disposed on the second side of the second substrate and including one or more patterned metallization layers electrically connected with the one or more patterned metallization layers of the first dielectric region; and a metalens disposed between the visible light photosensors and the infrared light photosensors, the metalens configured to focus infrared light of a first wavelength impinging on the second side of the first substrate onto the first infrared light photosensor and to focus infrared light of a second wavelength impinging on the second side of the first substrate onto the second infrared light photosensor.

2. The image sensor device of claim 1, further comprising:

at least one microlens disposed on the second side of the first substrate and configured to focus visible light onto the at least one visible light photosensor.

3. The image sensor device of claim 1, wherein the visible light photosensors form a complementary metal-oxide-semiconductor (CMOS) image sensor and the image sensor device further comprises: red, green, and blue color filters disposed on the second side of the first substrate whereby the at least one visible light photosensor includes a red light photosensor, a green light photosensor, and a blue light photosensor.

4. The image sensor device of claim 1, wherein the metalens comprises a grid structure formed in the second side of the second substrate.

5. The image sensor device of claim 1, wherein;

the infrared light photosensors further include a third infrared light photosensor and a fourth infrared light photosensor; and the metalens is further configured to focus infrared light of a third wavelength impinging on the second side of the first substrate onto the third infrared light photosensor and to focus infrared light of a fourth wavelength impinging on the second side of the first substrate onto the fourth infrared light photosensor.

6. The image sensor device of claim 1, wherein the metalens comprises a grid structure formed in a surface of the first dielectric region distal from the first substrate.

7. The image sensor device of claim 1, wherein the metalens comprises a grid structure formed in a surface of the second dielectric region distal from the second substrate.

8. The image sensor device of claim 1, wherein the metalens comprises a grid structure that includes a periodic distribution of optical meta elements, each optical meta element having a height and width, and each of the optical meta elements separated by a spacing width distance.

9. The image sensor device of claim 8, wherein each optical meta element height is greater than 0.5 μm, and a total light path distance from the visible light photosensor to the infrared light photosensor is 3-20 μm.

10. The image sensor device of claim 1, wherein the metalens grid structure includes a periodic distribution of optical meta elements, and an optical meta element width and spacing provides a focal length substantially equal to a distance from the metalens grid structure to the infrared light photosensor.

11. The image sensor device of claim 1, wherein the infrared light photosensor is configured to detect infrared light in a wavelength range of 800 nm to 1800 nm in a wavelength filtering device or a multiple wavelength splitting device.

12. The image sensor device of claim 1, wherein the first substrate comprises silicon and the visible light photosensors form a complementary metal-oxide-semiconductor (CMOS) photosensor, and the infrared light photosensors comprises germanium or a germanium-silicon alloy.

13. A method of forming an image sensor device comprising:

providing a first substrate including at least one visible light photosensor configured to detect visible light;

forming a first dielectric region on a first side of the first substrate that includes one or more patterned metallization layers, the first dielectric region having a first side distal from the first substate;

providing a second substrate including at least one infrared light photosensor configured to detect infrared light;

forming a second dielectric region disposed on a first side of the second substrate that includes one or more patterned metallization layers, the second dielectric region having a first side distal from the second semiconductor;

forming a metalens in the second side of the second substrate, the first side of the first dielectric region, or the first side of the second dielectric region, the forming of the metalens including etching a grid structure and coating a surface of the grid structure with a $TiO_2$, $Ta_2O_5$, or $ZrO_2$ coating; and bonding together the first sides of the respective first and second dielectric regions, the bonding including electrically connecting the one or more patterned metallization layers of the first dielectric region and the one or more patterned metallization layers of the second dielectric region.

14. The method of claim 13, wherein:

the at least one infrared light photosensor configured to detect infrared light includes a first infrared light photosensor and a second infrared light photosensor; and the metalens is configured to focus infrared light of a first wavelength impinging on the second side of the first substrate onto the first infrared light photosensor and to focus infrared light of a second wavelength impinging on the second side of the first substrate onto the second infrared light photosensor.

15. The method of claim 13, wherein:

the metalens is formed in the second side of the second substrate.

16. The method of claim 13, wherein:

the metalens is formed in the first side of the first dielectric region.

17. The method of claim 13, wherein:

the metalens is formed in the first side of the second dielectric region.

18. The method of claim 13, wherein the metalens is configured to direct an unwanted wavelength of infrared light away from the at least one infrared light photosensor.

19. The method of claim 18, wherein the grid structure of the metalens is formed to include a periodic distribution of optical meta elements, and formed to include an optical meta element width and spacing to provide a focal length substantially equal to a distance from the metalens grid structure to the infrared light photosensor.

20. An RGB (Red Green Blue) CIS (CMOS Image Sensor) device comprising:

a first substrate including a back surface and a front surface opposite the back surface, the first substrate including:

a red photosensitive region, a green photosensitive region, and a blue photosensitive region, the red, green, and blue photosensitive regions disposed between the front surface and the back surface, and the photosensitive regions separated by deep isolation trenches; and a dielectric region extending from the photosensitive regions to the front surface; and a second substrate including a back surface and a front surface opposite the back surface, the second substrate including a radiation sensing detector region disposed between the back surface and the front surface, and a dielectric region extending from the radiation sensing detector region to the back surface, wherein one of the first substrate dielectric region and the second substrate dielectric region includes a metalens grid structure optically aligned with each of the red, green, and blue image detection regions to focus incident radiation of a target wavelength to the second substrate radiation sensing detector and to direct light of an unwanted wavelength away from the second substrate radiation sensing detector, the incident radiation passing thru the first substrate to the second substrate radiation sensing detector, and the first substrate and second substrate are stacked and bonded to: a) connect the first substrate dielectric region and the second substrate dielectric region and b) optically align the photosensitive and the radiation sensing detector region.

* * * * *